US011233060B2

(12) United States Patent
Lee et al.

(10) Patent No.: US 11,233,060 B2
(45) Date of Patent: Jan. 25, 2022

(54) VERTICAL MEMORY DEVICE

(71) Applicant: SK hynix Inc., Gyeonggi-do (KR)

(72) Inventors: Kun-Young Lee, Seoul (KR);
Sun-Young Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/720,760

(22) Filed: Dec. 19, 2019

(65) Prior Publication Data

US 2021/0013210 A1 Jan. 14, 2021

(30) Foreign Application Priority Data

Jul. 12, 2019 (KR) .......................... 10-2019-0084686

(51) Int. Cl.
*H01L 27/108* (2006.01)

(52) U.S. Cl.
CPC .. *H01L 27/10832* (2013.01); *H01L 27/10864* (2013.01); *H01L 27/10894* (2013.01); *H01L 27/10897* (2013.01)

(58) Field of Classification Search
CPC ......... H01L 27/10832; H01L 27/10864; H01L 27/10894; H01L 27/10897
See application file for complete search history.

(56) References Cited

U.S. PATENT DOCUMENTS 6,573,137 B1\* 6/2003 Divakaruni ....... H01L 27/10864
257/E21.652
2018/0323200 A1\* 11/2018 Tang ...................... H01L 28/86

\* cited by examiner

*Primary Examiner* — Edward Chin
(74) *Attorney, Agent, or Firm* — IP & T Group LLP

(57) ABSTRACT

Disclosed is a vertically stacked 3D memory device, and the memory device may include a bit line extended vertically from a substrate, and including a first vertical portion and a second vertical portion, a vertical active layer configured to surround the first and second vertical portions of the bit line, a word line configured to surround the vertical active layer and the first vertical portion of the bit line, and a capacitor spaced apart vertically from the word line, and configured to surround the vertical active layer and the second vertical portion of the bit line.

24 Claims, 45 Drawing Sheets

VERTICAL MEMORY DEVICE

CROSS-REFERENCE TO RELATED APPLICATIONS

The present application claims priority to Korean Patent Application No. 10-2019-0084686, filed on Jul. 12, 2019, which is incorporated herein by reference in its entirety.

BACKGROUND

1. Field

Various embodiments of the present invention, relate to a semiconductor device, and more particularly, to a vertical memory device.

2. Description of the Related Art

Recently, the size of a memory cell is continuously reduced in order to increase net die of a memory device.

As the size of the memory cell becomes smaller, parasitic capacitance (Cb) should be reduced and capacitance should be increased. However, due to various structural limitations of the memory cell, it has become increasingly difficult to increase the net die using conventional solutions.

SUMMARY

Various embodiments of the present invention are directed to a high-integrated vertical memory cell and a vertical memory device including the same. The memory cell allows increasing the net die of the vertical memory device.

In accordance with an embodiment, a memory device may include: a bit line extended vertically from a substrate, and including first and second vertical portions; a vertical active layer configured to surround the first and second vertical portions of the bit line; a word line configured to surround the vertical active layer and the first vertical portion of the bit line; a capacitor spaced apart vertically from the word line, and configured to surround the vertical active layer and the second vertical portion of the bit line; and a plate line extended vertically from the substrate, and coupled to the capacitor.

In accordance with another embodiment, a memory device may include: a substrate; a bit line extended vertically from the substrate, and including a plurality of first vertical portions and a plurality of second vertical portions; a plate line oriented vertically from the substrate; and a plurality of memory cells stacked vertically from the surface of the substrate between the bit line and the plate line, wherein each of the memory cells includes: a vertical active layer configured to surround the first and second vertical portions of the bit line; a word line configured to surround the vertical active layer and the first vertical portions of the bit line; and a capacitor spaced apart vertically from the word line, and configured to surround the vertical active layer and the second vertical portions of the bit line.

In accordance with yet another embodiment, a method for fabricating a memory device may include: forming a bit line extending vertically from a substrate; forming a capacitor surrounding the bit line; forming a transistor including a vertical active layer extending vertically from first side of the capacitor and a word line surrounding the vertical active layer; and forming a plate line coupled to the second side of the capacitor, and extending vertically from the substrate.

These and other features and advantages of the present invention will become apparent to those skilled in the art of the invention from the following detailed description in conjunction with the following drawings.

DETAILED DESCRIPTION

Various examples and embodiments of the present invention are described herein with reference to cross-sectional views, plan views and block diagrams, which are ideal schematic views of the present invention. Thus, the shape of the illustrations may be modified by fabricating techniques and/or tolerances. Accordingly, the embodiments of the present invention are not limited to the specific forms shown, but also include changes in the shapes that are generated according to the fabricating process. The regions illustrated in the figures have schematic attributes, and the shapes of the regions illustrated in the figures are intended to illustrate specific types of regions for the elements and are not intended to limit the scope of the invention.

Also, it should be understood that the drawings are simplified schematic illustrations of the described devices and may not include well known details to avoid obscuring the features of the invention.

It should also be noted that features present in one embodiment may be used with one or more features of another embodiment without departing from the scope of the invention.

Embodiments described below suggest a three-dimensional DRAM memory cell formed using an alternating stack of nitride, silicon and oxide.

Uniformity may be secured by recessing the oxide of the alternating stack, and isolation between components may be performed through an oxidation process. In addition, it is possible to improve the degree of integration by reducing the height of the alternating stack.

A memory device according to embodiments may include a single word line (WL), a vertical bit line (BL) and a vertical plate line (PL). In addition, a memory cell may include a horizontal capacitor.

Figure 1A:
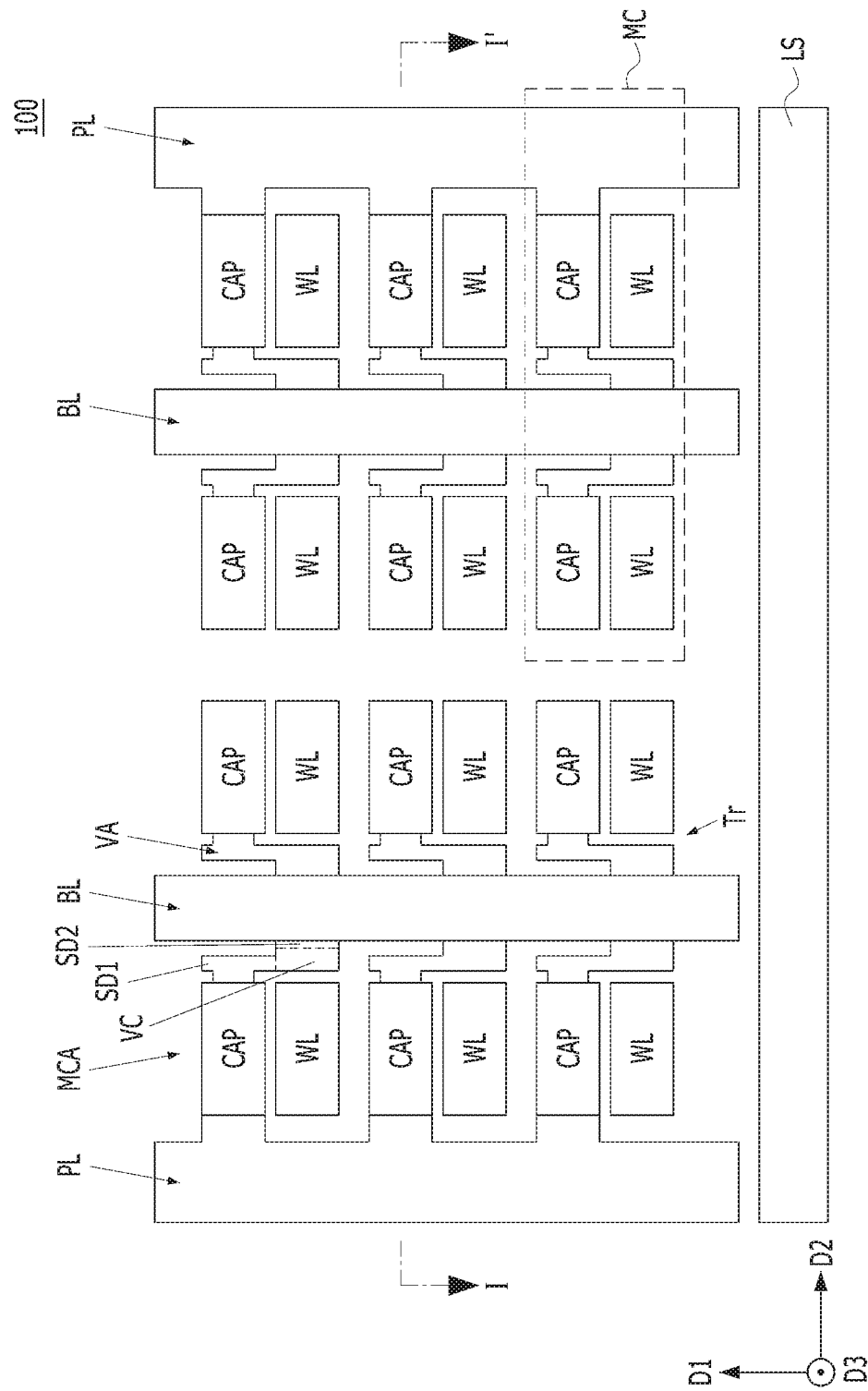
FIG. 1A is cross-sectional view illustrating a schematic configuration of a memory device in accordance with an embodiment of the present invention.
Figure 1B:
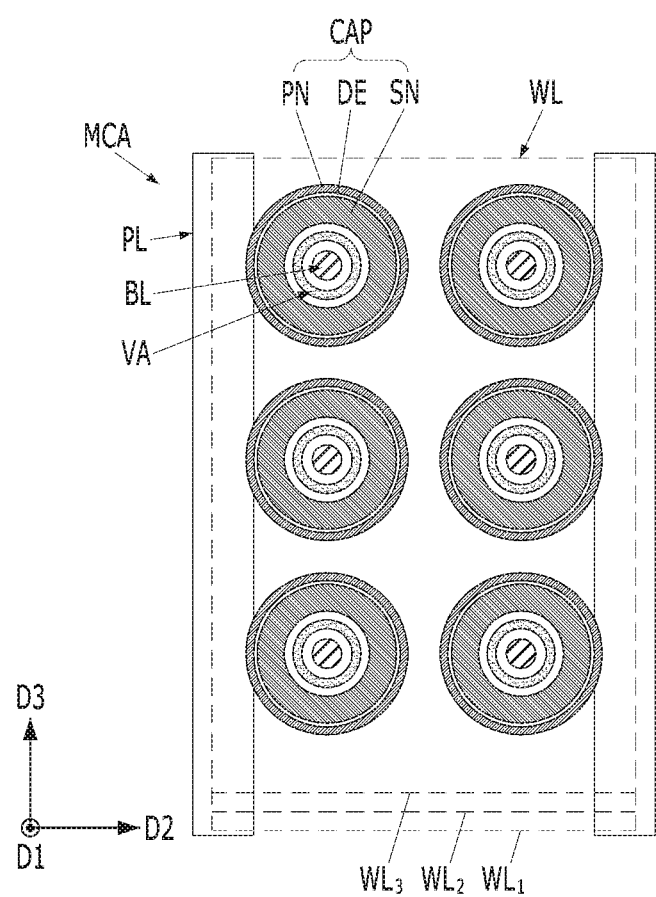
FIG. 1B is a plan view illustrating the memory device taken along an I-I' line illustrated in FIG. 1A.
Figure 1C:
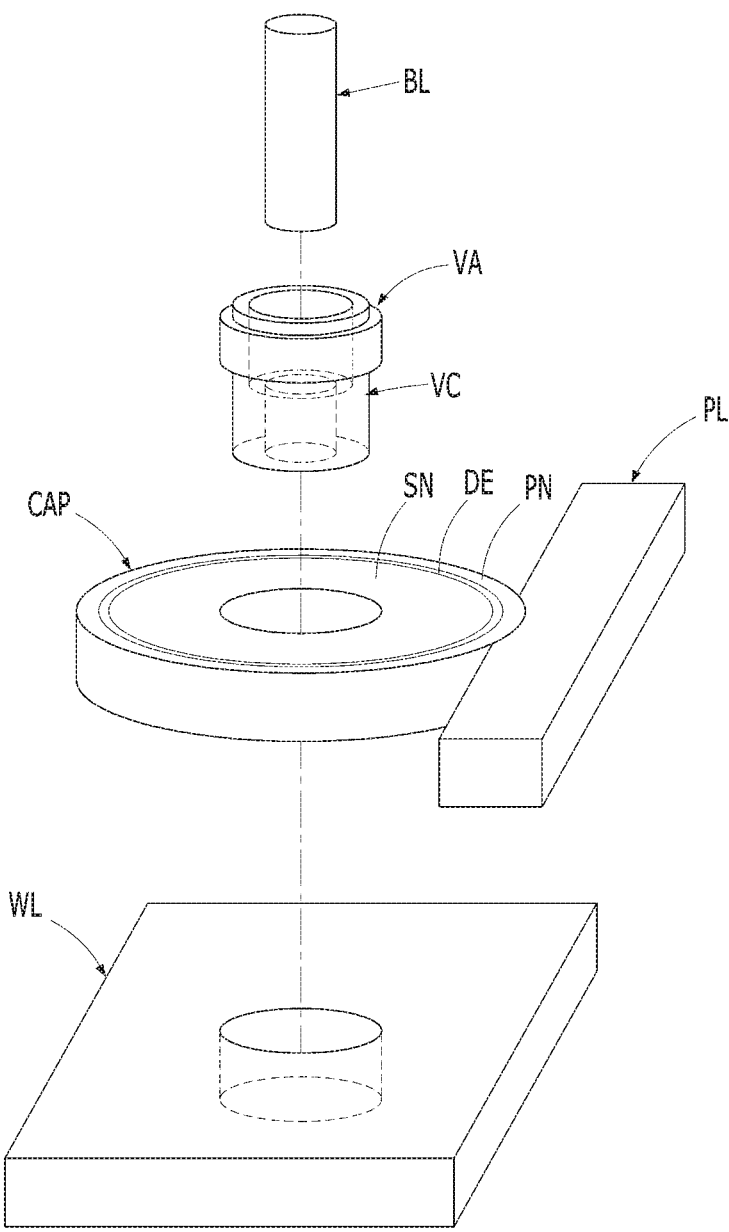
FIG. 1C is an exploded perspective view of memory cell MC illustrated in FIG. 1A.

FIG. 1A is a cross-sectional view illustrating a schematic configuration of a memory device 100 in accordance with an embodiment of the present invention. FIG. 1B is a plan view illustrating the memory device 100 taken along an I-I' line illustrated in FIG. 1A. FIG. 1C is an exploded perspective view of memory cell MC illustrated in FIG. 1A.

Referring to FIGS. 1A to 1C, the memory device 100 may include a memory cell array MCA. The memory cell array MCA may include a plurality of capacitors CAP, a plurality of bit lines BL, a plurality of transistors Tr, and a plurality of plate lines PL. The bit lines BL may have pillar shapes extending vertically along a first direction D1. The capacitors CAP may have annular shapes of surrounding the bit lines BL. The capacitors CAP may be arranged horizontally along a second direction D2 and a third direction D3. The capacitors CAP may also be arranged vertically along the first direction D1. The plate lines PL may extend along the third direction D3 while being coupled to the capacitors CAP.

Each of the capacitors CAP may include a storage node SN, a dielectric layer DE and a plate node PN. The storage node SN, the dielectric layer DE and the plate node PN may have annular shapes of surrounding the bit lines BL.

Each of the transistors Tr may include a word line WL and a vertical active layer VA. The vertical active layers VA may have annular shapes surrounding the bit lines BL. Each of vertical active layers VA may include a first source/drain layer SD1, a vertical channel layer VC and a second source/drain layer SD2. The first source/drain layer SD1, the vertical channel layer VC and the second source/drain layer SD2 may have annular shapes of surrounding the bit lines BL. The first source/drain layers SD1 may be coupled to the capacitors CAP, and the second source/drain layer SD2 may be coupled to the bit lines BL. The vertical channel layer VC may be located between the first source/drain layer SD1 and the second source/drain layer SD2. The word lines WL may be located horizontally on first side of the vertical channel layer VC. The transistor Tr may be a vertical channel transistor.

The word lines WL may have planar plate shapes. The word lines WL may vertically overlap the capacitors CAP along the first direction D1. The word lines WL may have shapes which surround the bit lines BL. In other words, the bit lines BL may penetrate the word lines WL. A plurality of word lines $WL_1$, $WL_2$, $WL_3$ and $WL_4$ may be arranged vertically along the first direction D1. The plurality of word lines $WL_1$, $WL_2$, $WL_3$ and $WL_4$ and the capacitors CAP may be arranged in an alternating manner along the first direction D1 without being on direct contact with each other.

As described above, the transistors Tr and the capacitors CAP may have annular shapes surrounding the bit lines BL.

Figure 2A:
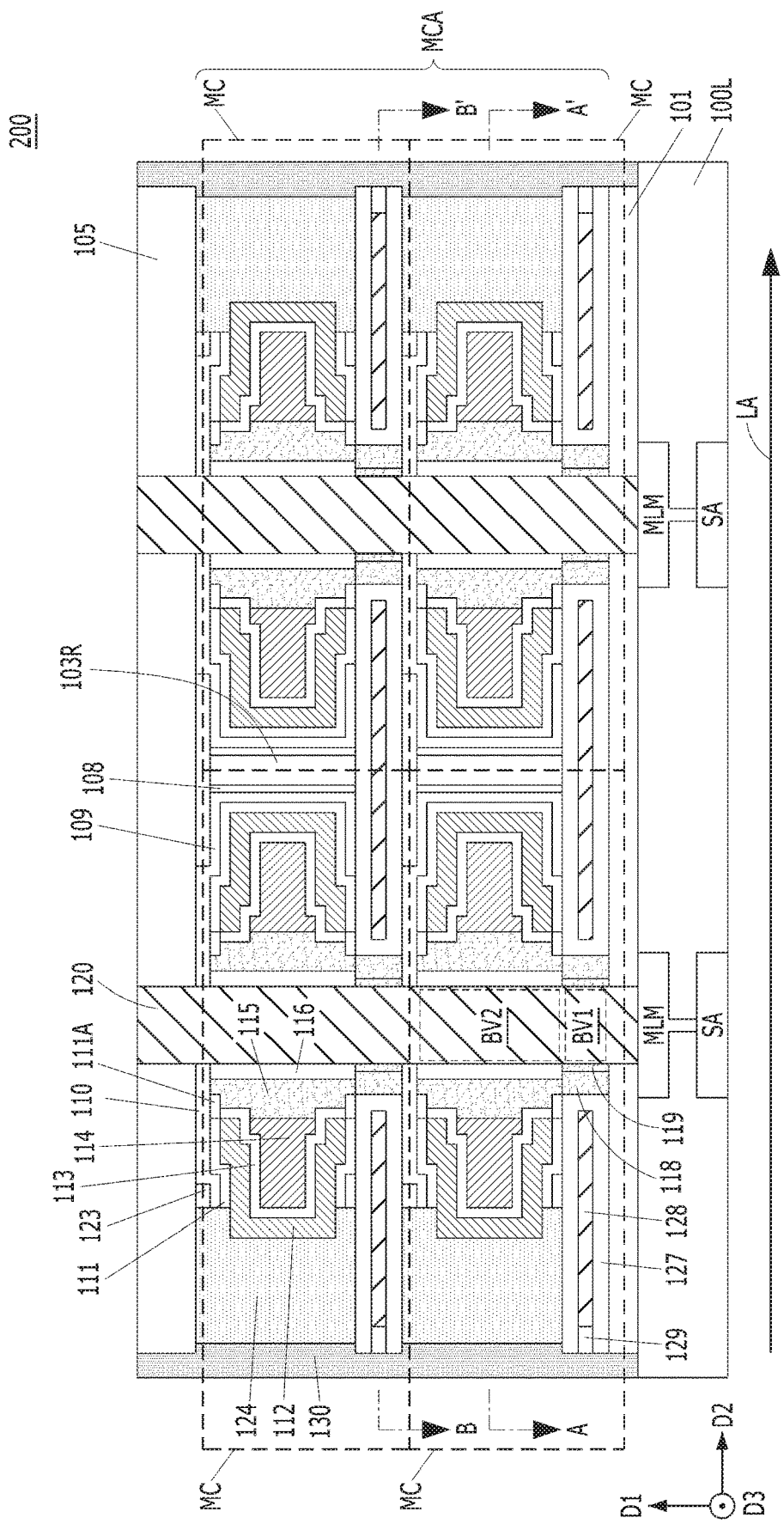
FIG. 2A is a cross-sectional view illustrating an example of a memory device.
Figure 2B:
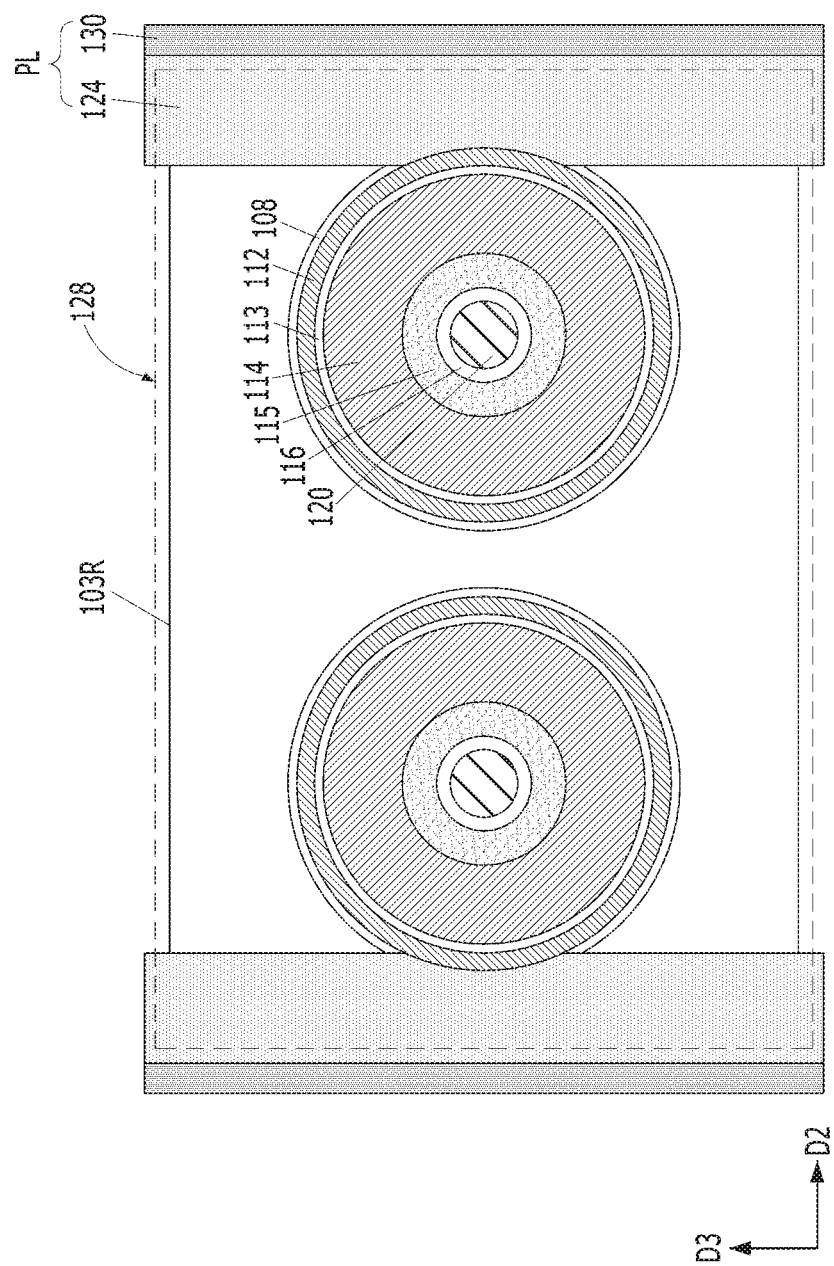
FIG. 2B is a plan view illustrating the memory device taken along an A-A' line illustrated in FIG. 2A.
Figure 2C:
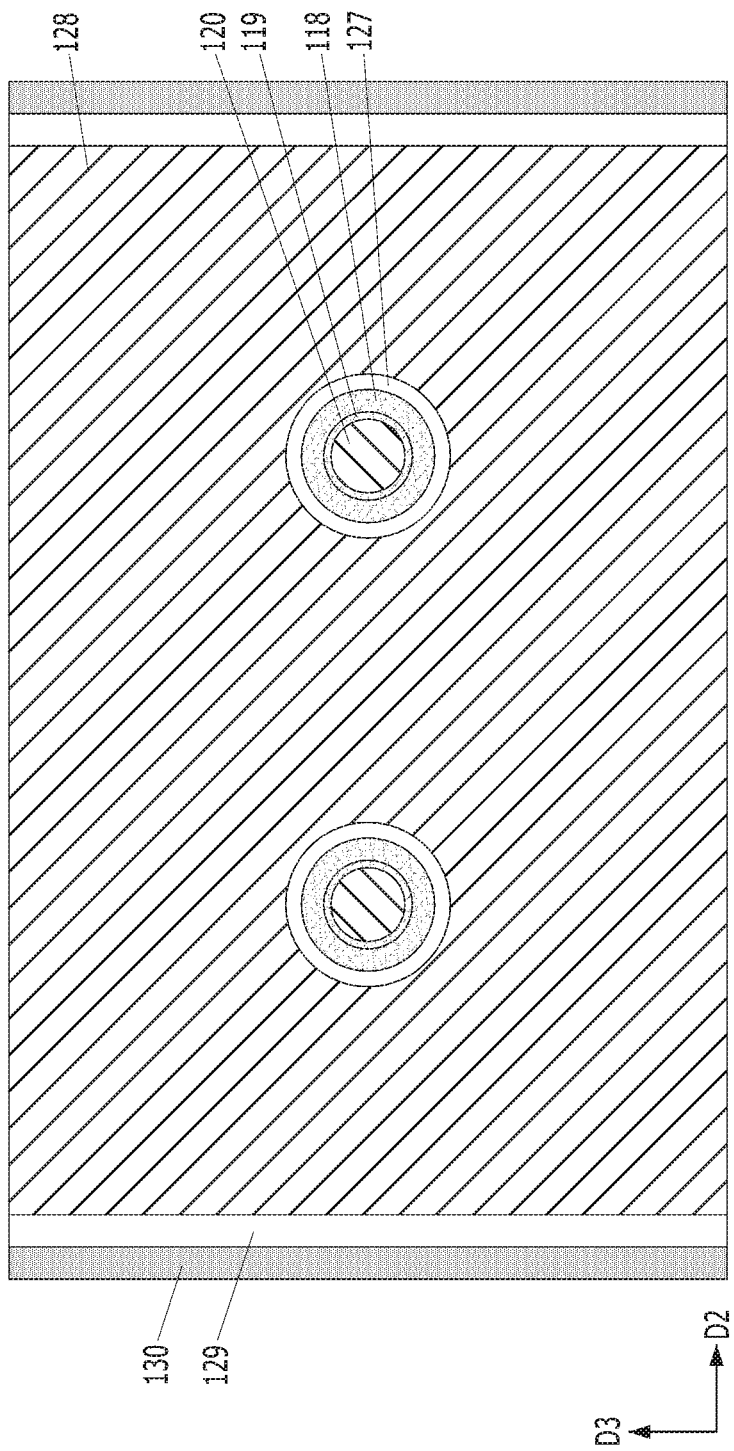
FIG. 2C is a plan view illustrating the memory device taken along a B-B' line illustrated in FIG. 2A.
Figure 2D:
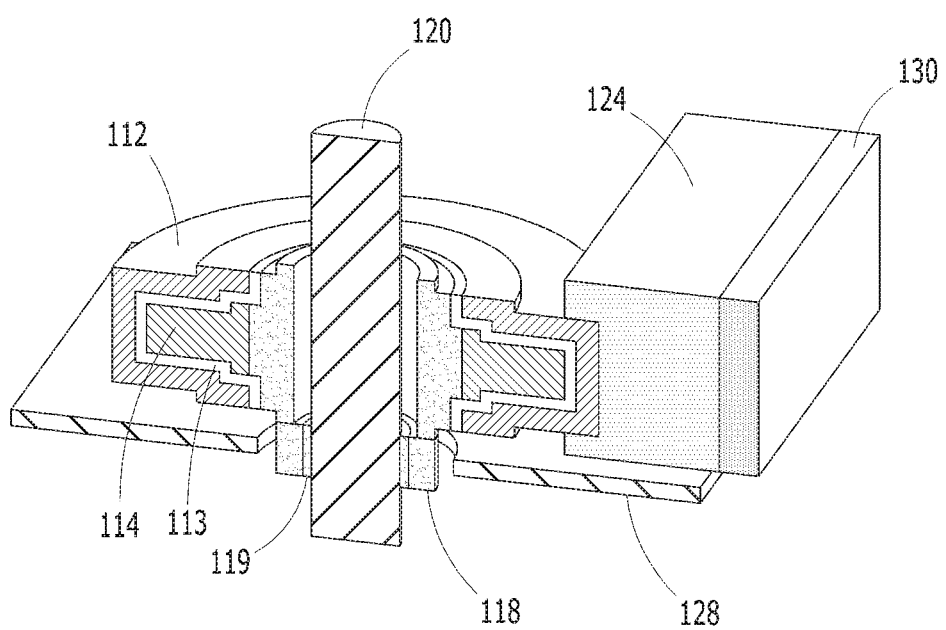
FIG. 2D is an exploded perspective view of a memory cell MC illustrated in FIG. 2A.

FIG. 2A is a cross-sectional view illustrating an example of a memory device 200. FIG. 2B is a plan view illustrating the memory device 200 taken along an A-A' line illustrated in FIG. 2A. FIG. 2C is a plan view illustrating the memory device 200 taken along a B-B' line illustrated in FIG. 2A. FIG. 2D is an exploded perspective view of a memory cell MC illustrated in FIG. 2A.

Referring to FIGS. 2A to 2D, the memory device 200 may include a peripheral circuit portion 100L and a memory cell array MCA. The memory cell array MCA may be located above the peripheral circuit portion 100L in the first direction D1. An etch stop layer 101 may be located between the memory cell array MCA and the peripheral circuit portion 100L. A hard mask layer 105 may be formed on the memory cell array MCA.

The memory cell array MCA may include a plurality of memory cells MC. The memory cell array MCA is an example of a structure in which the memory cells MC are stacked vertically along a first direction D1 on the peripheral circuit portion 100L. The number of memory cells MC stacked on the peripheral circuit portion 100L may be 'n', where 'n' is an integer equal to or greater than 1. In addition, the memory cells MC may be arranged horizontally along a second direction D2.

The peripheral circuit portion 100L may be a material suitable for semiconductor processing. The peripheral circuit portion 100L may include a semiconductor substrate, e.g., a substrate made of a material suitable for semiconductor processing. For example, the peripheral circuit portion 100L may include a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, combinations thereof or multi-layers thereof. The peripheral circuit portion 100L may include another semiconductor material, such as germanium. The peripheral circuit portion 100L may include an III/V-group semiconductor substrate, for example, a chemical compound semiconductor substrate such as a gallium arsenide (GaAs). The peripheral circuit portion 100L may include a Silicon-On-Insulator (SOI) substrate. The peripheral circuit portion 100L may have a stack structure of a semiconductor substrate and a dielectric material.

In the present embodiment, the memory device 200 may have a Peri under Cell (PUC) structure. In other words, the memory cell array MCA may be located above the peripheral circuit portion 100L. The peripheral circuit portion 100L may include one or more control circuits for driving the memory cell array MCA during an operation such as, for example, a read or a write operation. The control circuits of the peripheral circuit portion 100L may include an N-channel transistor, a P-channel transistor, a CMOS circuit or combinations thereof. The control circuits of the peripheral circuit portion 100L may include an address decoder circuit, a read circuit, a write circuit and the like. The control circuits of the peripheral circuit portion 100L may include a planar channel transistor, a recess channel transistor, a buried gate transistor, a fin channel transistor (FinFET) and the like.

For example, the peripheral circuit portion 100L may include a sense amplifier SA, and the sense amplifier SA may be coupled to the memory cell array MCA. The memory cell array MCA and the sense amplifier SA may be interconnected with each other through a multi-level metal wiring MLM.

Although not illustrated, in some embodiments, the memory device 200 may include a first semiconductor substrate and a second semiconductor substrate bonded to the first semiconductor substrate. The memory cell array MCA may be formed on the first semiconductor substrate, and the peripheral circuit portion 100L may be formed on the second semiconductor substrate. Each of the first and second semiconductor substrates may include conductive bonding pads, and the first and second semiconductor substrates may be bonded to each other through the conductive bonding pads. Accordingly, the memory cell array MCA and the peripheral circuit portion 100L may be electrically coupled to each other.

In some embodiments, the memory device 200 may have a Peri over Cell (POC) structure. Specifically, the peripheral circuit portion 100L may be located above the memory cell array MCA.

The memory cells MC may be stacked along the first direction D1 perpendicular to the peripheral circuit portion 100L, and located in a lateral arrangement (refer to reference symbol 'LA') along the second direction D2 and a third direction D3 which crosses the first direction D1. The first direction D1 may be perpendicular to the surface of the peripheral circuit portion 100L, and the second and third directions D2 and D3 may be parallel to the surface of the peripheral circuit portion 100L. The second and third directions D2 and D3 may cross each other, and the first direction D1 may cross the second and third directions D2 and D3.

In the present embodiment, the uppermost surface of the peripheral circuit portion 100L may include a dielectric material, a conductive material or a combination thereof.

The memory cell array MCA may include a plurality of word lines 128, a plurality of bit lines 120 and the plurality of memory cells MC. However, the numbers of word lines 128, bit lines 120 and memory cells MC are merely an example, and the present embodiment may not be limited thereto.

The bit lines 120 may be extended in the first direction D1 perpendicular to the surface of the peripheral circuit portion 100L. In other words, the bit lines 120 may be vertically oriented from the peripheral circuit portion 100L. The bit lines 120 may contact the multi-level metal wiring MLM of the peripheral circuit portion 100L. The bit lines 120 may be referred to as "vertical bit lines (VBL)". The bit lines 120 may be arranged to be spaced apart from one another along the second and third directions D2 and D3. The bit lines 120 may be independently arranged horizontally along the second and third directions D2 and D3.

For example, referring to one of the bit lines 120, one memory cell MC may be coupled to one bit line 120, and a plurality of memory cells MC arranged vertically along the first direction D1 may be coupled to one bit line 120. The memory cells MC stacked vertically along the first direction D1 may share one bit line 120.

The plurality of word lines 128 may be parallel to the surface of the peripheral circuit portion 100L The word lines 128 may be stacked vertically along the first direction D1. The word lines 128 may be referred to as "lateral word lines". The top, bottom and first side surfaces of the word lines 128 may be covered by a gate dielectric layer 127. The second sides of the word lines 128 may be covered by a word line capping layer 129. The gate dielectric layer 127 may be made of a selective oxide. Selective oxide refers to oxide formed by a selective oxidation process. The gate dielectric layer 127 may be made of silicon oxide, silicon nitride, silicon oxynitride, a high-k material or combinations thereof. Each of the word lines 128 may be made of a metal or metal-based material. For example, the metal or metal-based material may include titanium nitride, tungsten or a stack of titanium nitride and tungsten. For example, the word line capping is layer 129 may be made of a silicon oxide. One word line 128 may be shared between a plurality of memory cells MC. For example, one word line 128 may be shared between two memory cells MC. The word lines 128 may have planar plate shape extending along the second and third directions D2 and D3.

The bit lines 120 may penetrate corresponding word lines 128. A plurality of bit lines 120 may penetrate each word line 128. The word line 128 may extend along the third direction D3. One end of the word line 128 may be a word line contact region.

The memory cells MC stacked along the first direction D1 may share one plate line PL. The memory cells MC arranged along the second direction D2 may share different plate lines PL. Each plate line PL may extend vertically along the first direction D1 from the surface of the peripheral circuit portion 100L. Each plate line PL may directly contact the surface of the peripheral circuit portion 100L. In the present embodiment, each plate line PL may be oriented in the first direction D1 perpendicular to the surface of the peripheral circuit portion 100L, and extend in the third direction D3 crossing the first direction D1. Each plate line PL may be vertically oriented from the peripheral circuit portion 100L and may be referred to also as a "vertical plate line VPL". The plate line PL may be a pillar having a linear shape, which extends vertically along the first direction D1 and extends horizontally along the third direction D3.

The bit lines 120 and the plate lines PL may be located to be spaced apart from each other. The bit lines 120 and the plate lines PL may be vertically oriented in the first direction D1 from the peripheral circuit portion 100L, and be spaced apart from each other. A plurality of bit lines 120 (e.g., two bit lines as illustrated in FIG. 2A) may be disposed between two plate lines PL.

Each of the memory cells MC may be located between a bit line 120 and a plate line PL adjacent to the bit line 120. The memory cells MC may be located in a vertical arrangement along the first direction D1 perpendicular to the peripheral circuit portion 100L, and be located in the lateral arrangement (LA) along the second and third directions D2 and D3 parallel to the peripheral circuit portion 100L.

Each of the memory cells MC may be coupled to one of the bit lines 120, one of the word lines 128 and one of the plate lines PL.

Referring to any one memory cell MC, one memory cell MC may be coupled to one plate line PL. A plurality of memory cells MC arranged vertically along the first direction D1 may be disposed between a plate line PL and a bit line 120 adjacent to the plate line PL. A plurality of memory cells MC arranged vertically along the first direction D1 may be coupled to an adjacent plate line PL and adjacent bit line 120.

Each of the memory cells MC may include a word line 128 and a capacitor. The word line 128 and the capacitor may have annular shapes of surrounding a bit line 120. A part of the capacitor may be coupled to a plate line PL.

Referring to any one memory cell MC, the word line 128 and the capacitor may be stacked vertically along the first direction D1.

The capacitor may include a storage node 114, a dielectric layer 113 and a plate node 112. The storage node 114, the dielectric layer 113 and the plate node 112 may be located in a lateral arrangement parallel to the peripheral circuit portion 100L. The storage node 114 may have a shape which surround the bit line 120. The dielectric layer 113 may have a shape which surround the storage node 114. The plate node 112 may have a shape of surrounding the dielectric layer 113. The storage node 114, the dielectric layer 113 and the plate node 112 may have annular shapes surrounding the bit line 120 as shown better in FIG. 2B.

A silicon liner 111 may be formed to partially surround the plate node 112. The silicon liner 111 may have an annular shape surrounding the outer walls i.e., upper and lower surfaces (in respect to the first direction D1), of the plate node 112. An oxide capping layer 111A may be formed on A first side of the silicon liner 111. The silicon liner 111 may be covered by a first oxide liner 110. The first oxide liner 110 may serve as an isolation layer between the word line 128 and the plate node 112. A second oxide liner 123 may be formed on first side of the first oxide liner 110.

The plate node 112 may be electrically coupled to the plate line PL.

The plate line PL may include a silicon line 124 and a metal line 130. The silicon line 124 may be formed between the plate node 112 and the metal line 130. The silicon line 124 may vertically overlap the word line 128, however, the word line 128 may be longer in the second direction than the silicon line 124 so that the word line 128 may extend also below the plate node 112 and the storage node 114 of a corresponding capacitor CAP. The plate node 112 of a capacitor may extend inside the silicon line 111 in the second direction D2. The plate node 112 of a capacitor may have a generally "[" bracket with horizontal upper and lower lines being at least the same length or longer than the vertical line. The open side of the bracket shape plate node 112 may be directed towards the bit line 120 and the closed side may be directed towards the silicon line 124. The vertical line of the plate node 112 may be positioned inside the side surface of the silicon line 124. In other words, the plate node 112 may penetrate inside the side surface of the silicon line 124. The horizontal upper and lower lines of the plate node may be covered for the most part with the silicon liner 111 except for a small edge thereof which may be inside the side surface of the silicon line 124. Hence, any part of the external surface of the upper and lower horizontal lines of the plate node 112 which is not in contact with the silicon line 124 may be in contact with the silicon liner 111. The internal surface of the bracket shape plate node 112 may be covered by the dielectric layer 113. The upper and lower horizontal lines of the bracket shape plate node 112 may each form a step at its open end causing the open end of the plate node to be larger than the closed end in the first direction D1. The step may be a vertical one as shown in FIG. 2A. Both the dielectric layer 113 and the storage node 114 may also have the same steps so that the overall capacitor structure (114,113, 112) may be symmetrical over an axis of symmetry extending in parallel to the second direction and passing through a center point of the capacitor structure (114, 113, 112). The metal line 130 may cover a first side of the silicon line 124. The metal line 130 may extend vertically from the peripheral circuit portion 100L. The silicon line 124 may be made of polysilicon. The metal line 130 may be made of titanium nitride, tungsten nitride or tungsten. A cell isolation ring 108 may be coupled to first side of the plate node 112. The cell isolation ring 108 may have a shape which partially surrounds the outer wall of the plate node 112. The cell isolation ring 108 may include titanium nitride.

A vertical active layer coupled to the storage node 114 may be formed. The vertical active layer may include a first source/drain layer 115, a vertical channel layer 118 and a second source/drain layer 119. The first source/drain layer 115, the vertical channel layer 118 and the second source/drain layer 119 may be vertically arranged. The vertical channel layer 118 may be located between the first source/drain layer 115 and the second source/drain layer 119. The second source/drain layer 119 may be coupled to the bit line 120. The vertical active layer may have an annular shape surrounding the bit line 120. The first source/drain layer 115, the channel layer 118 and the second source/drain layer 119 may have annular shapes surrounding the bit line 120. The bit line 120 may include a first vertical portion BV1 and a second vertical portion BV2 that are arranged vertically along the first direction D1, The first vertical portion BV1 may be coupled to the second source/drain layer 119, and the second source/drain layer 119 may have an annular shape surrounding the first vertical portion BV1. The first source/drain layer 115 may have an annular shape surrounding the second vertical portion BV2. A vertical channel may be formed in the vertical channel layer 118 by the word line 128.

The first source/drain layer 115 may be protected by a capping layer 116. The capping layer 116 may have an annular shape surrounding the second vertical portion BV2 of the bit line 120. The capping layer 116 may be formed between the first source/drain layer 115 and the second vertical portion BV2 of the bit line 120.

A cell isolation layer 103R may be formed between the memory cells MC that are horizontally arranged.

As described above, the storage node 114 may have an annular shape surrounding the bit line 120, and the dielectric layer 113 may have an annular shape surrounding the storage node 114. The plate node 112 may have a shape which surrounds the dielectric layer 113. The bit line 120 may have a pillar shape penetrating the center of the capacitor.

FIGS. 3 to 25 are cross-sectional views illustrating a method for fabricating a memory device 200 illustrated in FIG. 2A.

Figure 3:
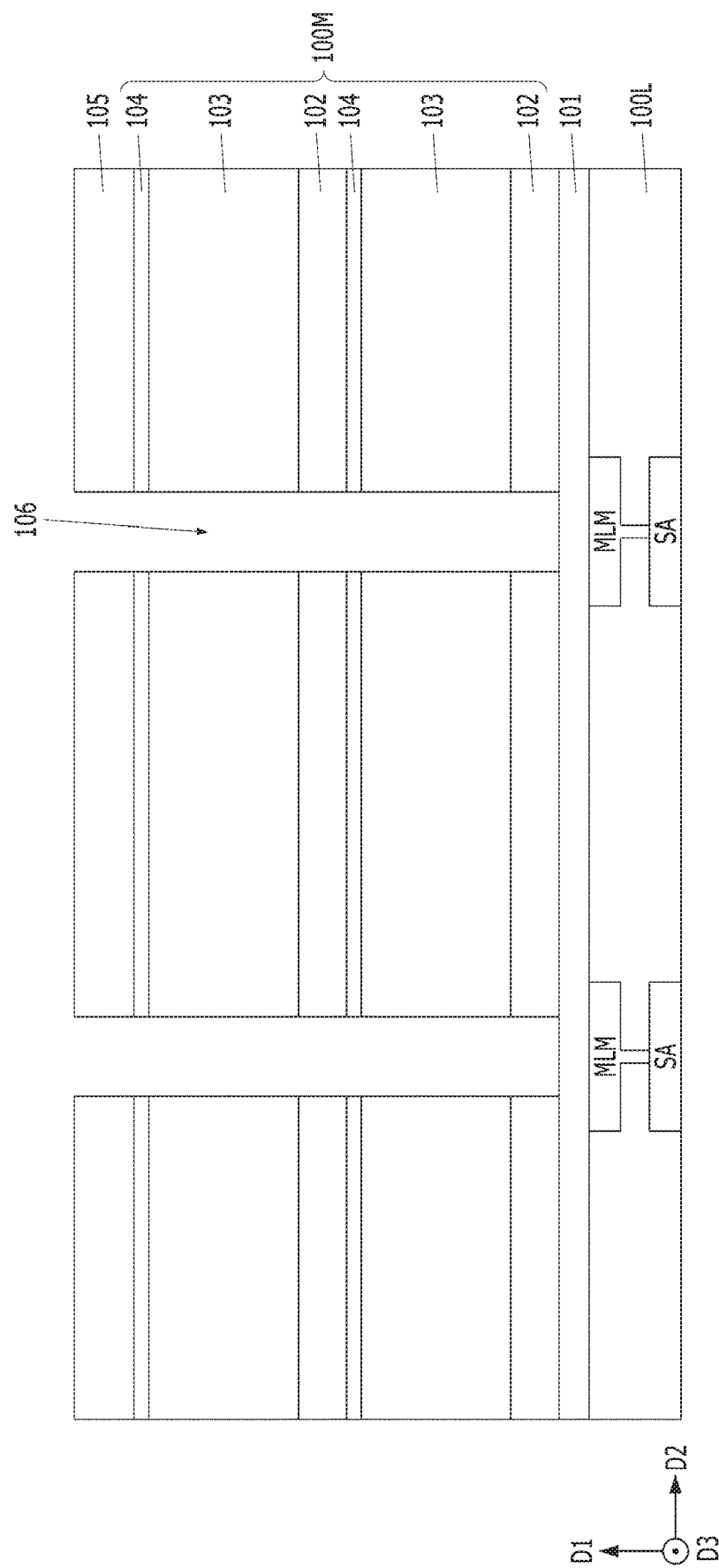
FIGS. 3 to 25 are cross-sectional views illustrating a method for fabricating a memory device 200 illustrated in FIG. 2A.

As illustrated FIG. 3, an etch stop layer 101, a multilayer stack 100M and a hard mask layer 105 may be formed over a peripheral circuit portion 100L. The multilayer stack 100M may include a first material 102, a second material 103 and a third material 104. The multilayer stack 100M may have an alternating stack in which the first, second and third materials 102, 103 and 104 are alternately stacked between the etch stop layer 101 and the hard mask layer 105. The multilayer stack 100M may include a plurality of first materials 102, a plurality of second materials 103 and a plurality of third materials 104. The lowermost layer of the multilayer stack 100M may be the first material 102, and the uppermost layer of the multilayer stack 100M may be the third material 104. The first, second and third materials 102, 103 and 104 may have different etch selectivity. The stack of the first, second and third materials 102, 103 and 104 may be a space in which a capacitor and a word line are formed in a subsequent process, and will be referred to as a "cell stack".

Suitable materials for the first material 102 may include silicon nitride, for the second material 103 may be formed, for example, of silicon oxide, and for the third material 104 may include polysilicon. The stack of the first, second and third materials 102, 103 and 104 may be referred to as a "nitride-oxide-polysilicon (NOP) stack", and the multilayer stack 100M may include one or more NOP stacks. The number of NOP stacks may be set to correspond to the number of memory cells. In the present embodiment, a case where the NOP stack is deposited twice will be described as an example.

The etch stop layer 101 and the hard mask layer 105 may be different materials from the first, second and third materials 102, 103 and 104.

The peripheral circuit portion 100L may include a plurality of control circuits. At least one control circuit may include a sense amplifier SA. A multi-level metal wiring MLM may be located at the uppermost level of the peripheral circuit portion 100L, and the multi-level metal wiring MLM may be coupled to the sense amplifier SA. The multi-level metal wiring MLM may be coupled to a subsequent bit line 120.

Subsequently, the hard mask layer 105 may be etched using a mask (not illustrated). Continuously, the multilayer stack 100M may be etched using the hard mask layer 105 as an etch barrier so that the etch stop layer 101 is exposed. Accordingly, a plurality of openings 106 penetrating the multilayer stack 100M may be formed. The multilayer stack 100M may be dry-etched to form the openings 106. An etch process for forming the openings 106 may stop at the etch stop layer 101.

The openings 106, which are vertical openings, may expose the top surface of the peripheral circuit portion 100L, that is, the top surface of the multi-level metal wiring MLM. The sidewalls of the openings 106 may have vertical profiles. The openings 106 may be spaced apart from one another with a predetermined gap therebetween. The openings 106 are spaces where the bit line 120 is formed in a subsequent process. The openings 106 may be oriented vertically from the peripheral circuit portion 100L.

Figure 4:
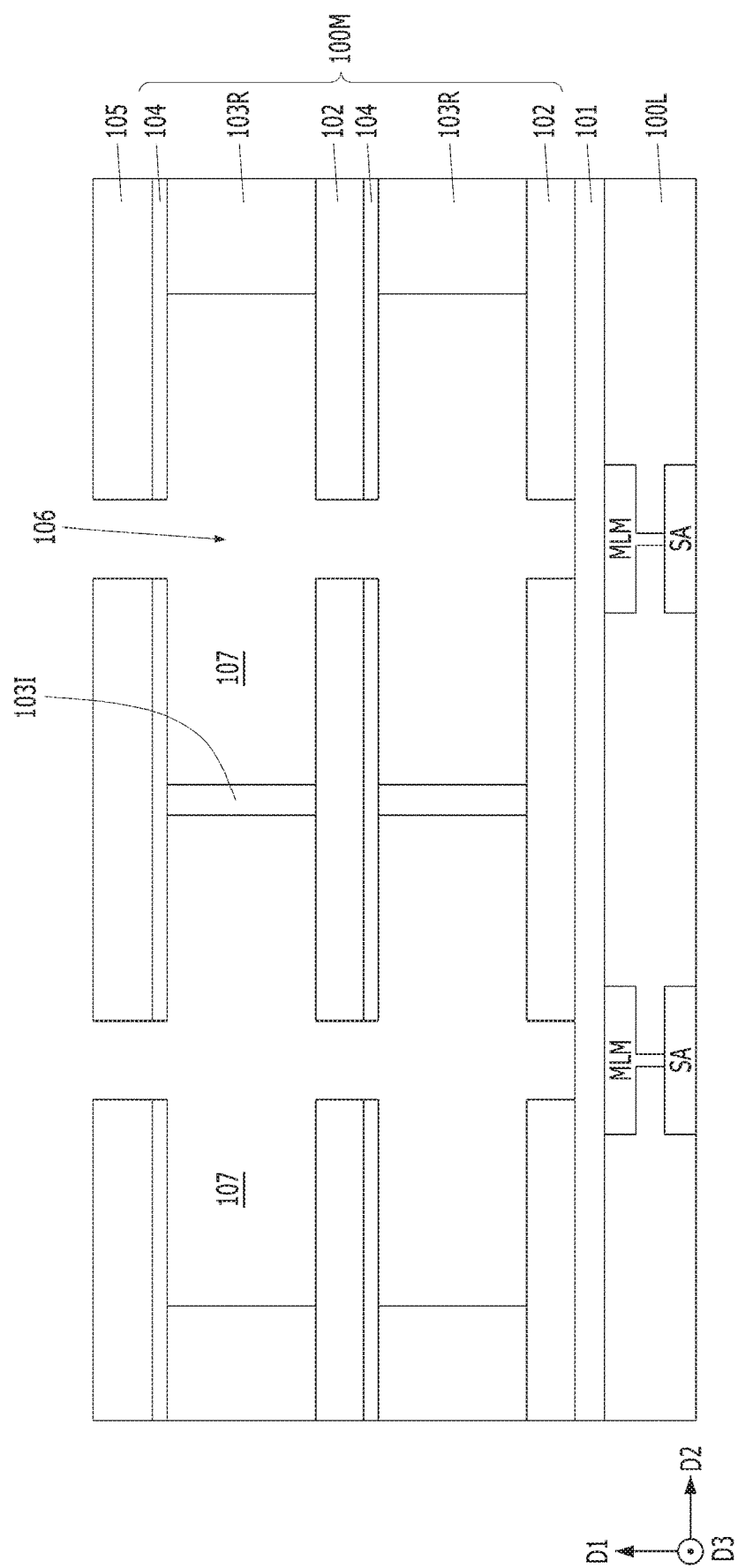

As illustrated in FIG. 4, the second material 103 may be selectively recessed through the openings 106. The second material 103 may be recessed using a wet etch process. When the second material 103 includes silicon oxide, the silicon oxide may be recessed using hydrofluoric acid (HF). A horizontal recess 107 may be formed by recessing the second material 103, and the second material 103 may remain on first side of the horizontal recess 107. Hereinafter, the remaining second material 103 may be abbreviated as a "cell isolation layer 103R". The cell isolation layer 103R may be formed between the horizontal recesses 107 which are horizontally adjacent to each other. The horizontal recess 107 may have a shape which surrounds each of the openings 106. The first and third materials 102 and 104 may remain between the horizontal recesses 107 which are vertically adjacent to each other.

From a top view, a plurality of horizontal recesses 107 may be spaced apart from each other, and each of the horizontal recesses 107 may have a shape of a circle. The horizontal recess 107 is a space where the capacitor is formed in a subsequent process. The adjacent horizontal recesses 107 may be isolated from each other by a cell isolation layer 103R.

The horizontal recess 107, which is a space where the subsequent capacitor is formed, may be referred to as a "capacitor recess".

Figure 5:
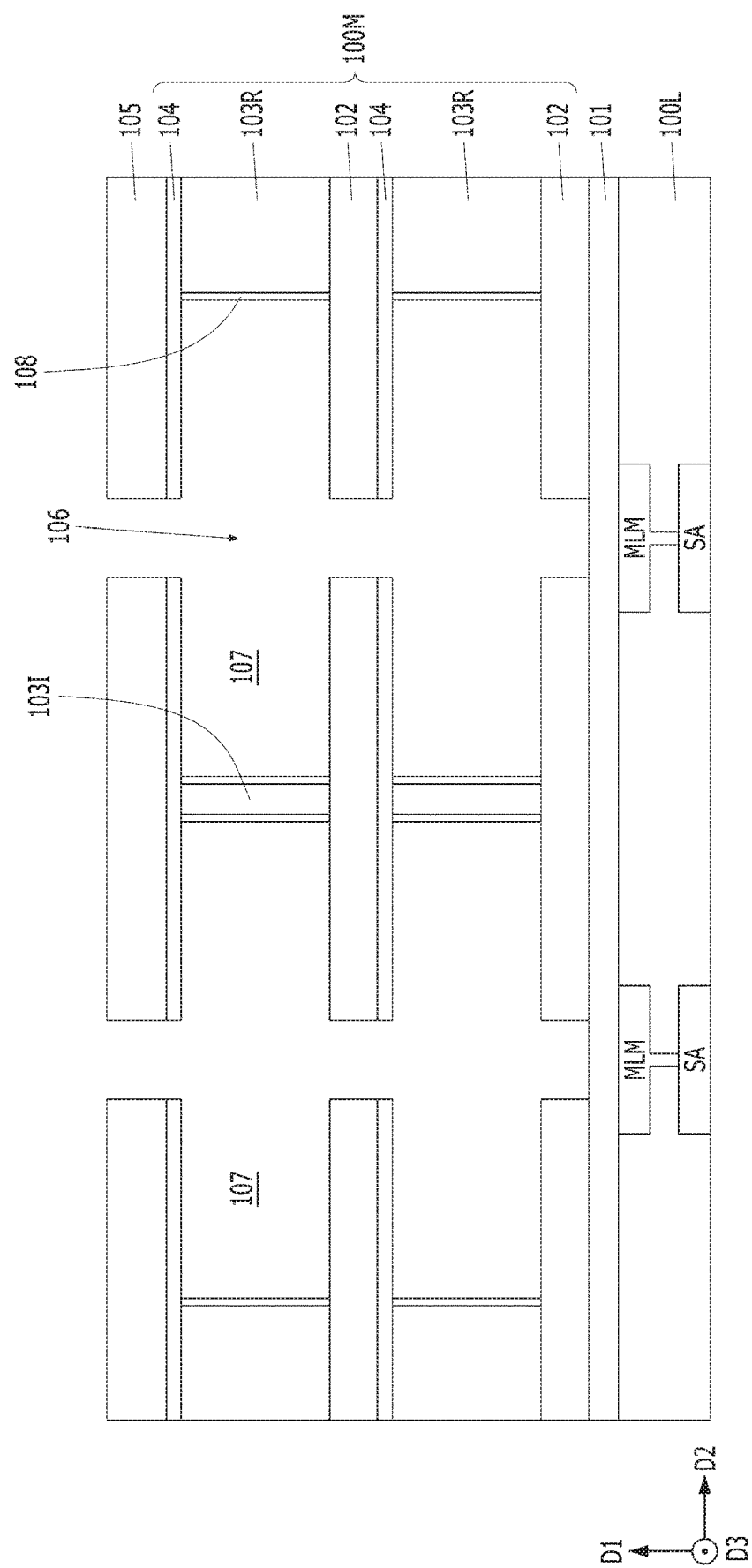

As illustrated in FIG. 5, a cell isolation ring 108 may be formed on the sidewall of the cell isolation layer 103R. The cell isolation ring 108 may have an etch selectivity with respect to the cell isolation layer 103R. In an embodiment, the cell isolation ring 108 may be formed of metal nitride including, for example, titanium nitride.

To form the cell isolation ring 108, titanium nitride may be deposited across the surface of the resultant structure including the horizontal recess 107, and then an etch-back process may be performed.

From a top view, the cell isolation ring 108 may have an annular shape, and be formed to contact the sidewalls of the horizontal recess 107. From a top view, the cell isolation ring 108 may have an annular shape surrounding the opening 106 and the horizontal recess 107.

Figure 6:
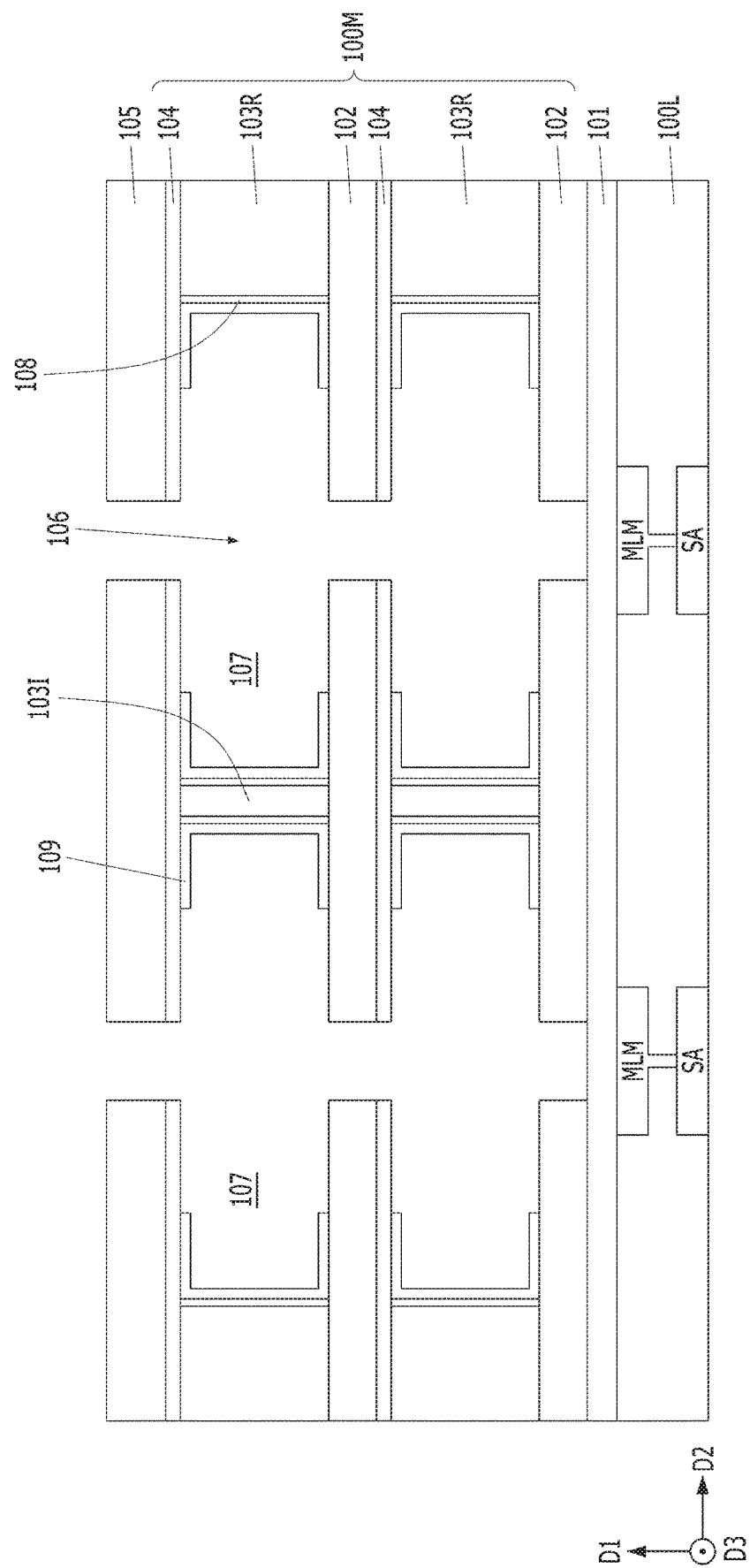

As illustrated in FIG. 6, a liner layer 109 may be formed on the cell isolation ring 108. The liner layer 109 may be formed in the horizontal recess 107. To form the liner layer 109, a liner material may be conformally deposited on the surface of the resultant structure including the horizontal recesses 107, and then the liner material may be recessed. The liner layer 109 may be the same as the third material 104. The liner layer 109 may include polysilicon. The liner layer 109 may partially cover the third material 104 in the horizontal recess 107. The liner layer 109 may cover all of the sidewalls of the cell isolation ring 108.

The liner layer 109 may have a shape which covers the innermost portion of the horizontal recess 107. The liner layer 109 may have a '⊂' shape. From a top view, the liner layer 109 may have a shape which surrounds the opening 106 and the horizontal recess 107. The liner layer 109 may directly contact the cell isolation ring 108. The liner layer 109 may have the shape of a bracket "[" having a vertical part and an upper and a lower horizontal part. The vertical part of the liner layer 109 may be in direct contact with the cell isolation layer 108. The upper horizontal part of the liner layer 109 may be in direct contact with a portion the third material 104. The lower horizontal part of the liner layer 109 may be in direct contact with a portion of the second material 102.

Figure 7:
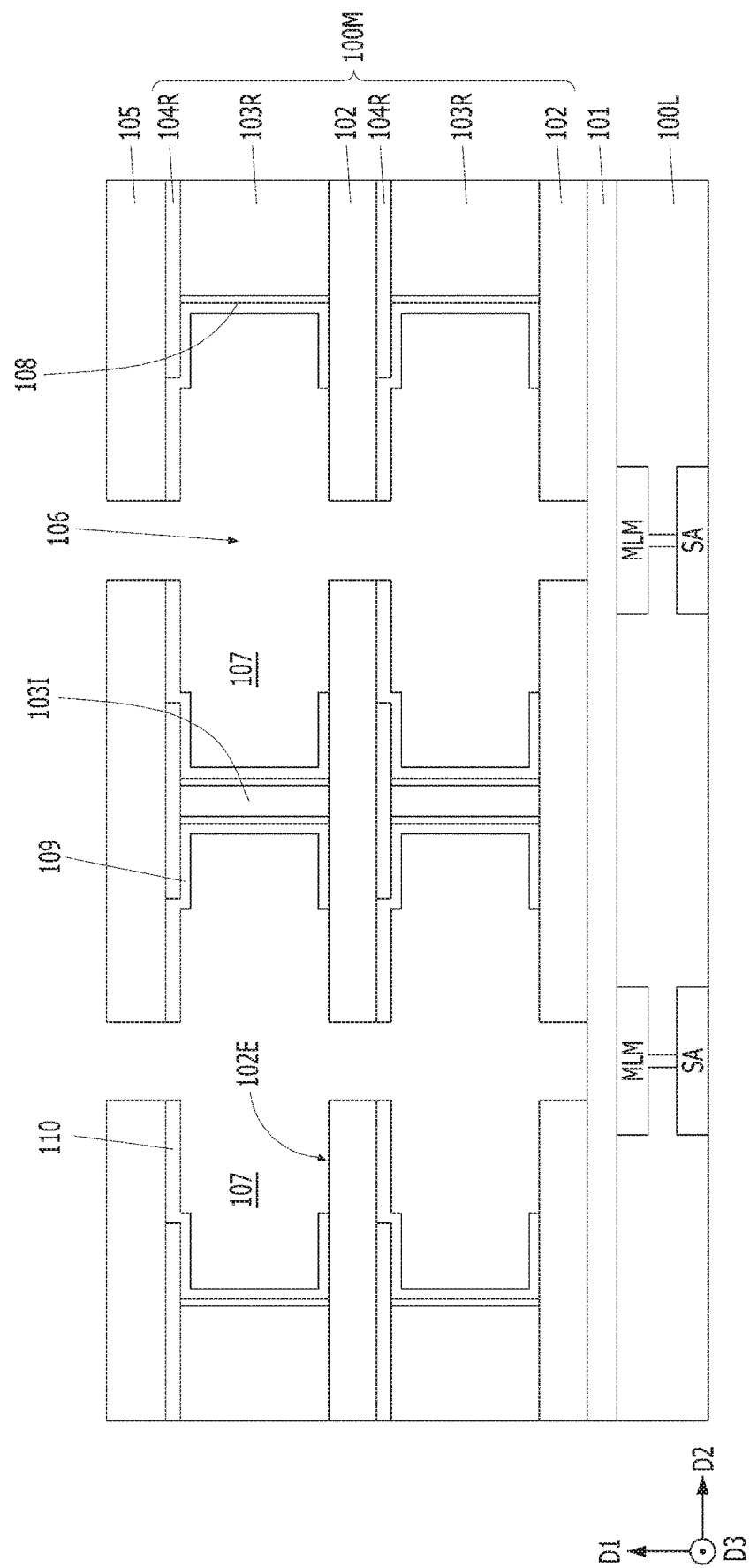

As illustrated in FIG. 7, a wet oxidation process may be performed. The liner layer 109 and a part of the third material 104 may be selectively oxidized by the wet oxidation process. Accordingly, a first oxide liner 110 may be formed. The liner layer 109 may be fully oxidized and the third material 104 may be partially oxidized. The first oxide liner 110 may cover all of the sidewalls of the cell isolation ring 108. The first oxide liner 110 may partially cover the first material 102 in the horizontal recess 107. For example, the first oxide liner 110 may partially cover the lower first material 102, and fully cover the upper first material 102. Accordingly, the surface of the lower first material 102 may be partially exposed by the first oxide liner 110. The surface of the lower first material 102 which is exposed by the first oxide liner 110 is indicated with numeral 102E.

The third material 104 which remains without being oxidized is indicated with reference numeral 104R.

Figure 8:
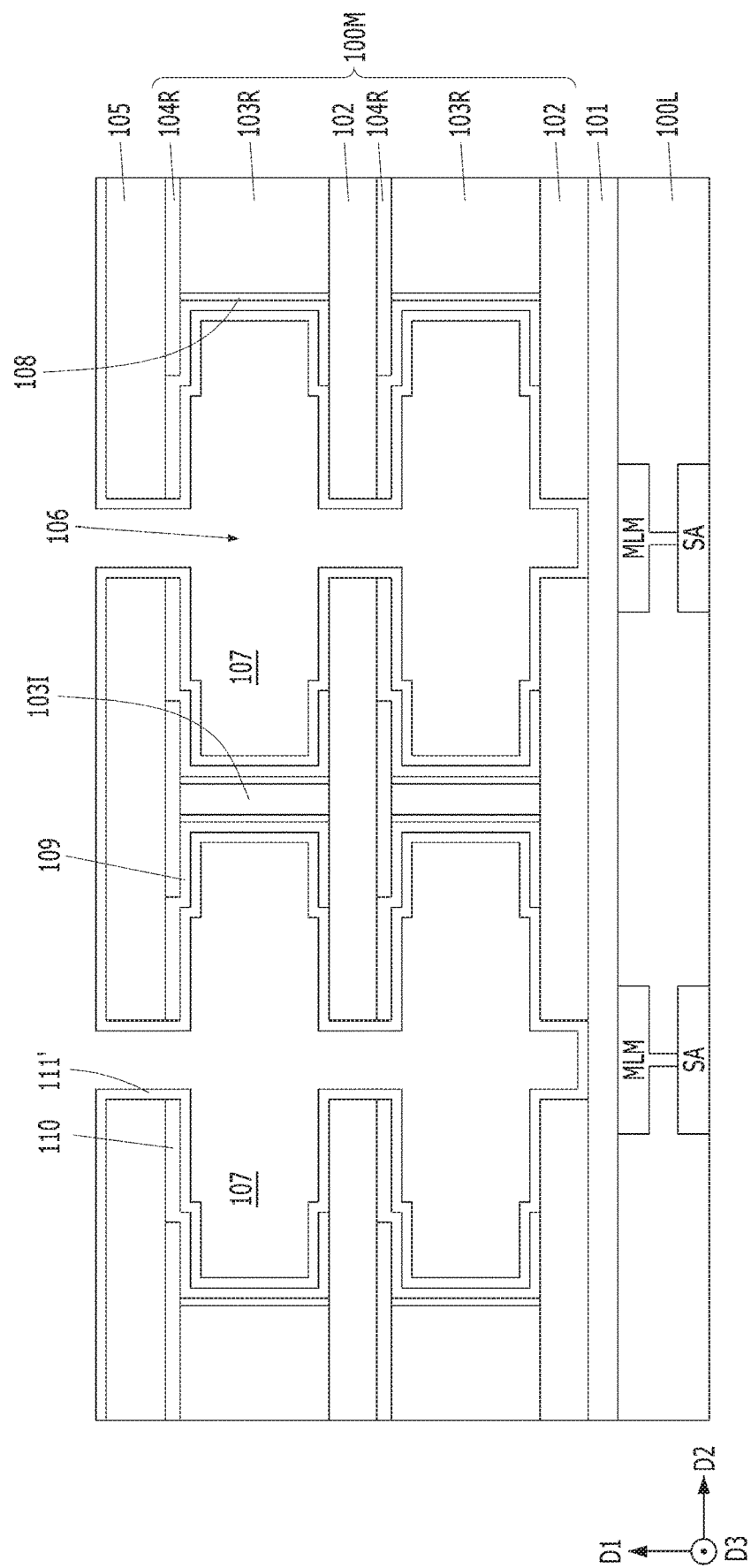

As illustrated in FIG. 8, a liner polysilicon layer 111' may be deposited. The liner polysilicon layer 111' may be conformally formed on the entire structure including the first oxide liner 110. The liner polysilicon layer 111' may conformally cover the opening 106 and the horizontal recess 107.

Figure 9:
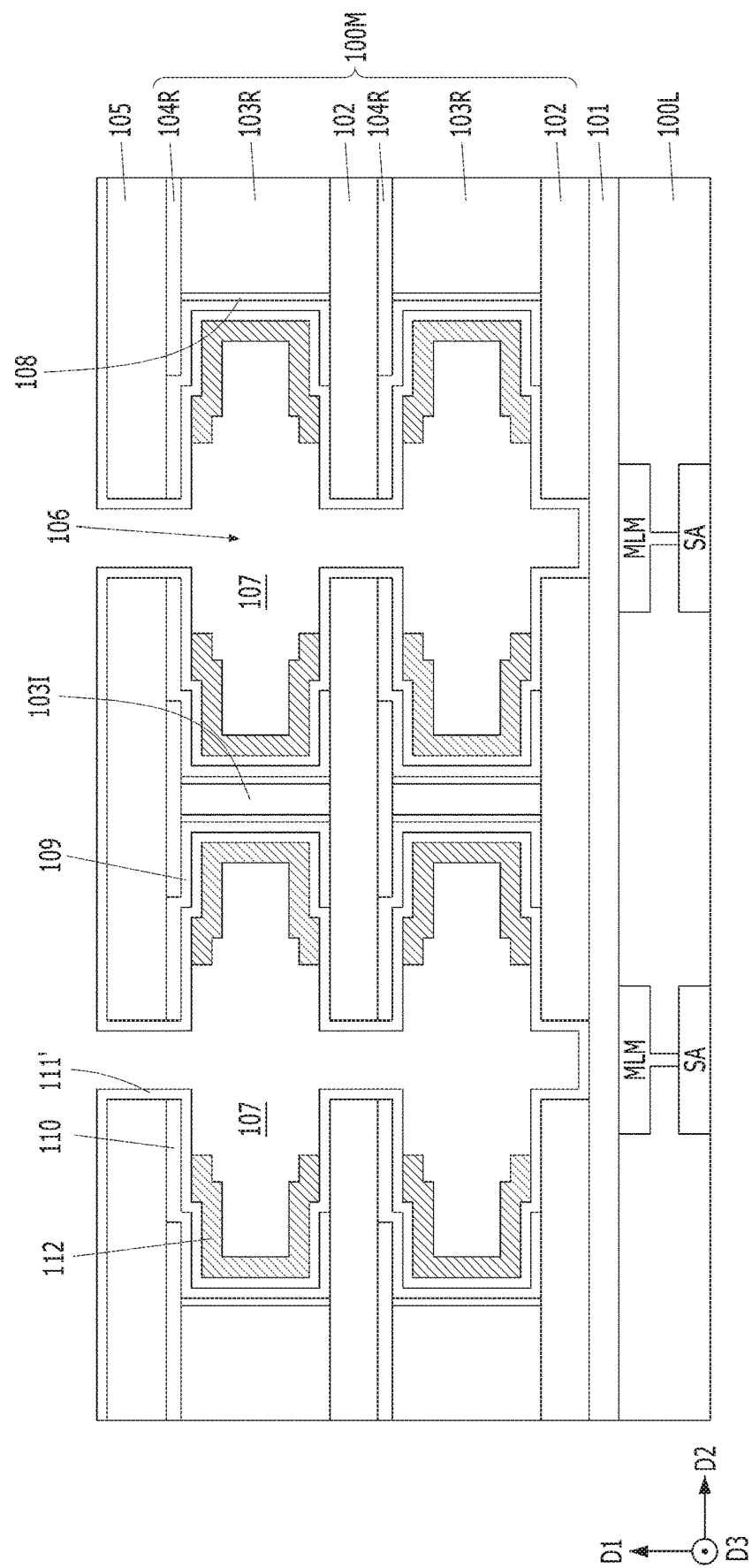

As illustrated in FIG. 9, a plate node 112 of the capacitor may be formed on the liner polysilicon layer 111'. The plate node 112 may be formed of a metal or metal-based material including, for example, a metal nitride. The plate node 112 may include metal, metal nitride, metal carbide, conductive metal nitride, conductive metal oxide or combinations thereof. The plate node 112 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$) or combinations thereof.

Subsequently, the plate node 112 may be etched back to remain in each of the horizontal recesses 107. This is referred to as a "plate node isolation process". A part of the liner polysilicon layer 111' in each horizontal recess 107 adjacent to the opening 106 may be exposed by the plate node 112.

The plate nodes 112 may be formed in respective horizontal recesses 107. The plate nodes 112 which are horizontally adjacent to each other may be isolated from each other by the cell isolation layer 103R. The central portion of each plate node 112 may have a shape in which the opening 106 passes through the plate node 112. Each plate node 112 formed in each horizontal recess 107 may have a left and a right part which may be symmetrical on a vertical plane crossing through a central vertical axis of the opening 106.

Each left and right part of each plate node 112 may have the shape of a left and right bracket "[", "]", respectively, with their respective open sides pointed towards the opening 106 and their horizontal parts having a step formed near their respective opened sides which widens their respective opened sides.

Figure 10:
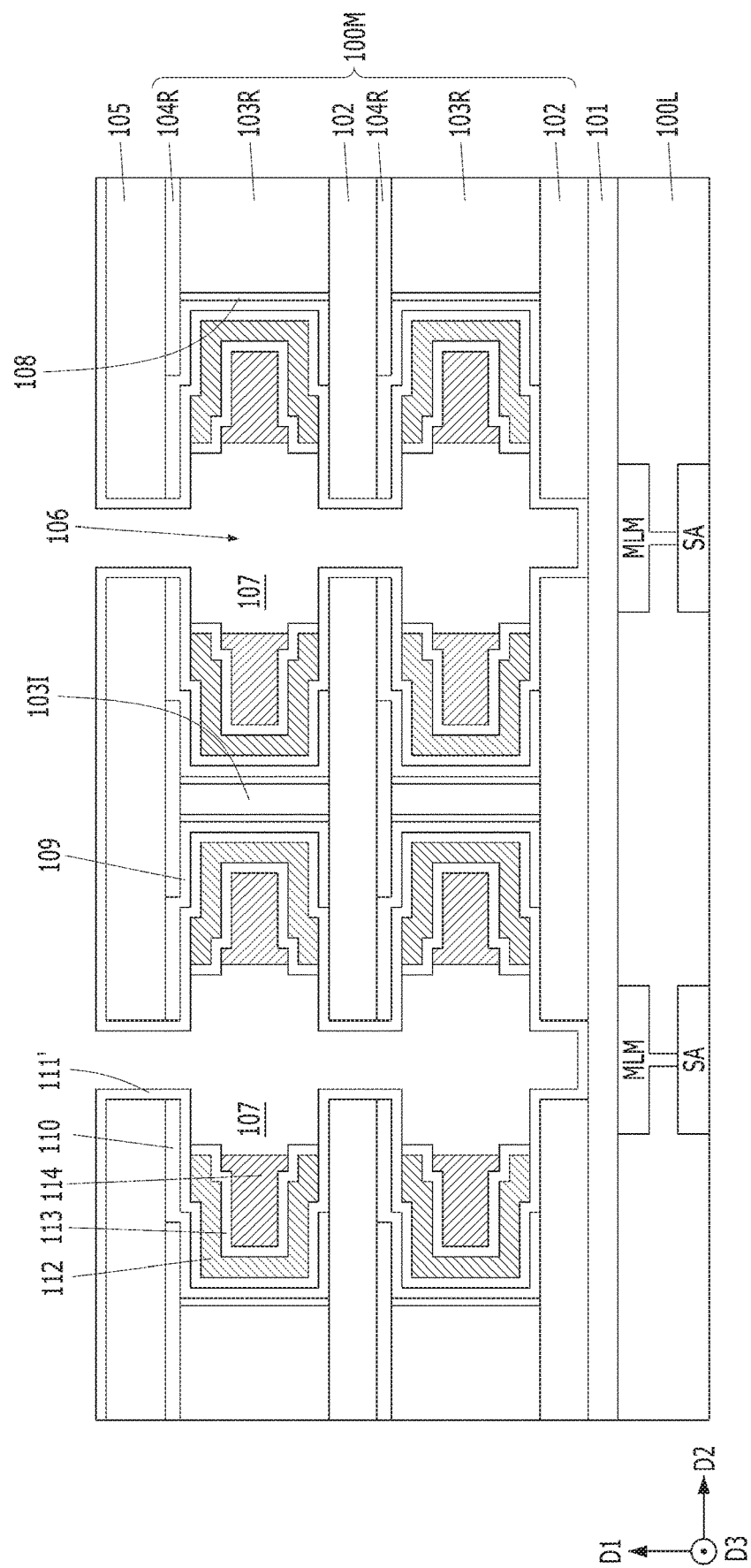

As illustrated in FIG. 10, a dielectric layer 113 may be formed on the plate node 112. The dielectric layer 113 may be formed conformally on the plate node 112. The dielectric layer 113 may be in direct contact with the plate node 112. A storage node 114 may be formed on the dielectric layer 113. The storage node 114 may fill the inner space of the of the plate node 112 provided by the dielectric layer 113 on the dielectric layer 113. The storage node 114 may be in direct contact with the dielectric layer 113. The vertical side surface of the storage node 114 that is closer to the opening 106 may be flat and slightly recessed relatively to the dielectric layer 113. The storage node 114 may be formed of a metal, a metal-based material, or combinations thereof. The storage node 114 may include a metal, metal nitride, conductive metal oxide or combinations thereof. For example, the storage node 114 may include titanium (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$) or combinations thereof.

The dielectric layer 113 and the storage node 114 may be formed in the horizontal recess 107. Therefore, the dielectric layers 113 that are horizontally adjacent to each other may be isolated from each other by the cell isolation layer 103R. The storage nodes 114 that are horizontally adjacent to each other may be isolated from each other by the cell isolation layer 103R.

To form the dielectric layer 113, a dielectric material may be conformally deposited on the entire structure including the plate node 112, and subsequently be etched back. The dielectric layer 113 may be formed as a single-layered material, a multi-layered material, a laminated material, an intermixing material or combinations thereof. The dielectric layer 113 may be formed of a high-k material. The dielectric layer 113 may have a higher dielectric constant than silicon oxide ($SiO_2$). The silicon oxide may have a dielectric constant of approximately 3.9, and the dielectric layer 113 may be formed of a material having a dielectric constant of 4 or more. The high-k material may have a dielectric constant of approximately 20 or more. For example, the high-k material may include hafnium oxide ($HfO_2$), zirconium oxide ($ZrO_2$), aluminum oxide ($Al_2O_3$) or combinations thereof. The dielectric layer 113 may be formed by atomic layer deposition (ALD). In an embodiment, the dielectric layer 113 may be formed of a zirconium-based oxide. The dielectric layer 113 may have a stack structure including a zirconium oxide ($ZrO_2$). In an embodiment, the stack structure may include a ZA ($ZrO_2/Al_2O_3$) or ZAZ ($ZrO_2/Al_2O_3/ZrO_2$) structure. The ZA structure may be a structure in which aluminum oxide ($Al_2O_3$) is stacked on zirconium oxide ($ZrO_2$). The ZAZ structure may be a structure in which zirconium oxide ($ZrO_2$), aluminum oxide ($Al_2O_3$) and zirconium oxide ($ZrO_2$) are sequentially stacked. Each of the zirconium oxide ($ZrO_2$), the ZA structure and the ZAZ structure may be referred to as a "zirconium oxide-based layer". In some embodiments, the dielectric layer 113 may be formed of hafnium-based oxide. The dielectric layer 113 may have a stack structure including hafnium oxide ($HfO_2$). In an embodiment, the stack structure including hafnium oxide ($HfO_2$) may include an HA ($HfO_2/Al_2O_3$) or HAH ($HfO_2/Al_2O_3/HfO_2$) structure. The HA structure may be a structure in which aluminum oxide ($Al_2O_3$) is stacked on hafnium oxide ($HfO_2$). The HAH structure may have a structure in which hafnium oxide ($HfO_2$), aluminum oxide ($Al_2O_3$) and hafnium oxide ($HfO_2$) are sequentially stacked. Each of hafnium oxide ($HfO_2$), the HA structure and the HAH structure may be referred to as a "hafnium oxide-based layer". In the ZA, ZAZ, HA and HAH structures, aluminum oxide ($Al_2O_3$) may have a higher band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 113 may include a stack of a high-k material and a high band gap material having higher band gap energy than the high-k material. The dielectric layer 113 may be formed, for example, of silicon oxide ($SiO_2$) as another high band gap material in addition to aluminum oxide ($Al_2O_3$). The dielectric layer 113 including the high band gap material may suppress a leakage current. The high band gap material may be extremely thin. The high band gap material may have a smaller thickness than the high-k material. The thickness of the high band gap material may be 10 Å or less.

In some embodiments, the dielectric layer 113 may include a laminate structure in which a high-k material and a high band gap material are alternately stacked. For example, the dielectric layer 113 may include a ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$) structure. In the laminate structure as described above, aluminum oxide ($Al_2O_3$) may be extremely thin.

Forming the storage node 114 may include depositing a storage node material on the entire structure including the dielectric layer 113, and subsequently etching back the deposited storage node material. This may be referred to as a "storage node isolation process".

The central portion of the storage node 114 may have a shape in which the opening 106 passes through the storage node 114.

The capacitor may be formed in the horizontal recess 107 by a series of processes as described above, and include the plate node 112, the dielectric layer 113 and the storage node 114. The opening 106 may penetrate the central portion of the capacitor which has an annular shape. The capacitor may partially fill the horizontal recess 107.

Figure 11:
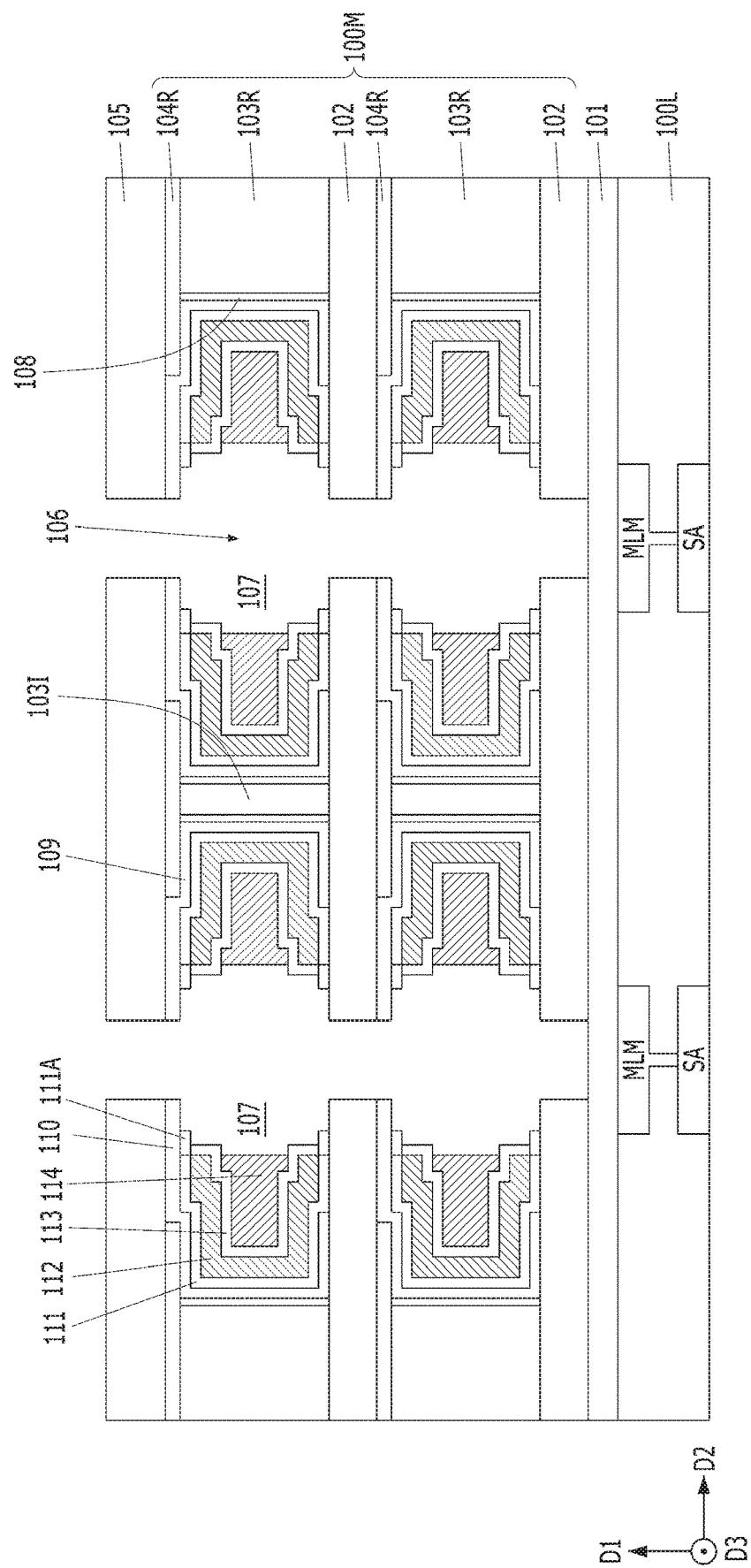

As illustrated in FIG. 11, the liner polysilicon layer 111' may be recessed to form a silicon liner 111. Specifically, the part of the liner polysilicon layer 111' which covered the vertical side of the hard mask layer 105, the top side of the hard mask layer 105, and a small part of the bottom side of the hard mask layer 105 near the opening 106 may be removed to form the silicon liner 111. Subsequently, an end part of the silicon liner 111 near the opening 106 may be selectively oxidized to form an oxide capping layer 111A at the end of the silicon liner 111. The oxide capping layer 111A may directly contact the first oxide liner 110. The silicon liner 111 may have an annular shape surrounding the plate node 112.

The silicon liner 111 and the plate node 112 may be sealed by the first oxide liner 110, the oxide capping layer 111A and the dielectric layer 113. The surface of the storage node 114 may be exposed to the opening 106.

Figure 12:
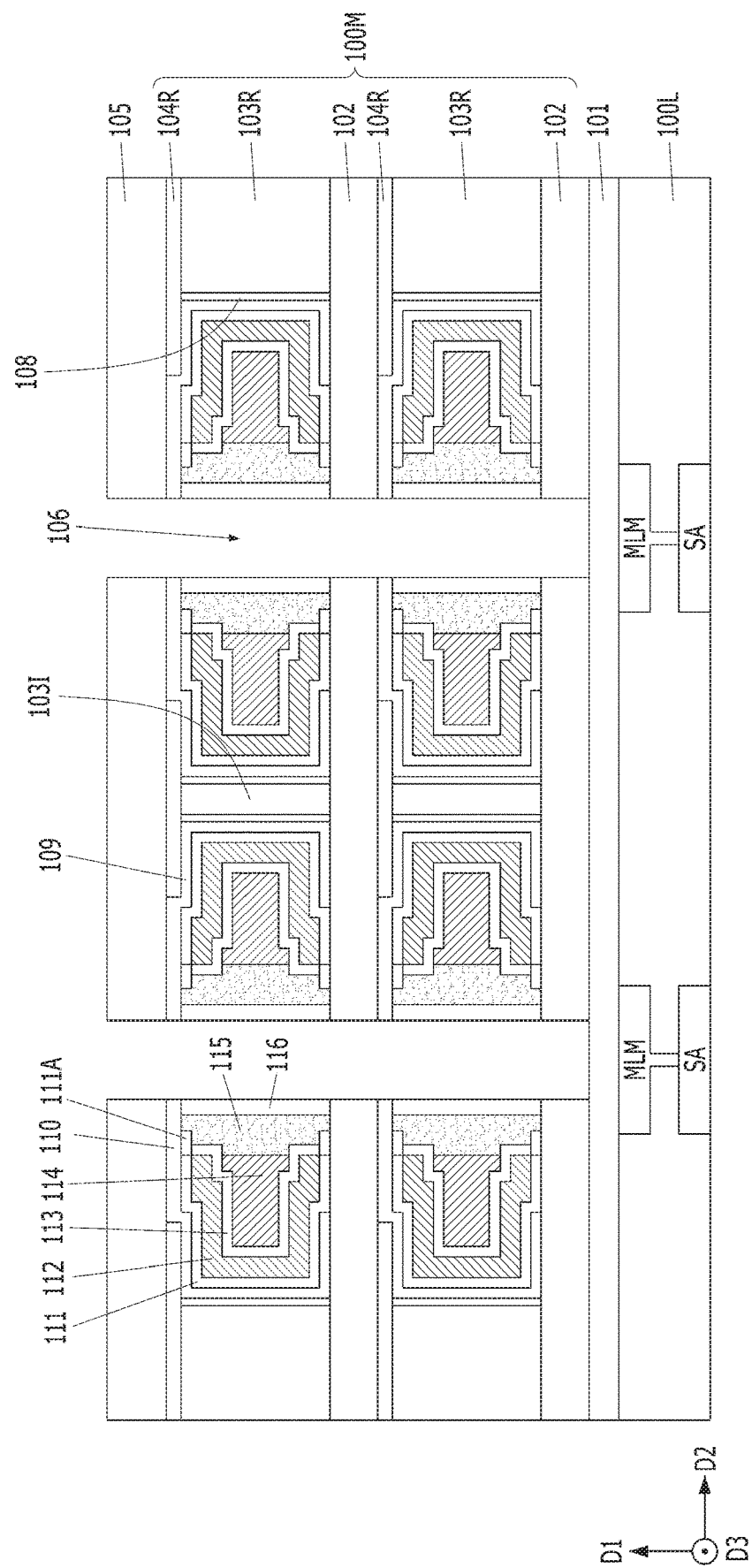

As illustrated in FIG. 12, a first source/drain layer 115 may be formed. The first source/drain layer 115 may be formed on first side of the storage node 114. The first source/drain layer 115 may be formed in each of the horizontal recesses 107. The first source/drain layer 115 may directly contact the vertical side surface of the storage node 114, the exposed surfaces of the dielectric layer 113 and the oxide capping layer 111A and partially the exposed bottom surface of the first oxide liner 110. To form the first source/drain layer 115, a doped material may be deposited on the entire structure including the oxide capping layer 111A and the storage node 114, and subsequently be etched back. The first source/drain layer 115 may be formed of polysilicon doped with an impurity. The first source/drain layer 115 may include polysilicon doped with an N-type impurity. The first source/drain layer 115 may include polysilicon doped with phosphorous or arsenic. The first source/drain layer 115 may be referred to as an "N-type source/drain layer".

A capping layer 116 may be formed on the exposed side of the first source/drain layer 115. The capping layer 116 may serve to protect the first source/drain layer 115. The capping layer 116 may include a dielectric material. The capping layer 116 may be formed, for example, of silicon oxide. A plurality of capping layer 116 may cover the respective first source/drain layers 115. To form the capping layer 116, a capping material may be deposited on the entire structure including the first source/drain layer 115, and subsequently be etched back. Accordingly, the plurality of capping layers 116 may be formed in the respective horizontal recesses 107 while covering the respective first source/drain layers 115.

As the capping layer 116 is formed, the horizontal recess 107 may be filled without empty space. The horizontal recess 107 may be filled with the cell isolation ring 108, the first oxide liner 110, the silicon liner 111, the oxide capping layer 111A, the plate node 112, the dielectric layer 113, the storage node 114, the first source/drain layer 115 and the capping layer 116.

Figure 13:
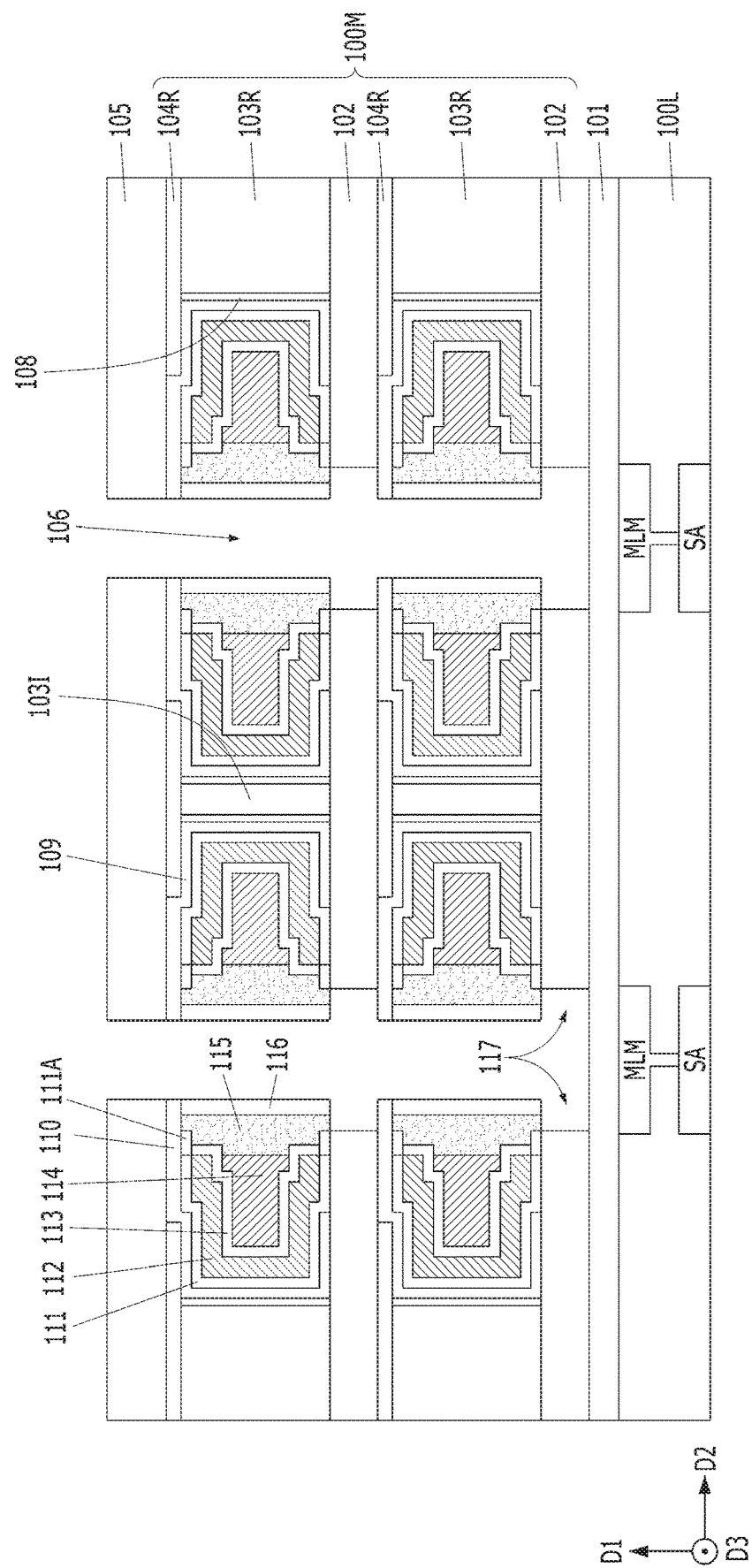

As illustrated in FIG. 13, the first material 102 may be selectively recessed through the openings 106. Accordingly, a plurality of narrow recesses 117 may be formed. To form the narrow recesses 117, a part of the first material 102 may be removed by a wet etch process. For example, when the first material 102 is silicon nitride, a phosphoric acid solution may be used.

While the narrow recesses 117 are formed, a part of the first source/drain layer 115 may be exposed. For example, the bottom surface of the first source/drain layers 115 not covered by the oxide capping layers 111A may be exposed by the narrow recesses 117.

Figure 14:
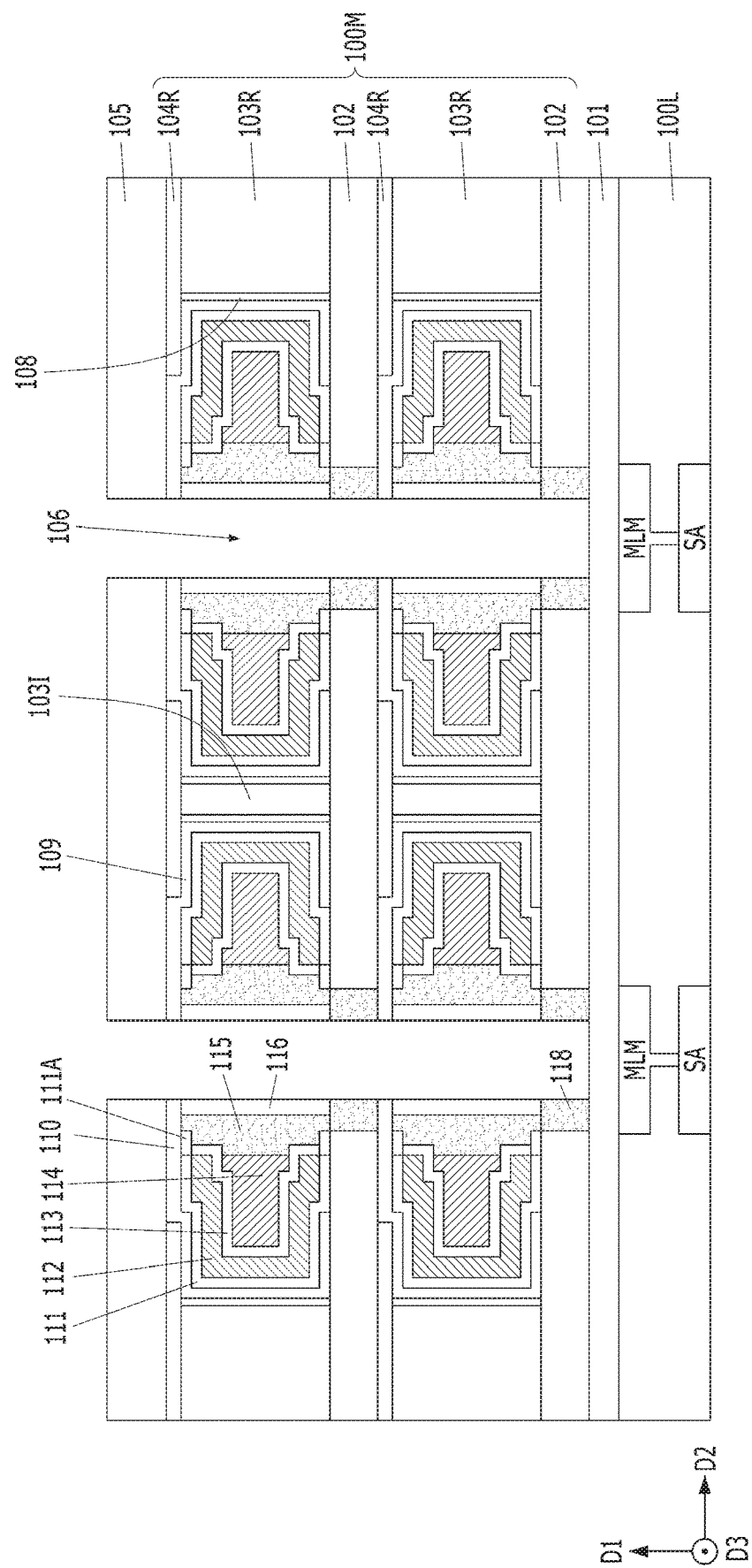

As illustrated in FIG. 14, a channel layer 118 may be formed to fill each of the narrow recesses 117. The channel layer 118 may include polysilicon. The channel layer 118 may be formed of polysilicon doped with an impurity. The channel layer 118 may be coupled to the first source/drain layer 115. The channel layer 118 may be in direct contact with the first source/drain layer 115. The channel layer 118 may be formed of polysilicon doped with a P-type impurity.

Figure 15:
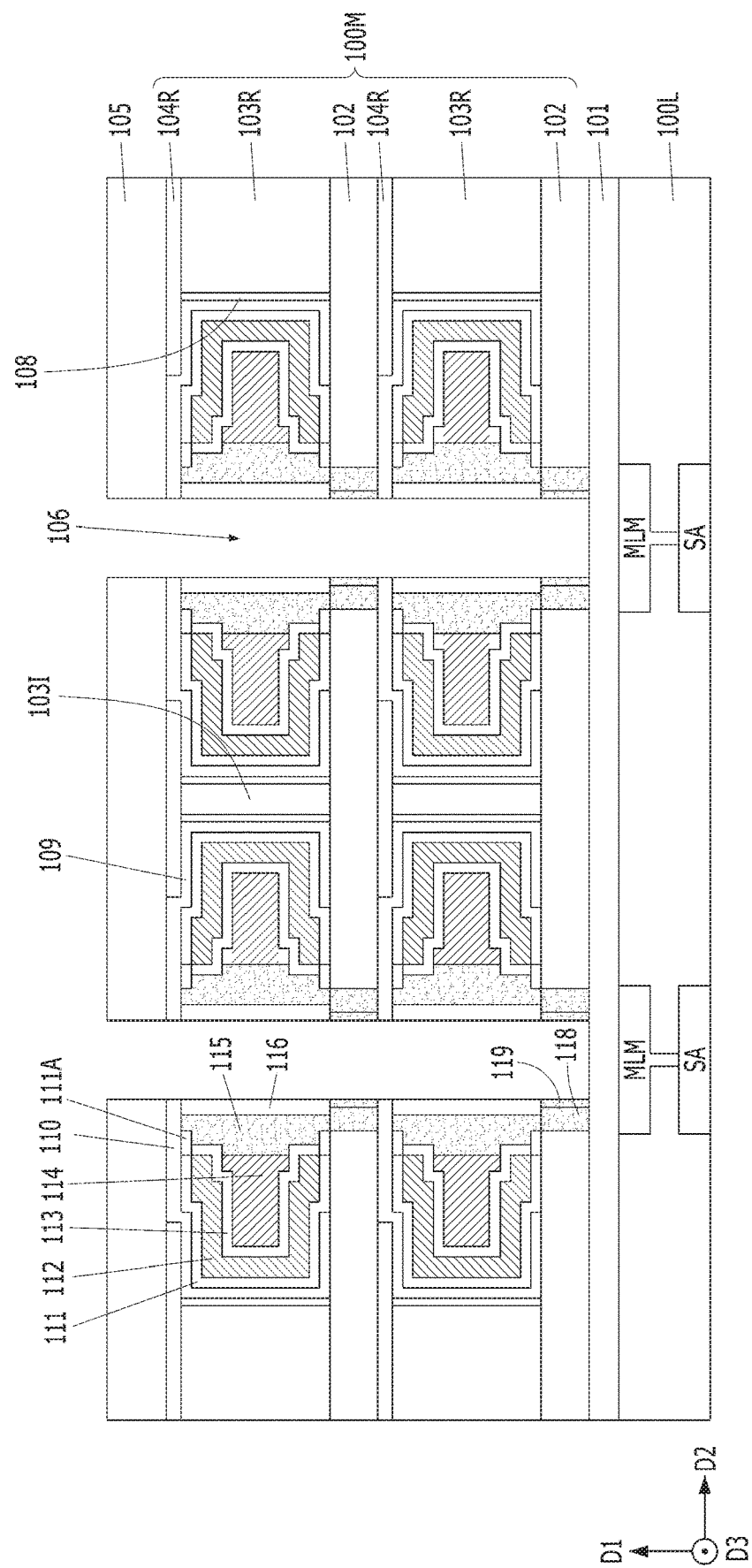

As illustrated in FIG. 15, a second source/drain layer 119 may be formed on first side of the channel layer 118. To form the second source/drain layer 119, first side of the channel layer 118 may be doped with an impurity. Tilt implantation or plasma doping may be performed to form the second source/drain layer 119. In some embodiments, first side of the channel layer 118 may be recessed, and then a doped material may be deposited thereon, and subsequently be etched back. The second source/drain layer 119 may be formed of polysilicon doped with an impurity. The second source/drain layer 119 may include polysilicon doped with an N-type impurity. The second source/drain layer 119 may include polysilicon doped with phosphorus or arsenic. The second source/drain layer 119 may be referred to as an "N-type source/drain layer". In some embodiments, the second source/drain layer 119 may be formed by epitaxial growth.

Figure 16:
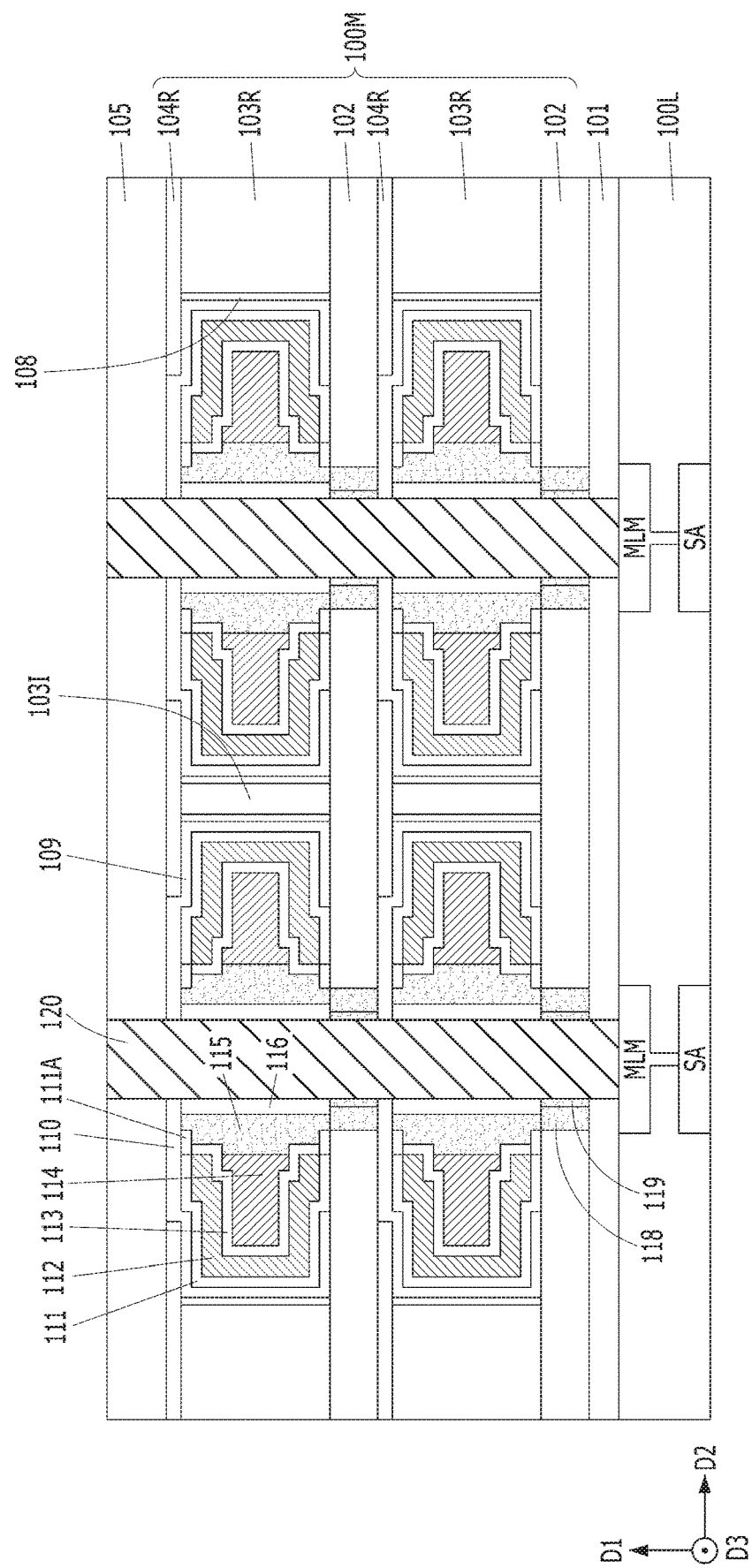

As illustrated in FIG. 16, the etch stop layer 101 under the opening 106 may be etched. As a result, the multi-level metal wiring MLM may be exposed.

Subsequently, the bit line 120 may be formed to fill the opening 106. The bit line 120 may extend vertically from the peripheral circuit portion 100L. The bit line 120 may be coupled to a plurality of second source/drain layers 119. The bit line 120 may be in direct contact with the plurality of second source/drain layers 119. Alternatively, although not illustrated, an ohmic contact layer may be formed on the surface of the second source/drain layer 119 before the bit line 120 is formed. The ohmic contact layer may include a metal silicide layer.

The bit line 120 may have a pillar-shaped structure, and the plate node 112, the dielectric layer 113 and the storage node 114 may have annular shapes surrounding the bit line 120. As such, the bit line 120 may vertically penetrate the annular capacitors.

The bit line 120 may be formed of a metal or metal-based material. For example, the bit line 120 may include tungsten. For example, a tungsten layer may be deposited to fill the opening 106 to form the bit line 120, and then planarized to expose the top surface of the hard mask layer 105.

The bottom surface of the bit line 120 may be coupled to the mufti-level metal wiring MLM of the peripheral circuit portion 100L. The bottom surface of the bit line 120 may be in direct contact with the multi-level metal wiring MLM of the peripheral circuit portion 100L. As a result, the bit line 120 may be electrically coupled to the sense amplifier SA.

Figure 17:
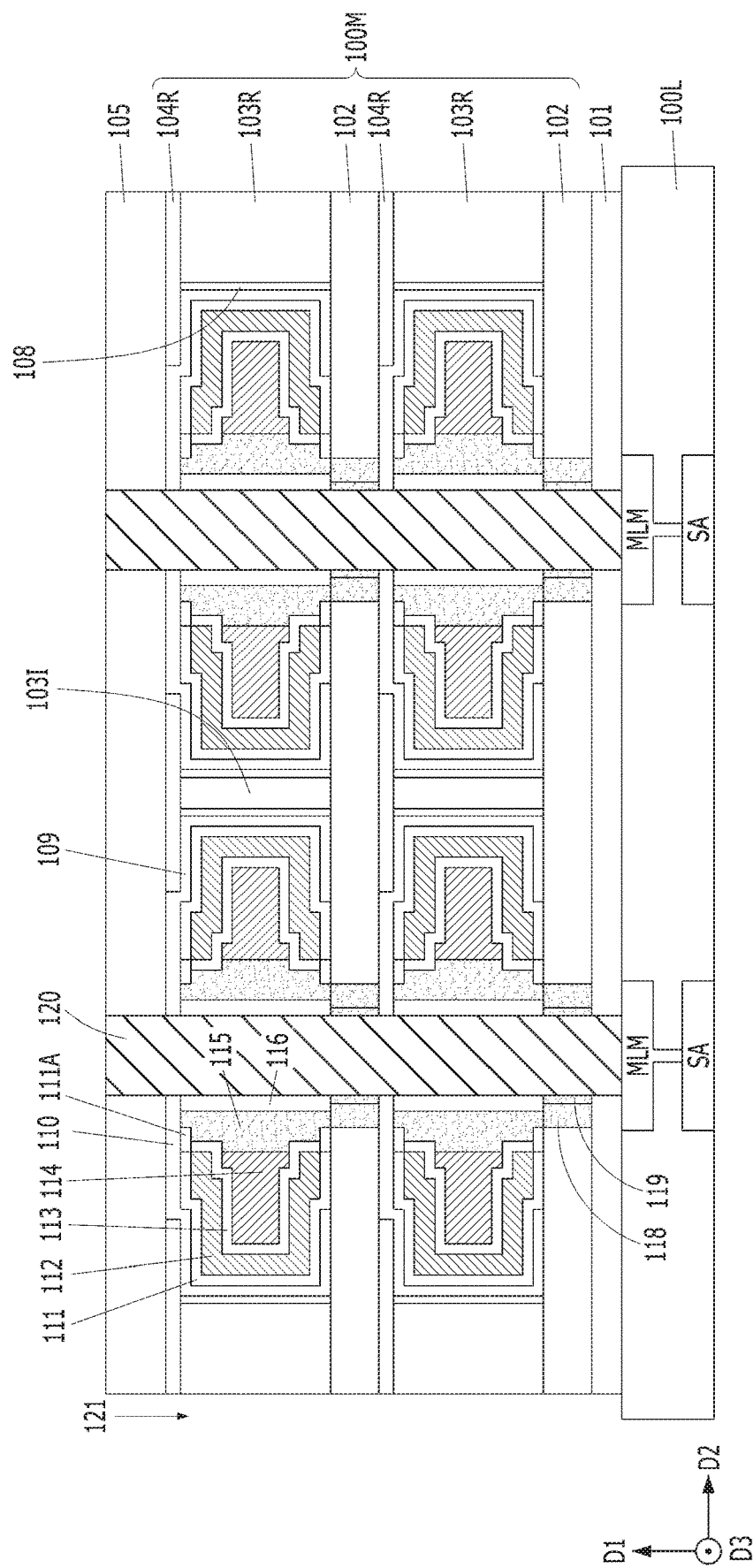

As illustrated in FIG. 17, a plurality of vertical openings 121 may be formed. The vertical openings 121 may be formed by etching parts of the hard mask layer 105, the multilayer stack 100M and the etch stop layer 101. From a top view, the vertical openings 121 may have line shapes extended in one direction, e.g., in the third direction D3.

Figure 18:
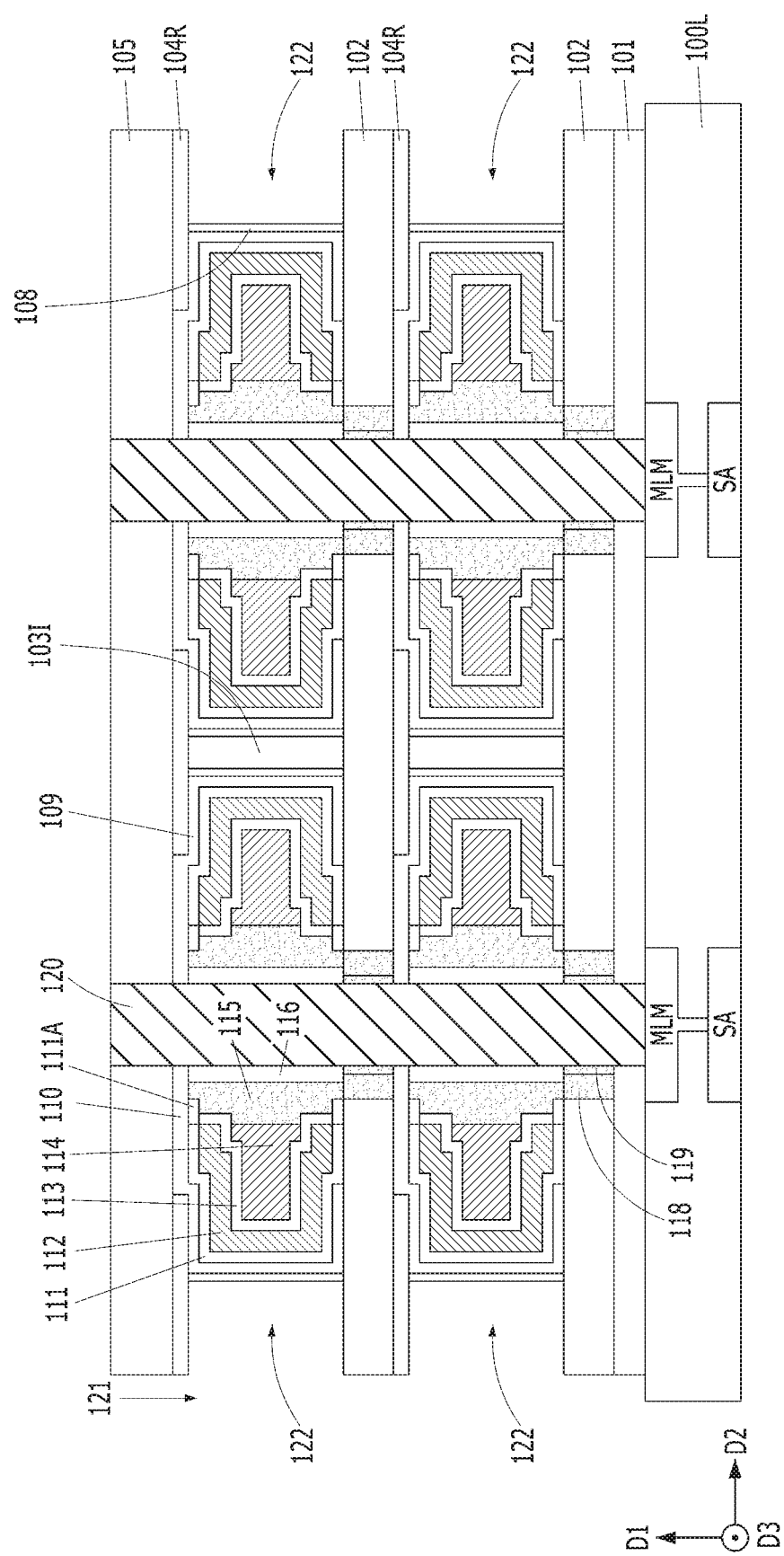

As illustrated in FIG. 18, the cell isolation layer 103R may be recessed through the vertical openings 121. Accordingly, a wide recess 122 may be formed. The cell isolation ring 108 may be partially exposed by the wide recess 122. The wide recess 122, which is a space where a subsequent plate line is filled, may be referred to as a "plate recess".

Figure 19:
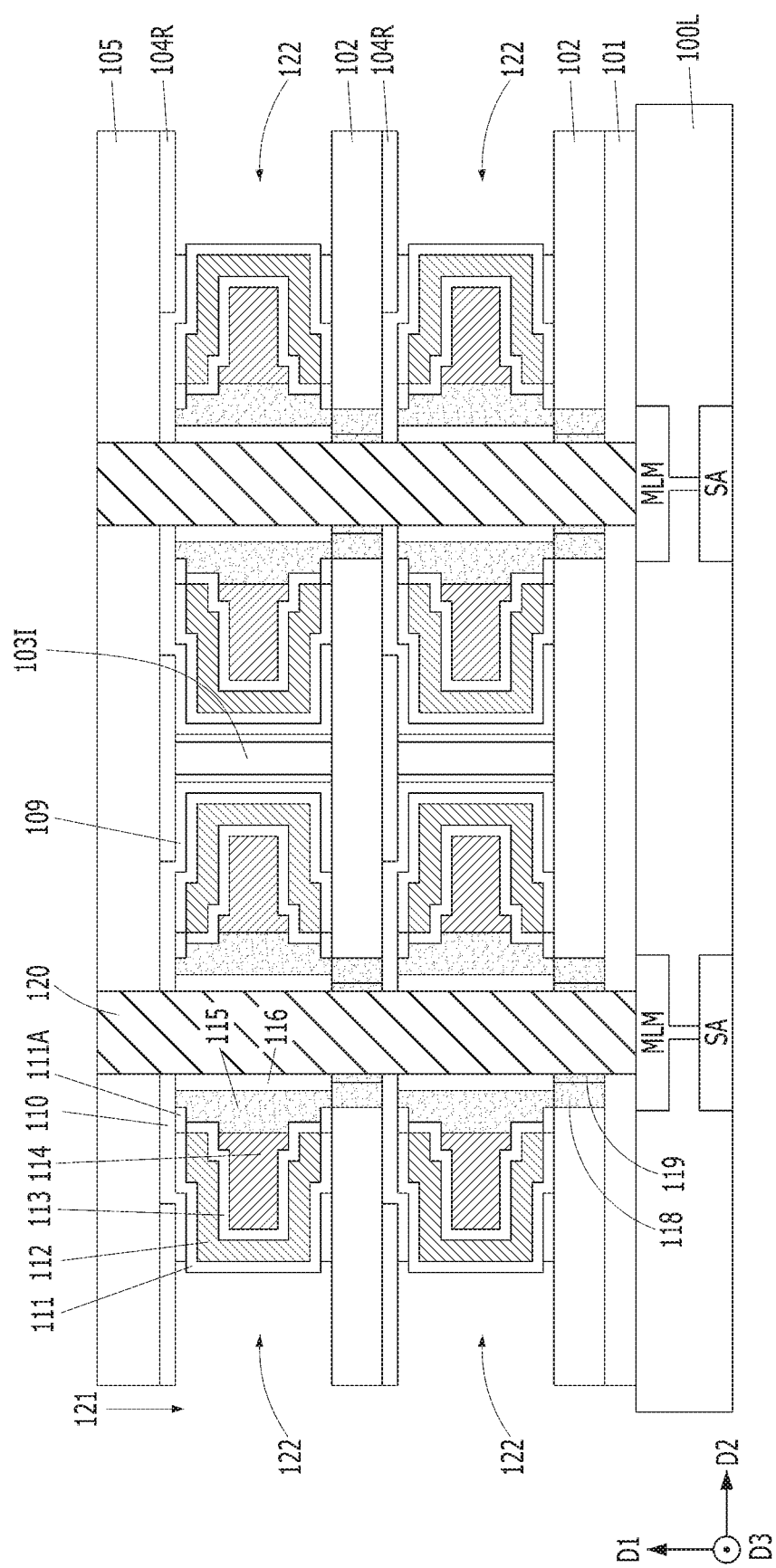

As illustrated in FIG. 19, a part of the cell isolation ring 108 may be removed by an etch-back process. When a part of the cell isolation ring 108 is removed, a part of the first oxide liner 110 may be exposed in the wide recess 122.

Subsequently, the first oxide liner 110 may be recessed. Accordingly, a part of the silicon liner 111 may be exposed in the wide recess 122.

Figure 20:
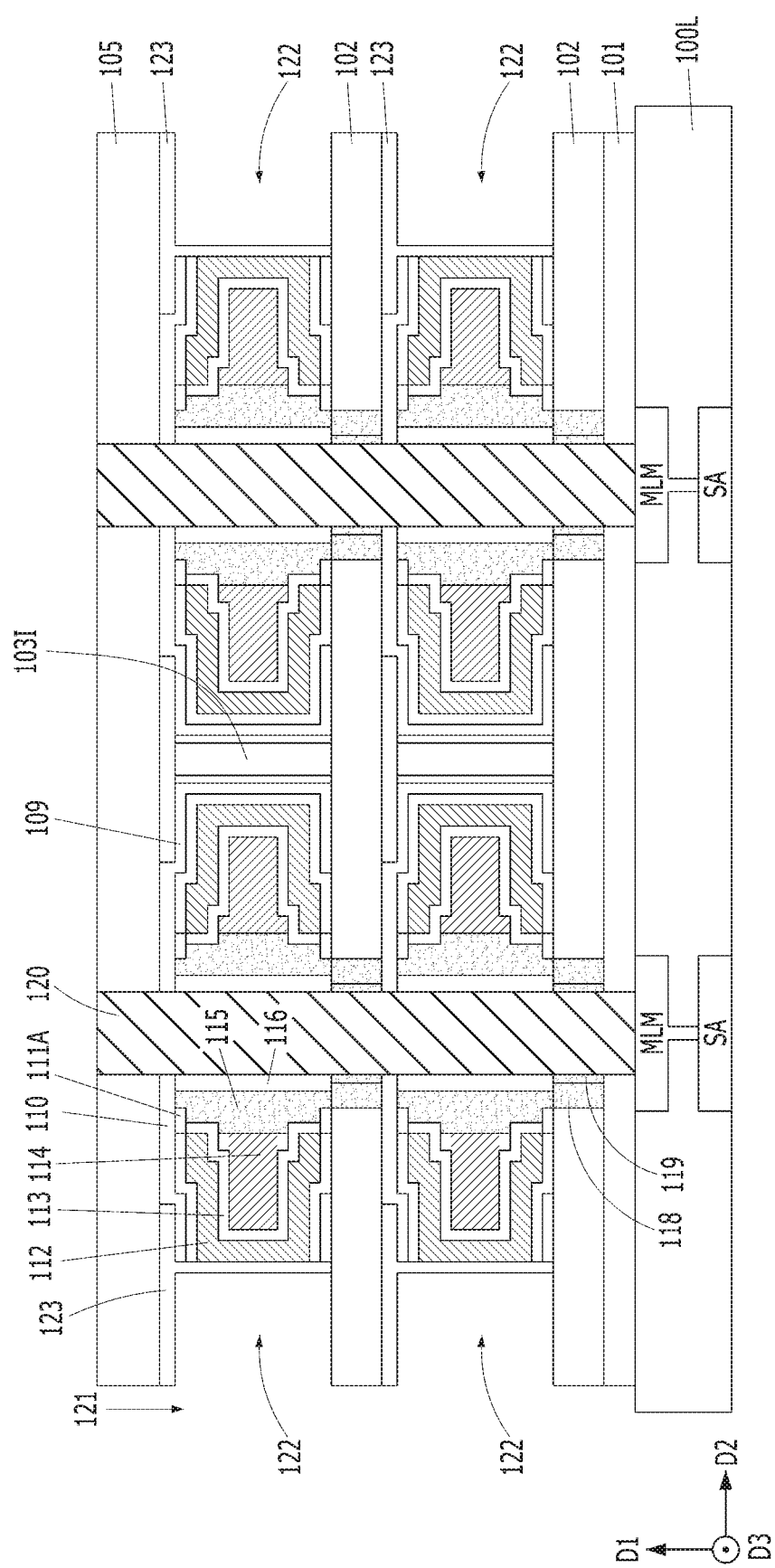

As illustrated in FIG. 20, the silicon liner 111 and a remaining third material 104R may be partially oxidized. Accordingly, a second oxide liner 123 may be formed. The second oxide liner 123 may contact the first oxide liner 110, and cover a part of the plate node 112.

Figure 21:
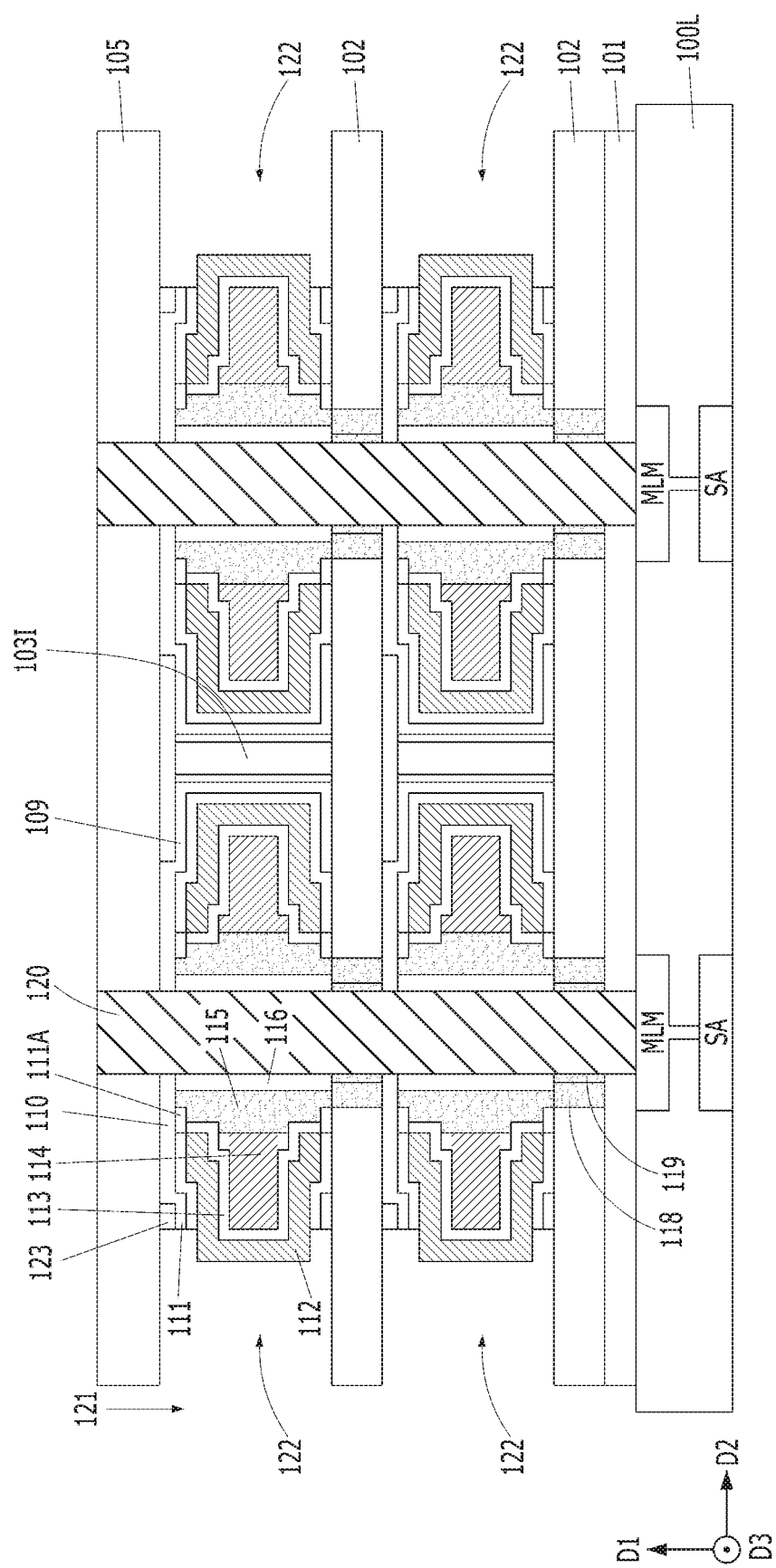

As illustrated in FIG. 21, the second oxide liner 123 may be recessed. Accordingly, a part of the plate node 112 may be exposed. As the second oxide liner 123 is recessed, parts of the silicon liner 111 and the first oxide liner 110 may also be exposed.

Figure 22:
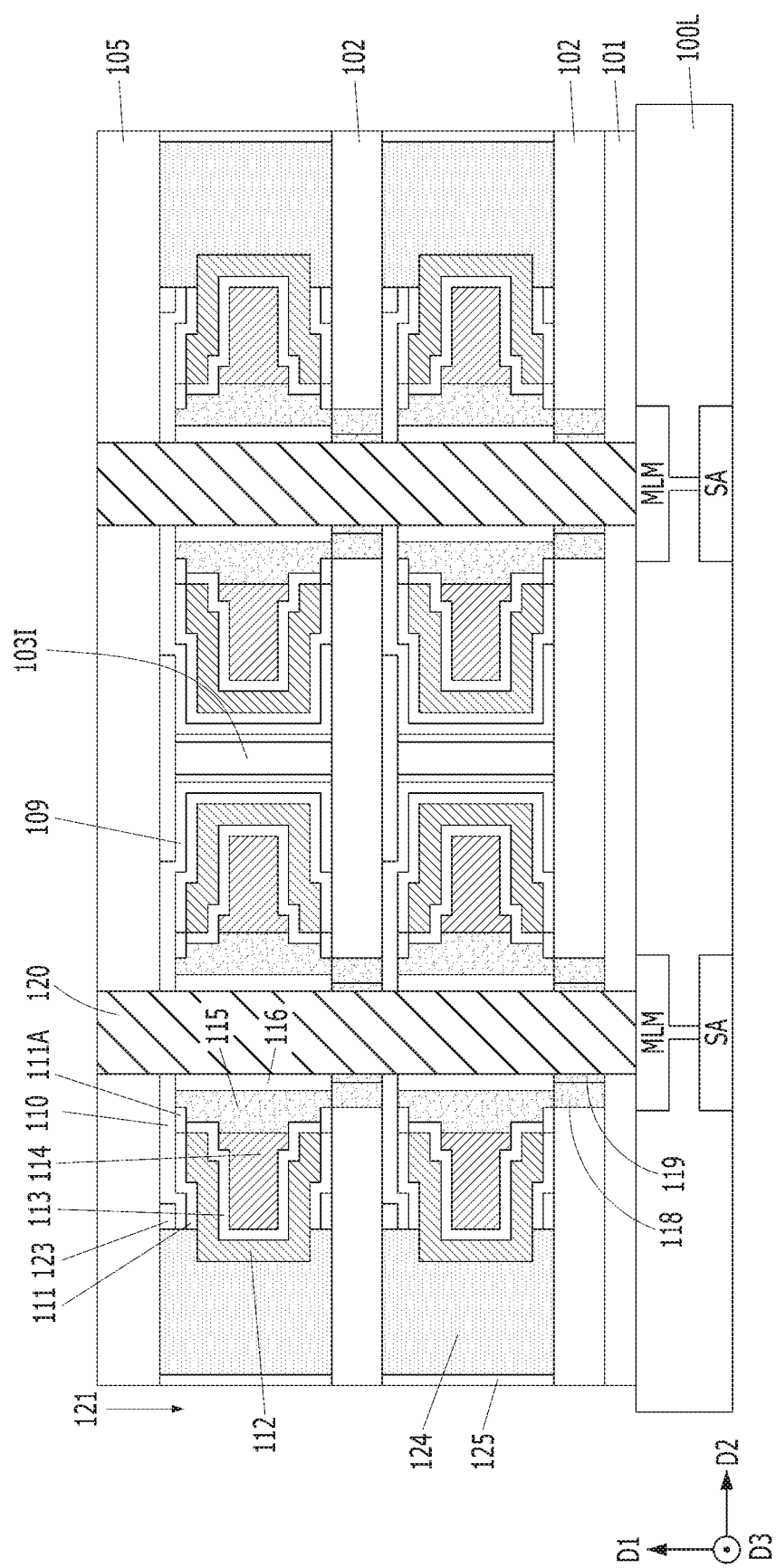

As illustrated in FIG. 22, a silicon line 124 may be formed. The silicon line 124 may be electrically coupled to the plate node 112 and the silicon liner 111. The silicon line 124 may fill the wide recess 122. The silicon line 124 may be formed of polysilicon doped with an impurity.

A sacrificial oxide 125 may be formed on the sidewall of the silicon line 124. The sacrificial oxide 125 may be formed by selectively oxidizing the sidewall of the silicon line 124.

As described above, the wide recess 122 may be filled with the silicon line 124 and the sacrificial oxide 125.

Figure 23:
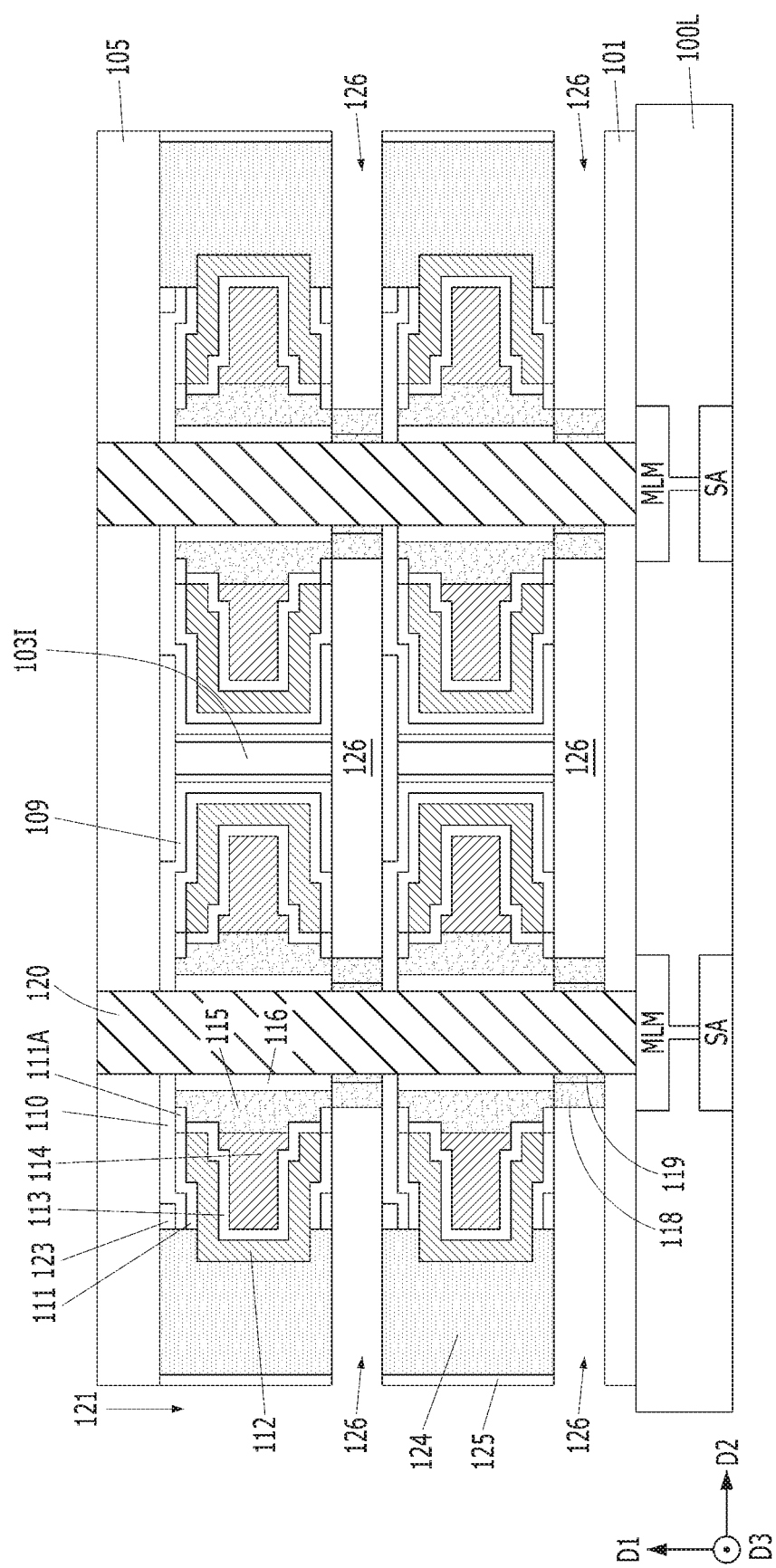

As illustrated in FIG. 23, the first material 102 may be completely removed. Accordingly, a gate recess 126 may be formed. The gate recess 126 may be located between the silicon lines 124 which are vertically adjacent to each other. One end of the gate recess 126 may expose first side of the channel layer 118. The gate recess 126 may extend in a direction parallel to the surface of the peripheral circuit portion 100L. From a top view, the gate recess 126 may have a shape which surrounds the bit line 120. For example, the gate recess 126 may have a planar plate shape.

Figure 24:
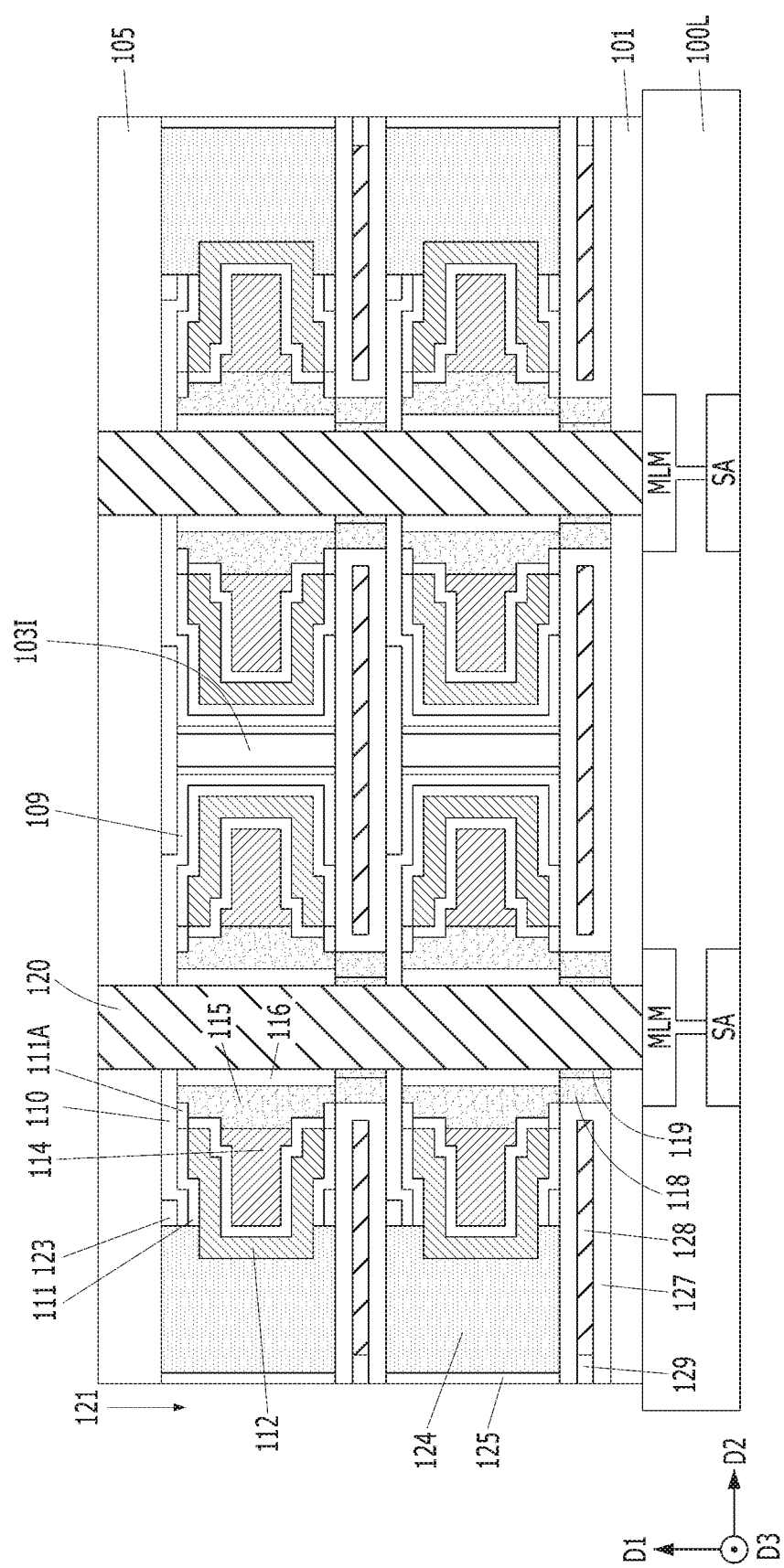

As illustrated in FIG. 24, a word line structure may be formed in the gate recess 126. The word line structure may include a gate dielectric layer 127, a word line 128 and a word line capping layer 129. The gate dielectric layer 127 may be formed, for example, of silicon oxide, silicon nitride, silicon oxynitride, a high-k material or combinations thereof. The word line 128 may include a metal or metal-based material. The word line 128 may include titanium nitride, tungsten or a stack of titanium nitride and tungsten.

For example, silicon oxide may be conformally deposited on the gate recess 126 to form the gate dielectric layer 127.

To form the word line 128, a conductive material may be deposited to fill the gate recess 126 on the gate dielectric layer 127, and then an etch-back process may be performed. An end of the word line 128 may have a recessed shape resulting from the etch-back process. The word line 128 may include a stack of a barrier material and a low-resistance metal. The word line 128 may include a stack of titanium nitride and tungsten.

The word line capping layer 129 may be formed to cap the end of the word line 128. The word line capping layer 129 may be formed, for example, of silicon oxide. To form the word line capping layer 129, deposition and etch-back processes of silicon oxide may be performed.

As such, the word line 128 may be located above the capacitors, and the word lines 128 and the capacitors may be alternately stacked at right angles. The word line 128 may have a planar plate shape. The bit line 120 may have a shape of penetrating the word line 128.

Figure 25:
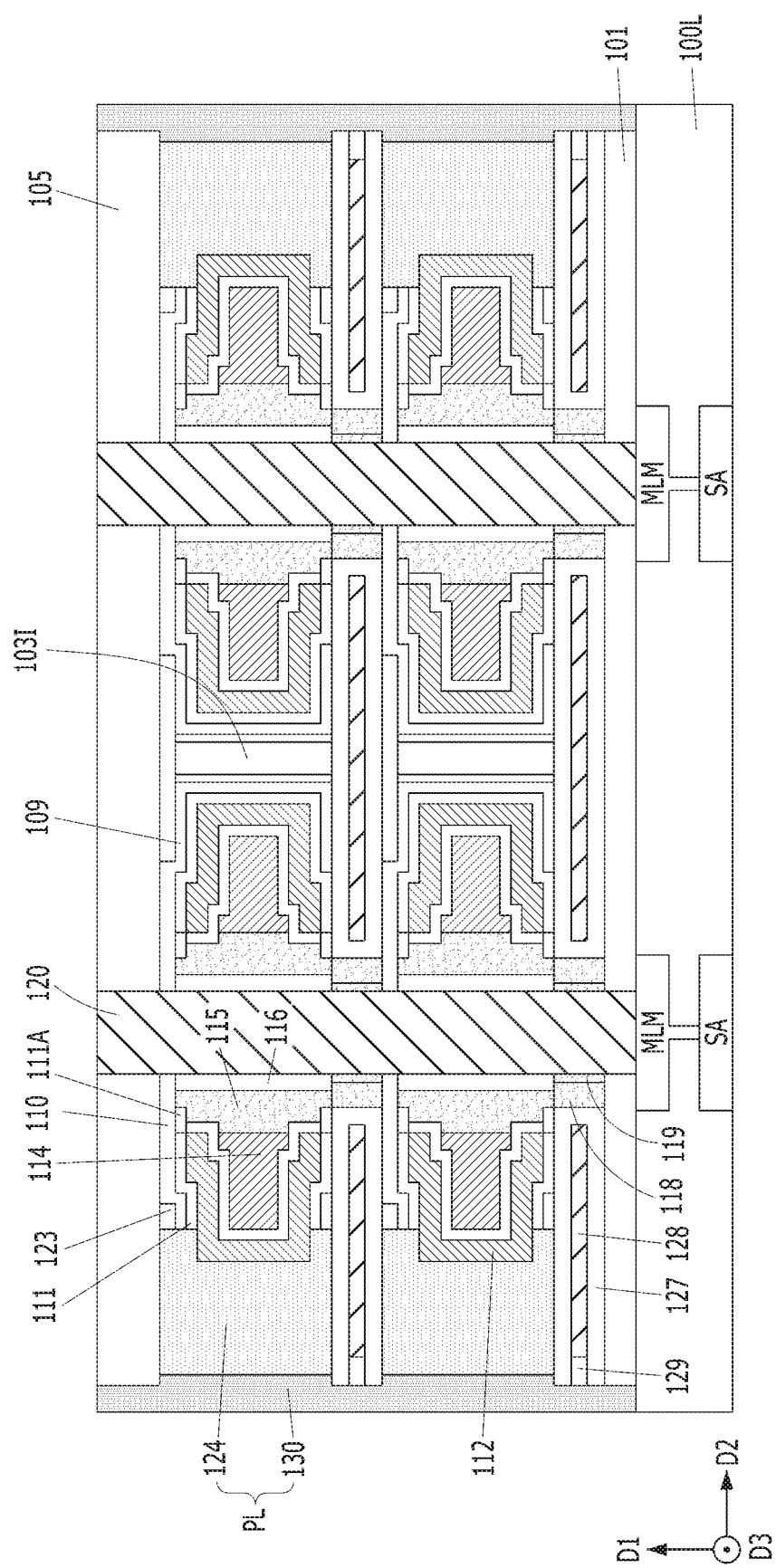

As illustrated in FIG. 25, the sacrificial oxide 125 may be removed, and then a metal line 130 coupled to the silicon line 124 may be formed. The metal line 130 may be in direct contact with the silicon line 124. The metal line 130 may extend perpendicularly to the peripheral circuit portion 100L. The metal line 130 and the silicon line 124 may be a plate line PL. The capacitors which are vertically adjacent to each other may share a stack of the metal line 130 and the silicon line 124, that is, the plate line PL. The first oxide liner 110 may serve as a first protective layer between the word line 128 and the capacitor. The capping layer 116 may serve as a second protective layer between the bit line 120 and the capacitor.

Figure 26:
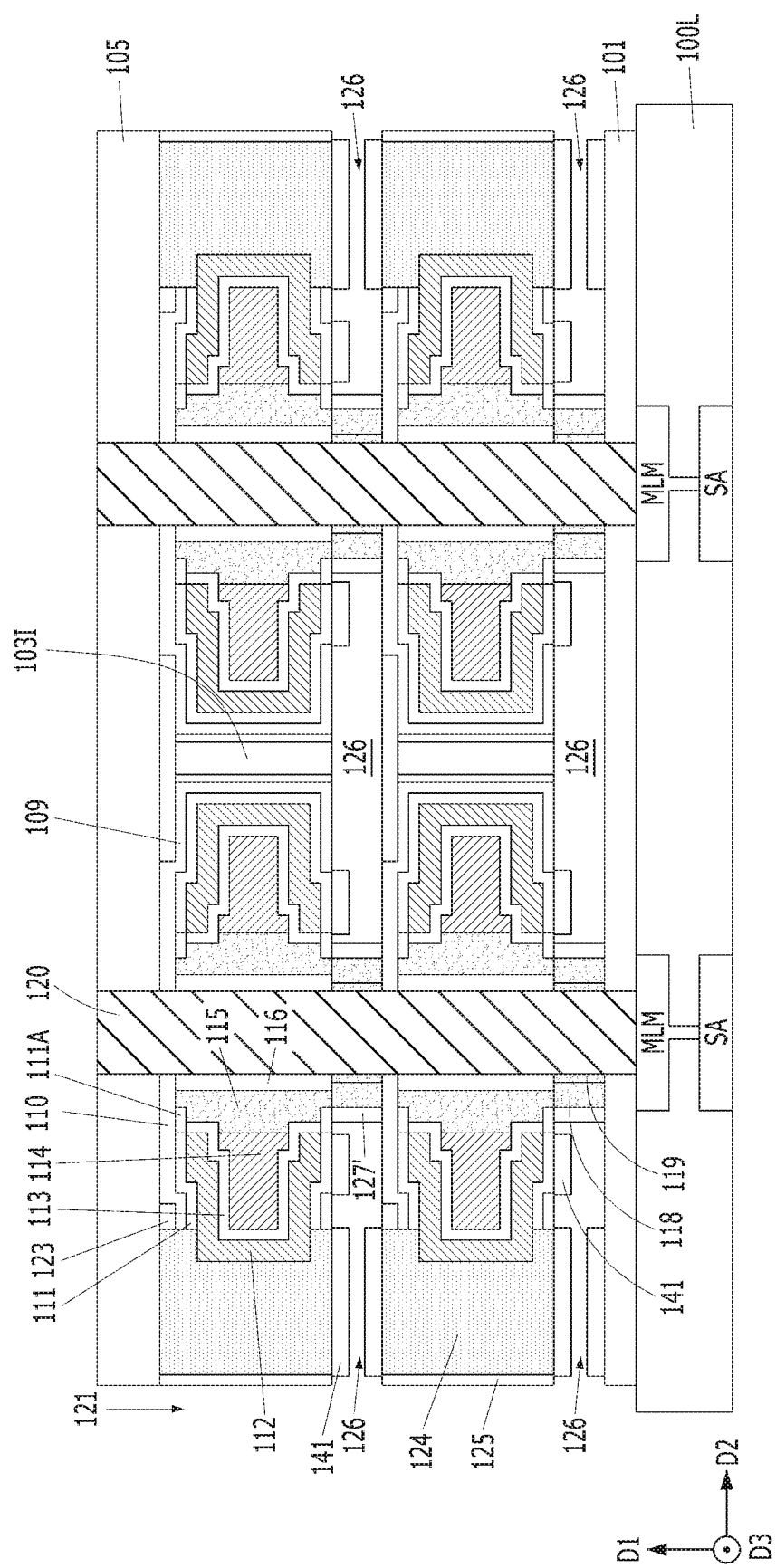
FIGS. 26 and 27 are cross-sectional views illustrating a method for fabricating a memory device in accordance with an embodiment of the present invention.
Figure 27:
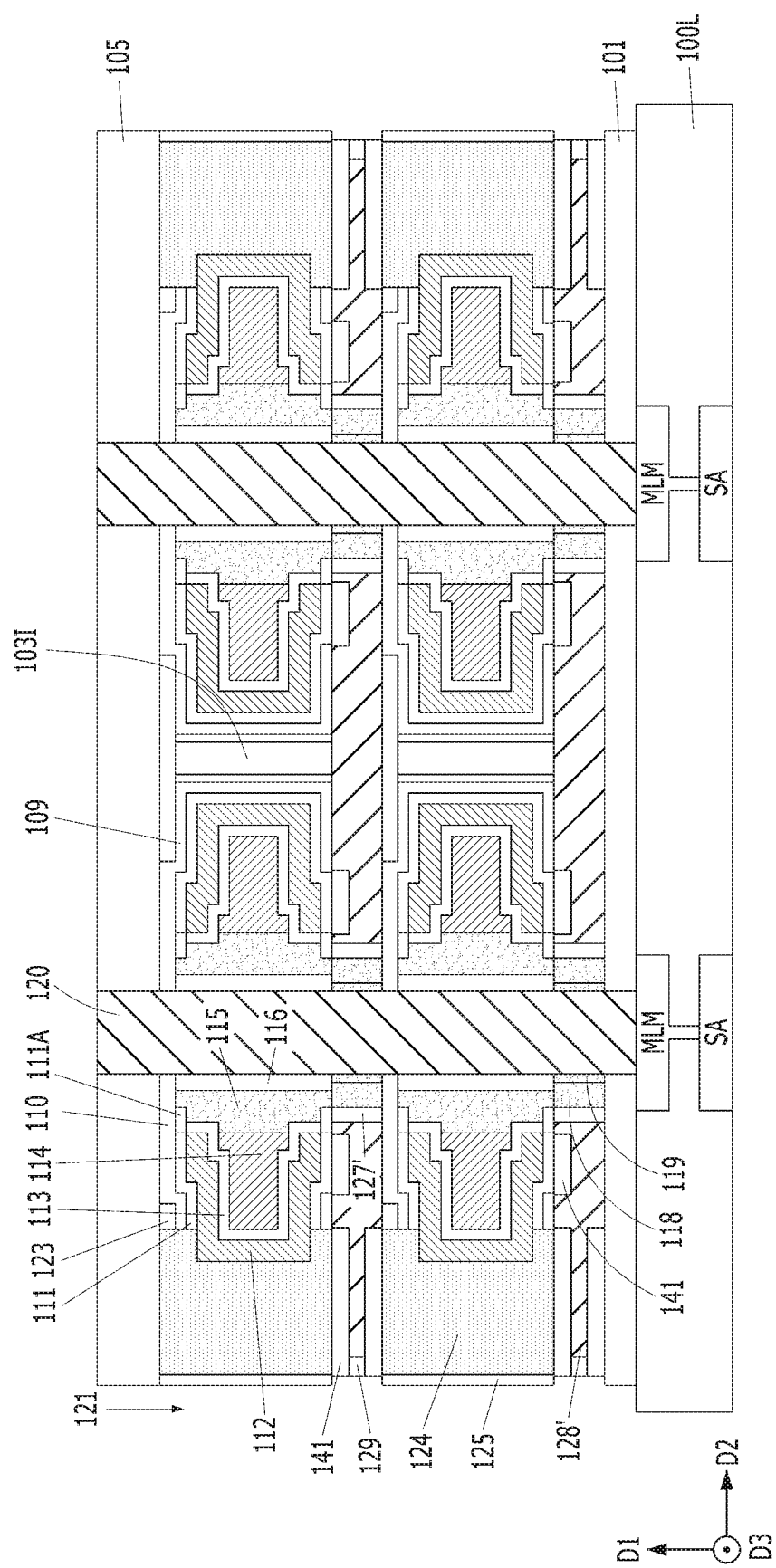

FIGS. 26 and 27 are cross-sectional views illustrating a method for fabricating a memory device in accordance with an embodiment of the present invention. The method illustrated in FIGS. 26 and 27 may be similar to that illustrated in FIGS. 3 to 25. FIGS. 26 and 27 illustrate the method for fabricating a memory device after the formation of the gate recess illustrated in FIG. 23.

As illustrated in FIG. 23, a gate recess 126 may be formed.

Subsequently, as illustrated in FIG. 26, a selective oxidation process may be performed. Accordingly, the sidewall of a channel layer 118 may be oxidized, and then a gate dielectric layer 127' may be formed. During the selective oxidation process, the exposed surfaces of a silicon line 124 and a silicon liner 111 may be selectively oxidized. In other words, selective oxides 141 may be formed on the surfaces of the silicon line 124 and the silicon liner 111. In some embodiments, the selective oxides 141 may have larger thicknesses than the gate dielectric layer 127'.

As illustrated in FIG. 27, a word line 128' may be formed. The word line 128' may fill a gate recess 126 in which the selective oxides 141 and the gate dielectric layer 127' are formed. To form the word line 128', a conductive material may be deposited to fill the gate recess 126 on the gate dielectric layer 127' and the selective oxides 141, and then an etch-back process may be performed. An end of the word line 128' may have a recessed shape by the etch-back process. The word is line 128' may include a stack of a barrier material and a low-resistance metal. For example, the word line 128' may include a stack of titanium nitride and tungsten.

A word line capping layer 129 may be formed to cap the end of the word line 128'. The word line capping layer 129 may be formed, for example, of silicon oxide. To form the word line capping layer 129, deposition and etch-back processes of silicon oxide may be performed. The word line 128' may be formed to have a non-conformal shape.

As such, the word lines 128" and the capacitors may be alternately stacked at right angles. The selective oxides 141 may prevent a bridge between the word line 128' and the silicon line 124 and a bridge between the word line 128' and the silicon liner 111.

Subsequently, as illustrated in FIG. 25, a sacrificial oxide 125 may be removed, and then a metal line 130 may be formed.

Figure 28:
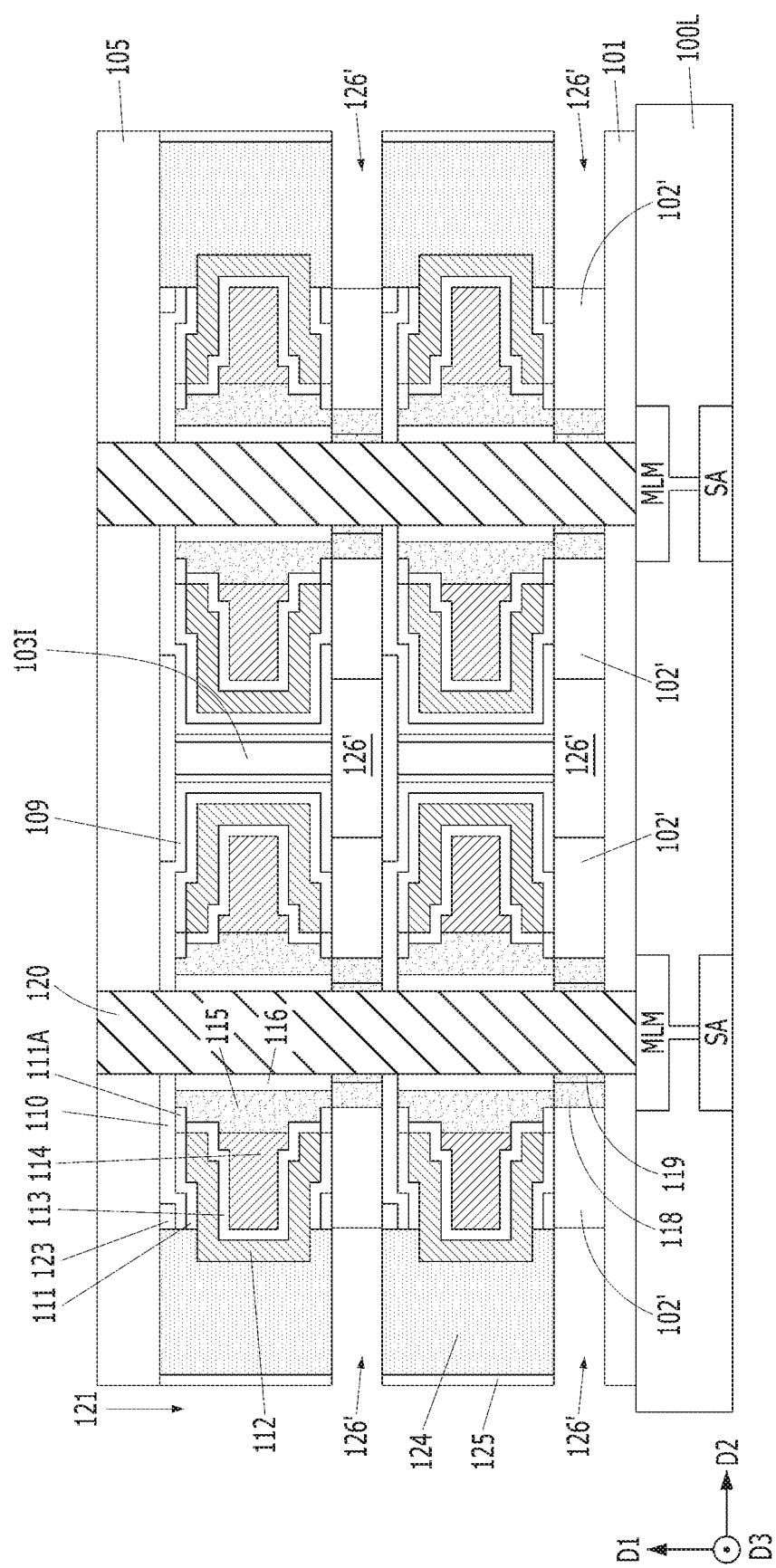
FIGS. 28 to 30 are cross-sectional views illustrating a method for fabricating a memory device in accordance with an embodiment of the present invention.
Figure 29:
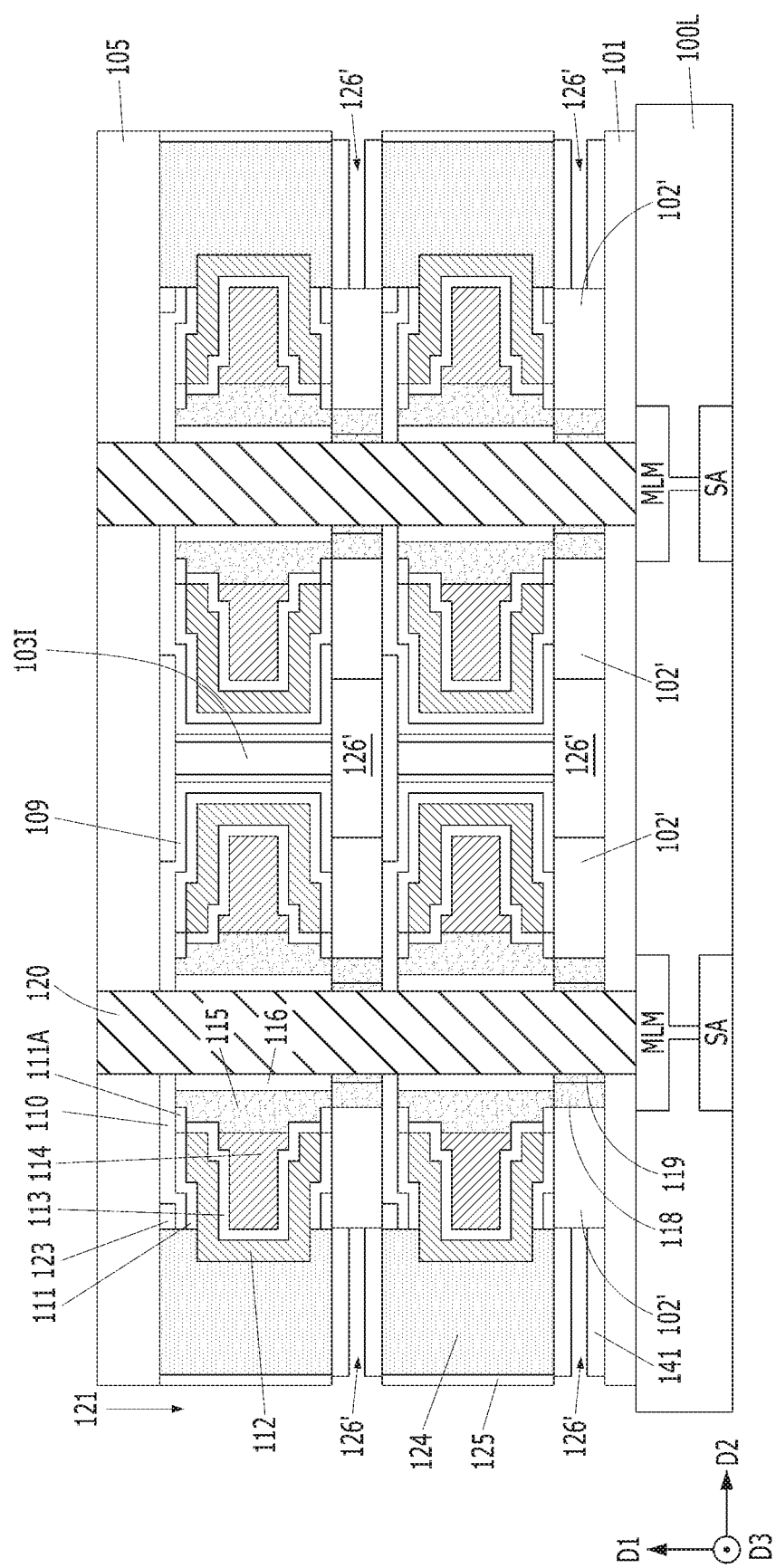
Figure 30:
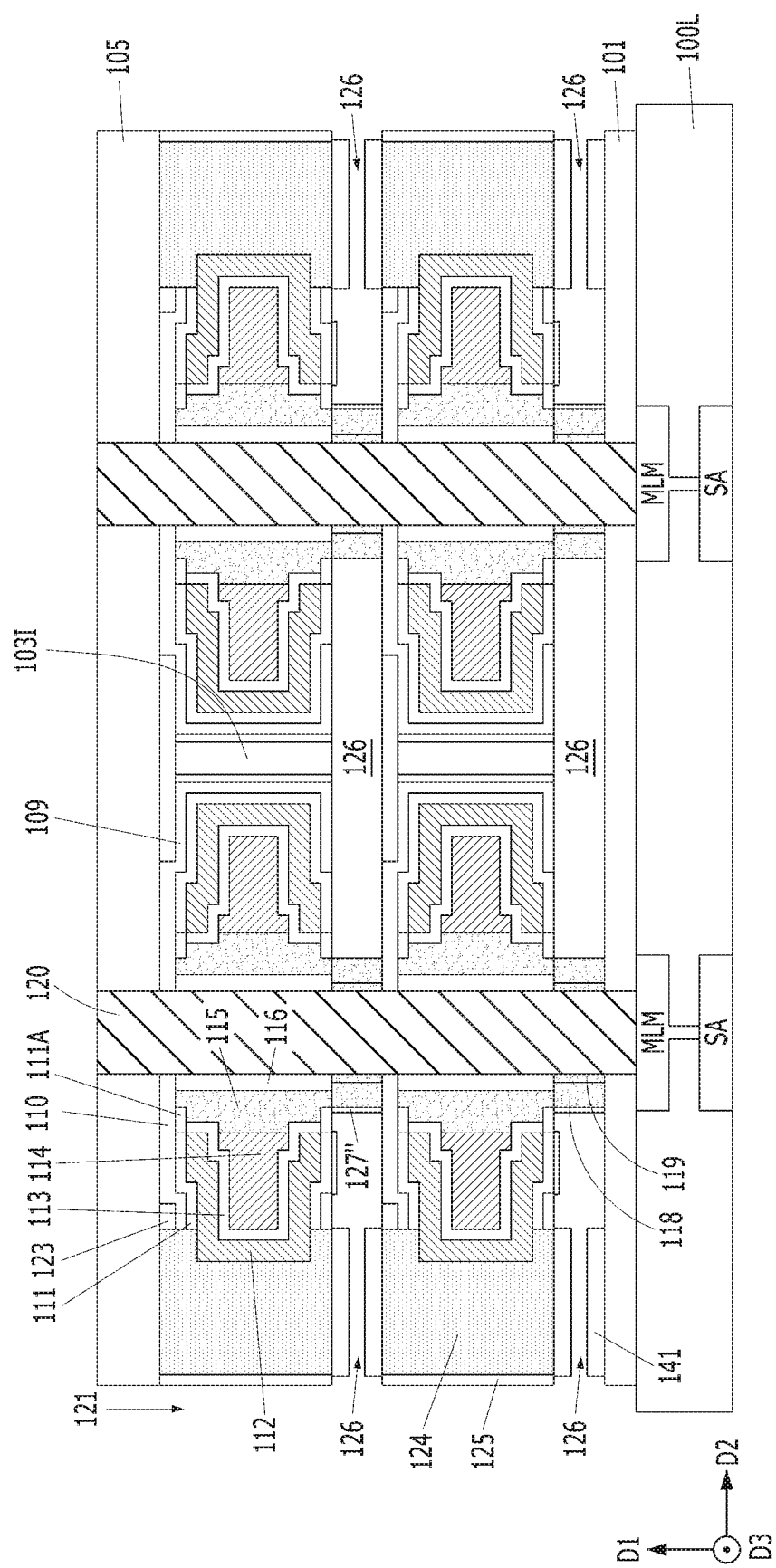

FIGS. 28 to 30 are cross-sectional views illustrating a method for fabricating a memory device in accordance with an embodiment of the present invention. The method illustrated in FIGS. 28 to 30 may be similar to that illustrated in FIGS. 3 to 25. FIGS. 28 to 30 illustrate a method for fabricating a memory device in accordance with another embodiment after the formation of the bit line.

As illustrated in FIG. 28, a first material 102 may be partially recessed. Accordingly, a partial gate recess 126' may be formed. The partial gate recess 126' may be formed to expose a silicon line 124. A silicon liner 111 and a channel layer 118 may not be exposed and may be covered by a remaining first material 102'.

As illustrated in FIG. 29, a selective oxidation process may be performed. Thus, the exposed surface of the silicon line 124 may be selectively oxidized. Selective oxides 141 may be formed on the silicon line 124.

As illustrated in FIG. 30, the remaining first material 102' may be all removed. As a result, the partial gate recess 126' may be extended to form a gate recess 126. When the remaining first material 102' is removed, the selective oxides 141 may remain without being removed.

Subsequently, a gate dielectric layer 127" may be formed on the sidewall of the channel layer 118. A selective oxidation process or a deposition process may be performed to form the gate dielectric layer 127". When the selective oxidation process is performed, the surface of the silicon liner 111 may be oxidized. The gate dielectric layer 127" may have a smaller thickness than the selective oxides 141. In some embodiments, the gate dielectric layer 127" and the selection oxides 141 may have the same thickness.

Subsequently, as illustrated in FIG. 27, a word line 128' may be formed.

Subsequently, as illustrated in FIG. 25, a sacrificial oxide 125 may be removed, and then a metal line 130 may be formed.

FIGS. 31 to 40 are cross-sectional views illustrating a method for fabricating a memory device in accordance with an embodiment of the present invention. The method illustrated in FIGS. 31 to 40 may be similar to that illustrated in FIGS. 3 to 25. FIGS. 31 to 40 illustrate the method for fabricating a memory device after the formation of the narrow recess illustrated in FIG. 13.

As illustrated in FIG. 13, a narrow recess 117 may be formed.

Figure 31:
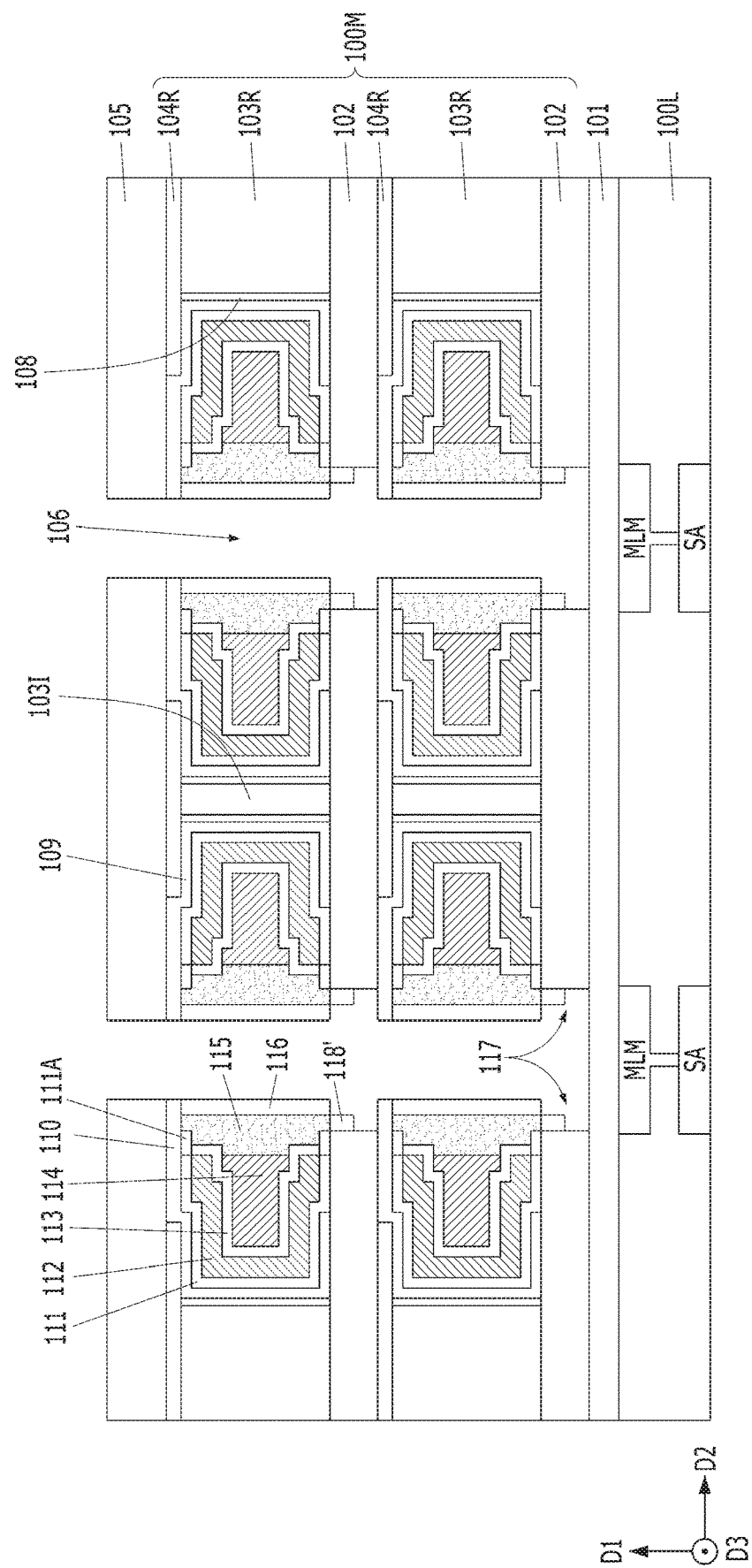
FIGS. 31 to 40 are cross-sectional views illustrating a method for fabricating a memory device in accordance with an embodiment of the present invention.

Subsequently, as illustrated in FIG. 31, a channel layer 118' may be formed to partially fill the narrow recess 117. The channel layer 118' may be formed by epitaxial growth on the surface of a first source/drain layer 115. The channel layer 118' may include an epitaxial silicon layer. An impurity may be doped in situ during the epitaxial growth of the channel layer 118'. The channel layer 118' may be doped with a P-type impurity. The channel layer 118' may be electrically coupled to the first source/drain layer 115. The channel layer 118' may be in direct contact with the first source/drain layer 115. The channel layer 118' may be referred to as a fin-type channel layer.

Figure 32:
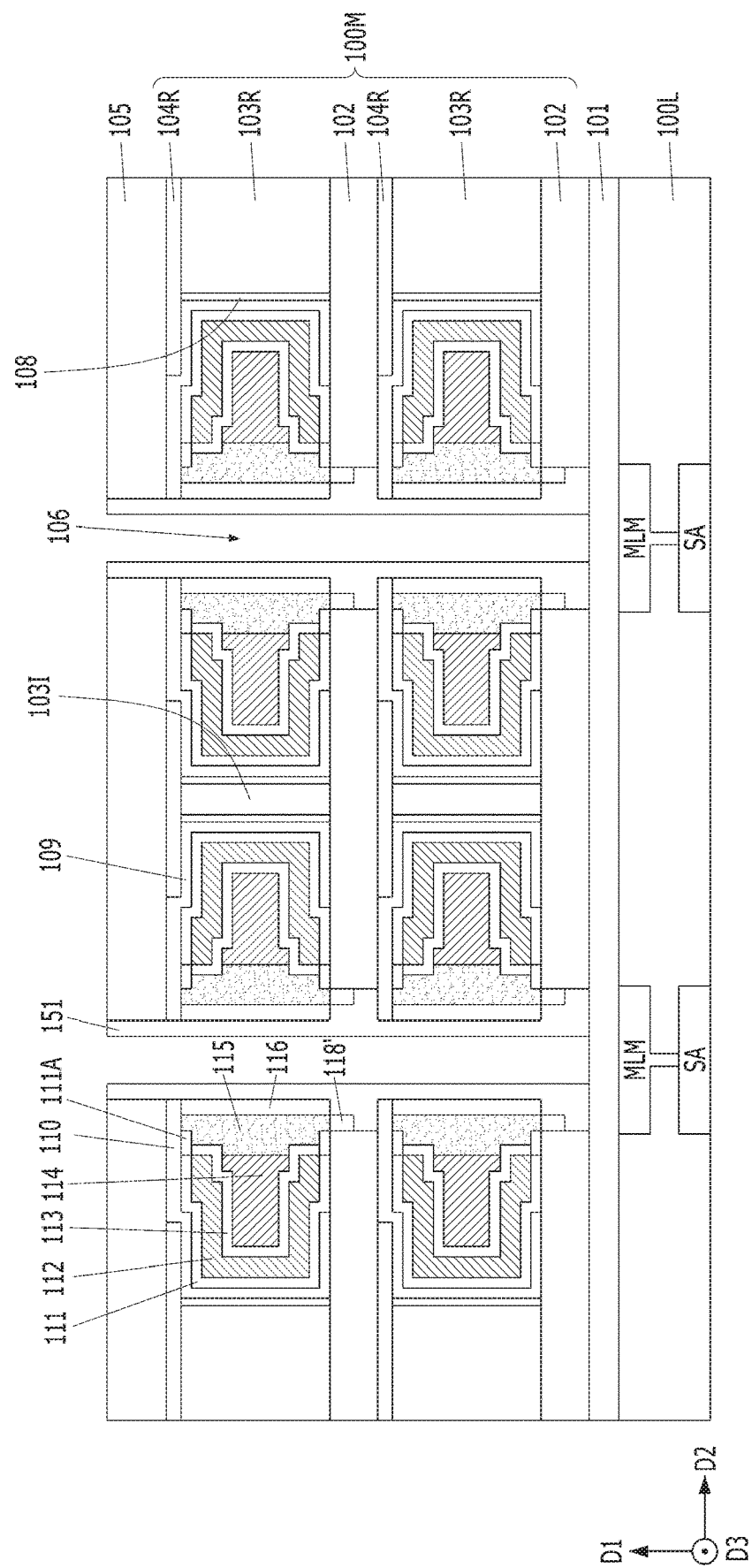

As illustrated in FIG. 32, the narrow recess 117 in which the channel layer 118' is formed may be filled with a gap-fill material 151. The gap-fill material 151 may include silicon nitride. The gap-fill material 151 may be formed to conformally cover the openings 106.

Figure 33:
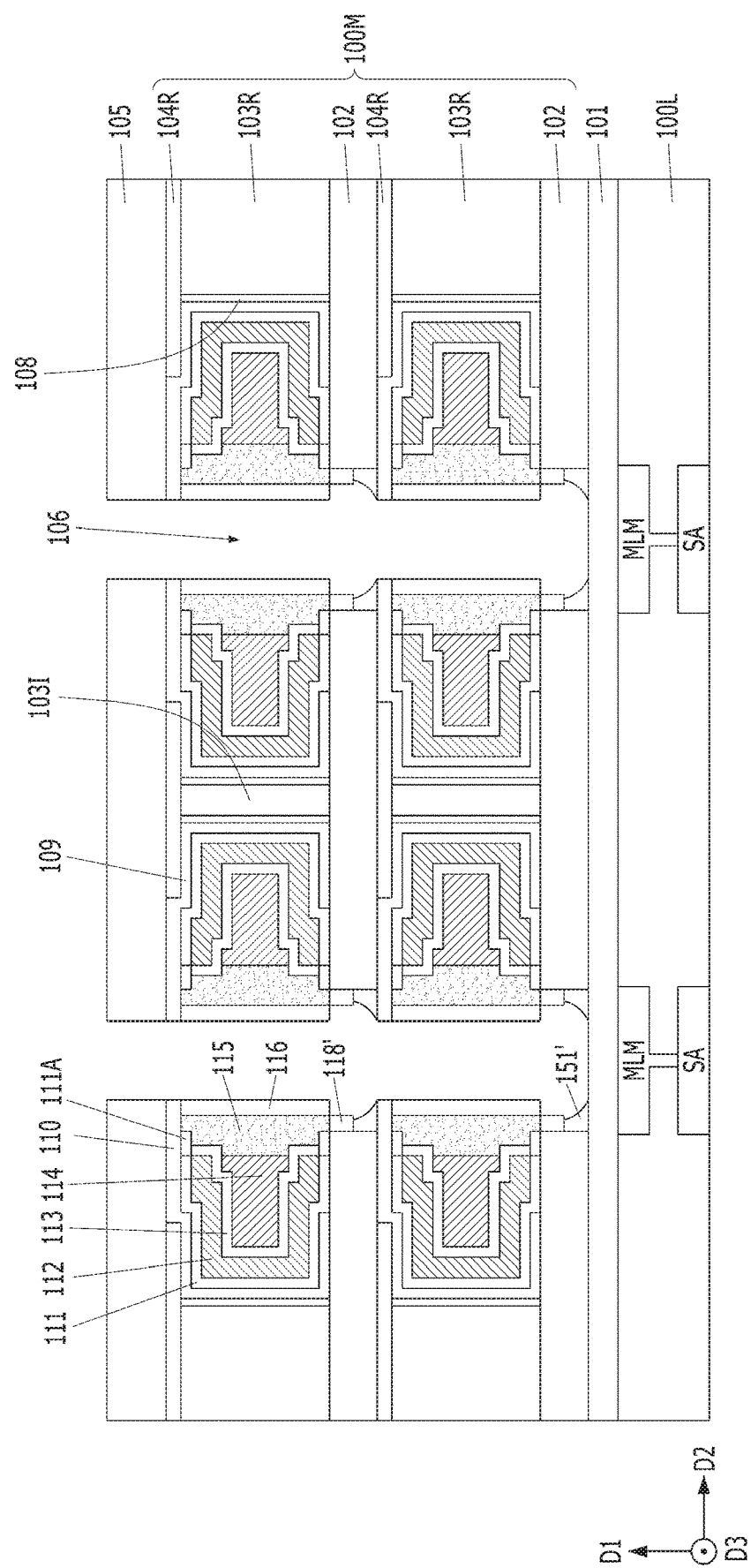

As illustrated in FIG. 33, a trimming process may be performed on the gap-fill material 151. As a result, a part of the channel layer 118' may be exposed, and a trimmed gap-fill material 151' may remain in the narrow recess 117. The trimmed gap-fill material 151' may have a curved surface towards the opening 106. The trimmed gap-fill material 151' may have a concave curved surface towards the opening 106. The end of the concave surface of the gap fill material 151' that is the furthest away from the channel layer 118' may be aligned vertically in the first direction D1 with the vertical side of the capping layer 116 which defines the opening 106. The end of the concave surface of the gap fill material 151' that is adjacent to the channel layer 118' may be slightly recessed relatively to the side surface of the channel layer 118' exposed to the opening 106. In other words, the thickness of the gap-fill material 151' in the second direction varies from its narrowest point next to the channel layer 118' to its widest point next to the etch stop layer 101. The thickness of the gap-fill material 151' in the second direction at its narrowest point next to the channel layer 118' may be less than the thickness of the channel layer 118'.

Figure 34:
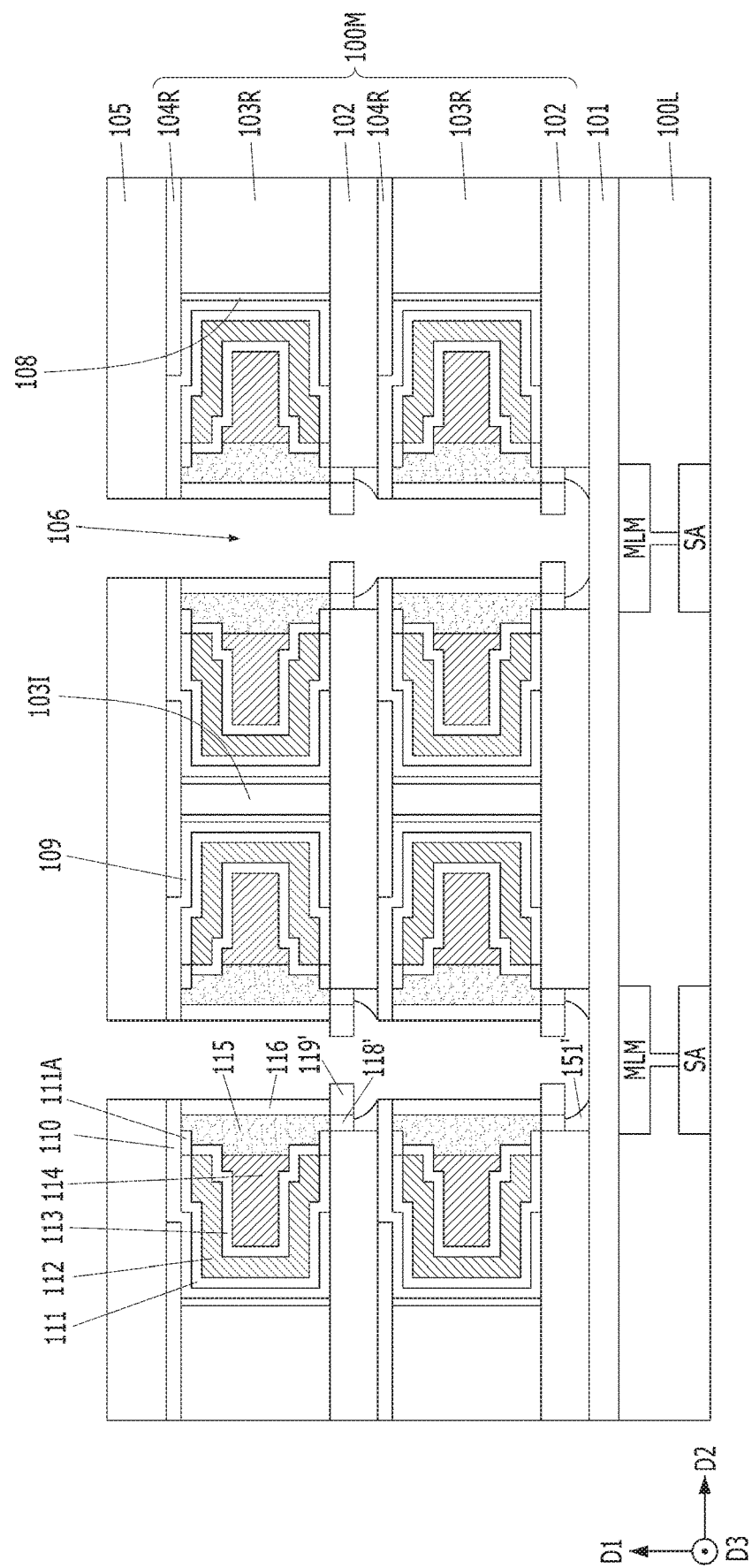

As illustrated in FIG. 34, a second source/drain layer 119' may be formed on the exposed surface of the channel layer 118'. The second source/drain layer 119' may be formed by epitaxial growth. The second source/drain layer 119' may include an epitaxial silicon layer. The second source/drain layer 119' may be doped with an N-type impurity, and the N-type impurity may be doped in situ during the epitaxial growth. The second source/drain layer 119' may be grown horizontally from the surface of the channel layer 118'. The second source/drain layer 119' may be grown with a protrusion extending inside the opening 106. The second source/drain layer 119' may be an undoped epitaxial silicon layer that is not doped with an impurity.

Figure 35:
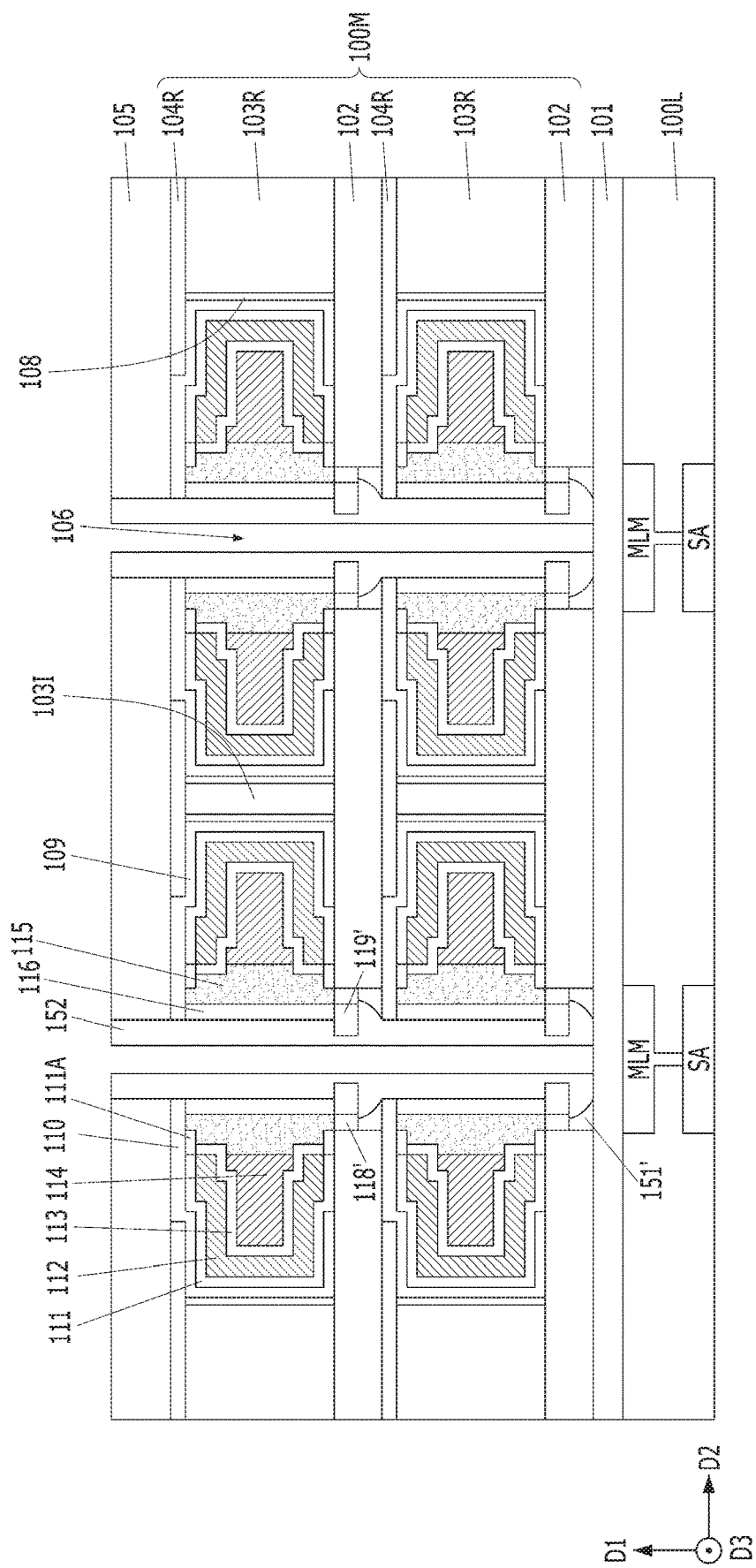

As illustrated in FIG. 35, an additional capping layer 152 may be formed inside the opening 106 to cover the second source/drain layer 119'.

Figure 36:
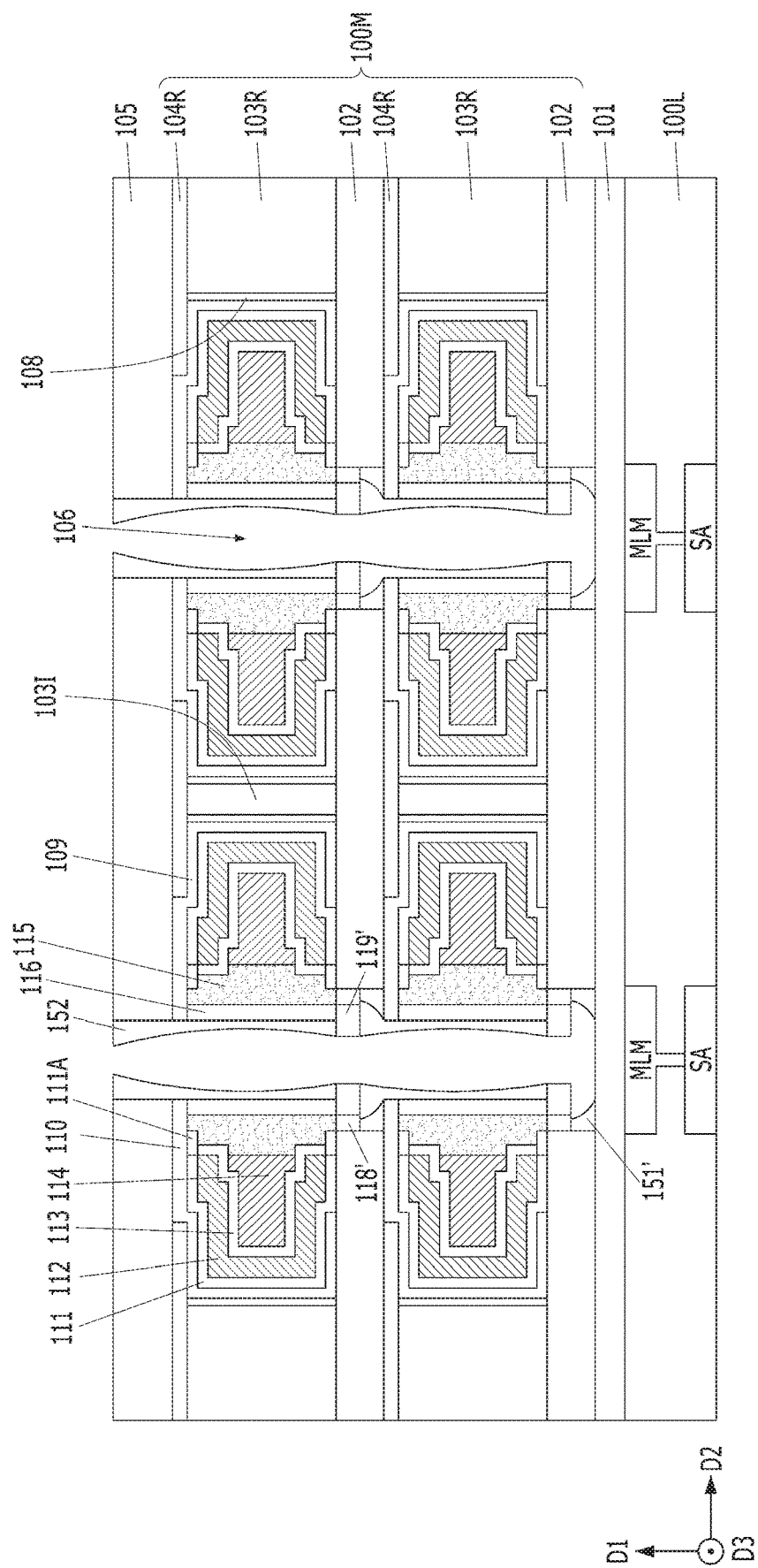

As illustrated in FIG. 36, the additional capping layer 152 may be recessed to expose a vertical surface of the second source/drain layer 119'. The recessed capping layer 152 may have a concave surface and may be widest in the second direction D2 next to the second source/drain layer 119' and also at the top of the opening 106.

Figure 37:
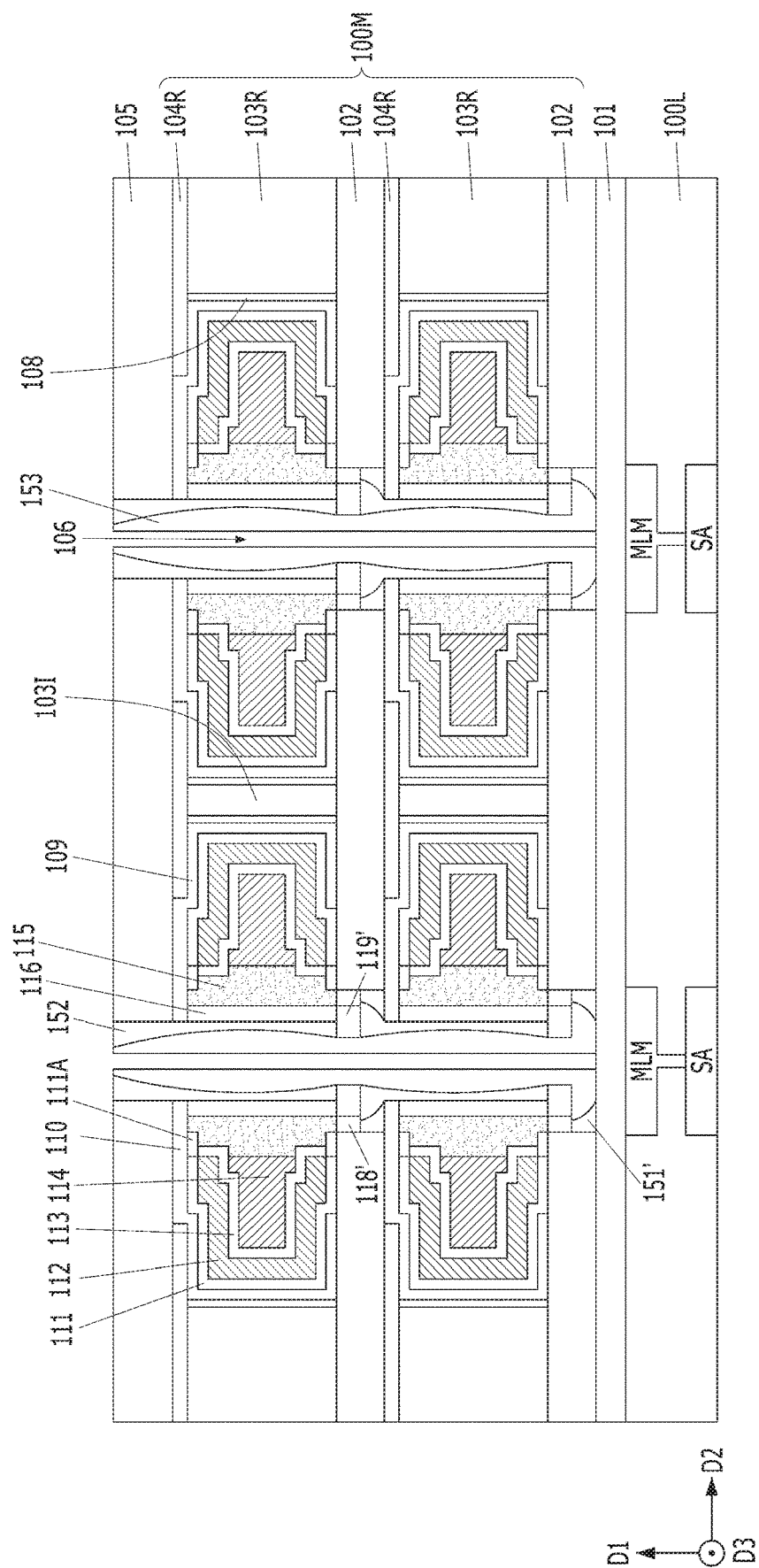

As illustrated in FIG. 37, a sacrificial doped layer 153 may be formed to cover the remaining recessed additional capping layer 152 and the exposed second source/drain layer 119'. The sacrificial doped layer 153 may include an impurity. The sacrificial doped layer 153 may include an N-type impurity. The sacrificial doped layer 153 may be a polysilicon layer doped with phosphorus or arsenic. The sacrificial doped layer 153 may have a flat surface exposed to the opening 106.

Subsequently, a heat treatment process may be performed. The N-type impurity may be diffused from the sacrificial doped layer 153 by the heat treatment process. For example, the N-type impurity may be diffused into the second source/drain layer 119'.

The second source/drain layer 119' may be doped with a high concentration of N-type impurity by deposition and the heat treatment process performed on the sacrificial doped layer 153.

As the second source/drain layer 119' is formed by the deposition and the heat treatment process performed on the sacrificial doped layer 153, a threshold voltage Vt and an on-current of a cell transistor may be easily tuned. In addition, an off-leakage current may be improved.

Since the channel layer 118' is formed by the epitaxial growth, a short-channel margin may be improved. That is, the line width of the channel layer 118' may be increased by the epitaxial growth. In addition, a 3D fin channel may be formed by the channel layer 118'.

Figure 38:
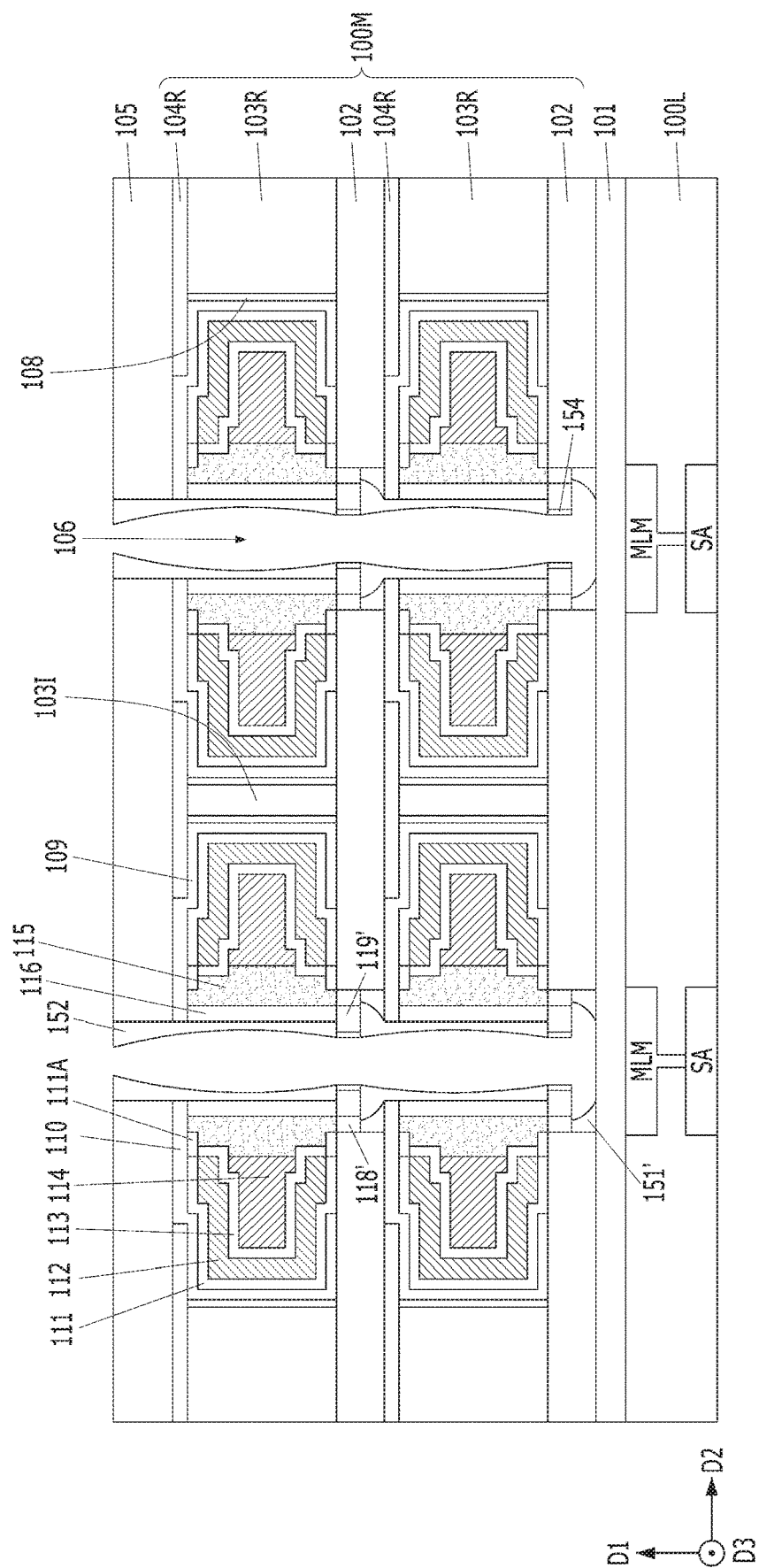

As illustrated in FIG. 38, the sacrificial doped layer 153 may be removed. Since the sacrificial doped layer 153 is removed, the surface of the second source/drain layer 119' may be exposed.

Subsequently, a metal silicide layer 154 may be formed on the surface of the second source/drain layer 119'. The metal silicide layer 154 may include a cobalt silicide layer. The metal silicide layer 154 may be an ohmic contact layer, and may improve contact resistance between the second source/drain layer 119' and a bit line 120'.

Figure 39:
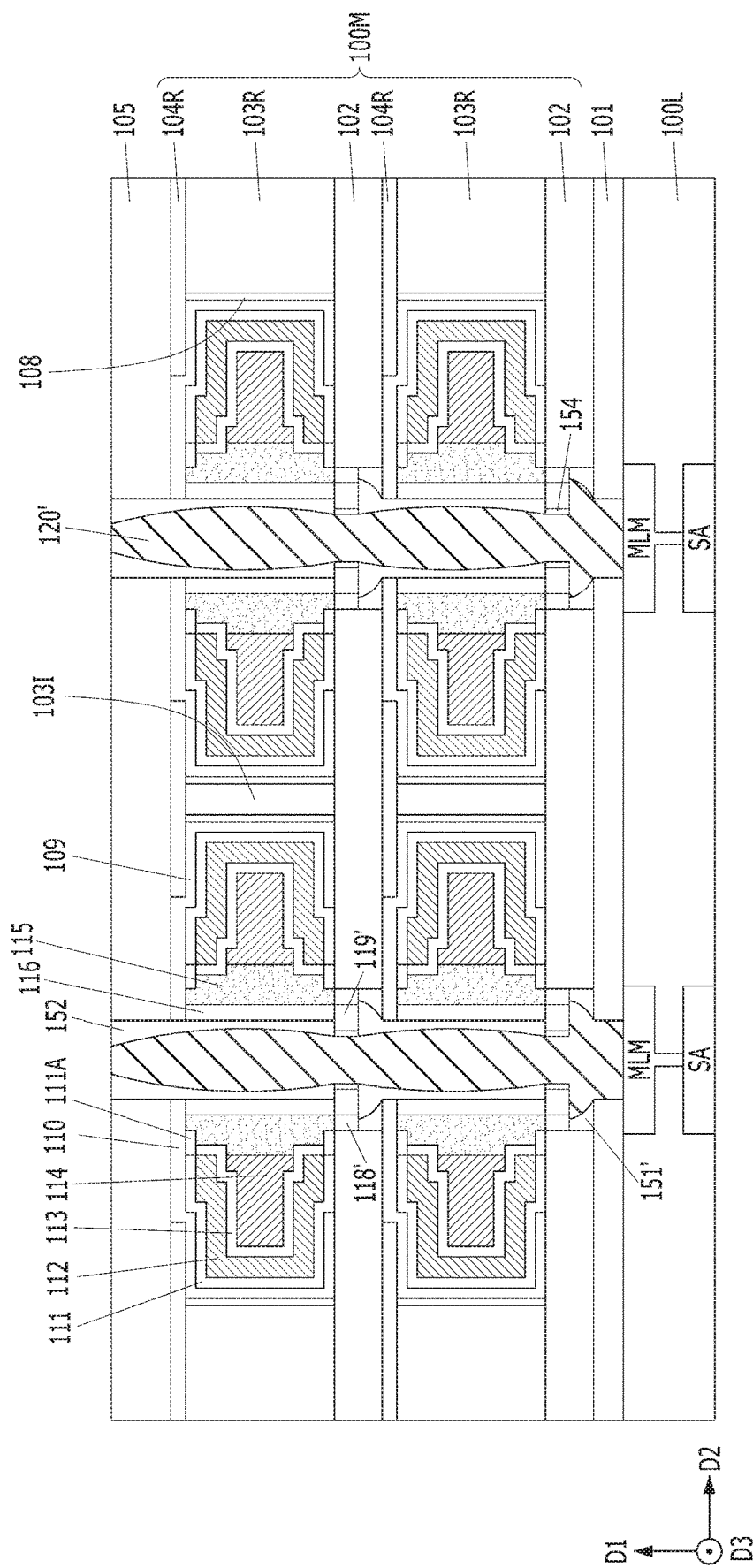

As illustrated in FIG. 39, an etch stop layer 101 may be etched, and then the bit line 120' may be formed to fill the opening 106. The bit line 120' may be extended vertically from a peripheral circuit portion 100L. The bit line 120' may be coupled to the second source/drain layer 119' through the metal silicide layer 154.

Subsequently, a series of processes illustrated in FIGS. 17 to 25 may be performed.

Figure 40:
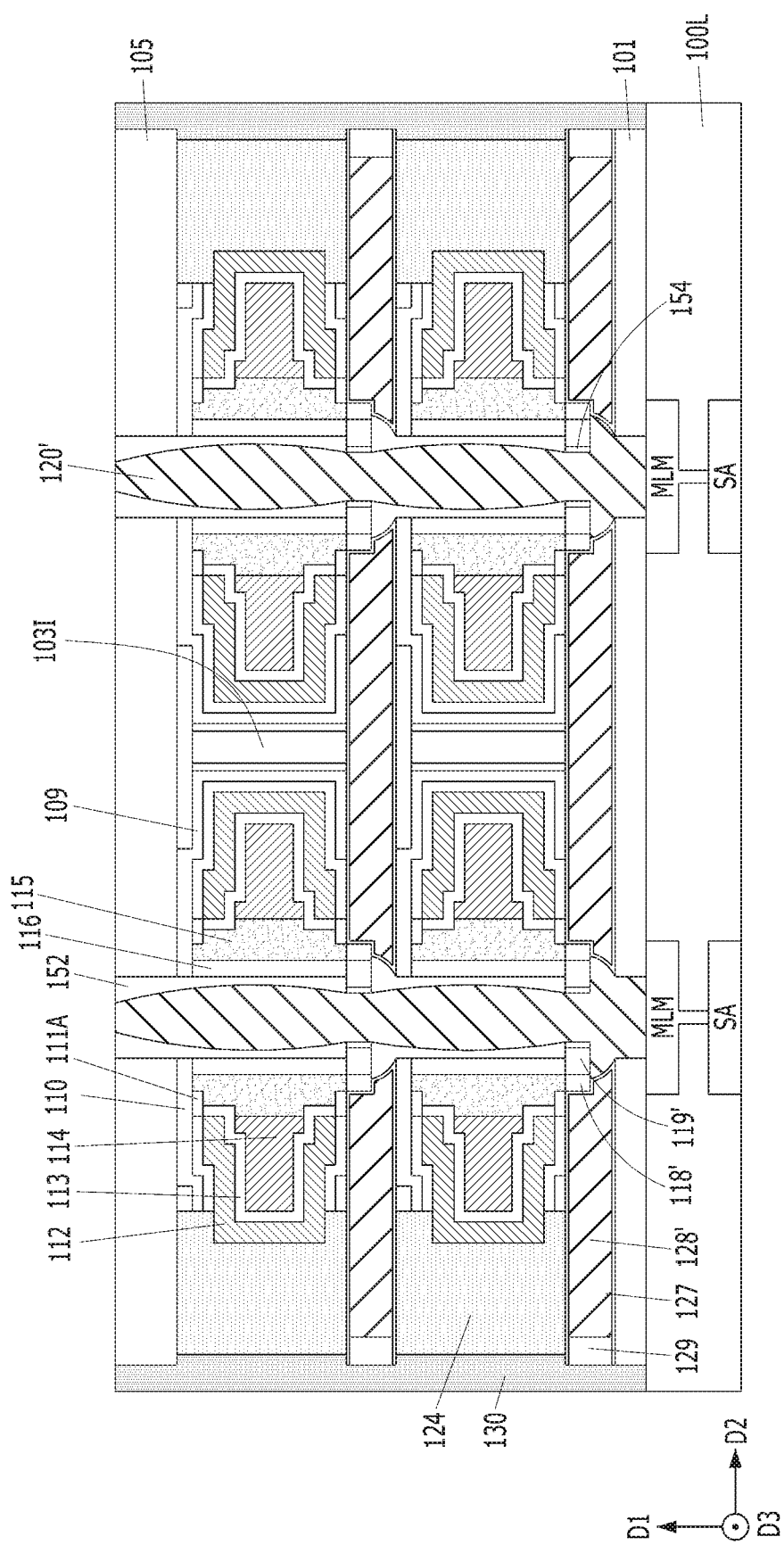

Thus, as illustrated in FIG. 40, a word line 128 may be formed. The word line 128 may have a shape which surrounds the channel layer 118'. The word line 128 may cover the side and bottom surfaces of the channel layer 118'. Accordingly, the channel layer 118' may be referred to as a "fin-type channel layer". Consequently, in FIGS. 31 to 40, a FinFET may be used as a transistor.

Subsequently, a plate line PL including a silicon line 124 and a metal line 130 may be formed.

According to the described embodiments, memory cells are vertically stacked on one another to form a three-dimensional structure, thereby increasing cell density and reducing parasitic capacitance.

According to the described embodiments, since a vertical bit line is formed, bit line resistance may be reduced.

According to the described embodiments, since memory cells are vertically stacked on one another above a peripheral circuit portion, it is possible to implement a highly integrated memory device in a limited area.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A memory device comprising:
   a bit line extending vertically from a substrate, the bit line including a first vertical portion and a second vertical portion over the first vertical portion;
   a vertical active layer including a lower portion surrounding the first vertical portion of the bit line and an upper portion extending vertically from the lower portion to surround the second vertical portion of the bit line;
   a word line configured to surround the lower portion of the vertical active layer and the first vertical portion of the bit line;
   a capacitor spaced apart vertically from the word line, the capacitor being configured to surround the upper portion of the vertical active layer and the second vertical portion of the bit line; and
   a plate line extending vertically from the substrate and coupled to the capacitor,
   wherein the word line, the first vertical portion of the bit line and the lower portion of the vertical active layer are horizontally overlapped at the same level,
   wherein the lower portion of the vertical active layer extends vertically to be positioned between the word line and the first vertical portion of the bit line, and
   wherein the upper portion of the vertical active layer extends vertically to be positioned between the capacitor and the second vertical portion of the bit line.

2. The memory device of claim 1, wherein the vertical active layer comprises:
   a first source/drain layer configured to surround the second vertical portion of the bit line;
   a second source/drain layer coupled to the first vertical portion of the bit line, the second source/drain layer being configured to surround the first vertical portion of the bit line; and
   a vertical channel layer located vertically between the first source/drain layer and the second source/drain layer, the vertical channel layer being configured to surround the first vertical portion of the bit line,
   wherein the first source/drain layer is formed in the upper portion of the vertical active layer, and
   wherein the second source/drain layer and the vertical channel layer are formed in the lower portion of the vertical active layer.

3. The memory device of claim 1, wherein the capacitor comprises:
   a storage node having an annular shape surrounding the upper portion of the vertical active layer and the second vertical portion of the bit line;
   a dielectric layer having an annular shape surrounding the storage node; and
   a plate node having an annular shape surrounding the dielectric layer and the storage node,
   wherein the storage node, the dielectric layer and the plate node are arranged horizontally between the bit line and the plate line.

4. The memory device of claim 3, wherein the plate node of the capacitor comprises:
   a metal plate node having an annular shape surrounding the second vertical portion of the bit line and the dielectric layer; and
   a silicon liner having an annular shape surrounding the second vertical portion of the bit line and the metal plate node.

5. The memory device of claim 1, wherein the capacitor has an annular shape.

6. The memory device of claim 1, wherein the word line has a planar plate shape.

7. The memory device of claim 1, wherein the plate line comprises:
   a silicon line horizontally contacting the capacitor, and vertically overlapping the word line; and
   a metal line coupled to the silicon line, and horizontally overlapping the sidewall of the word line.

8. The memory device of claim 1, further comprising a protective layer between the bit line and the capacitor,
   wherein the protective layer is extended to be located between the capacitor and the word line.

9. The memory device of claim 1, further comprising an isolation layer between the word line and the capacitor.

10. The memory device of claim 1, further comprising a word line capping layer located between the word line and the plate line.

11. The memory device of claim 1, wherein the vertical active layer comprises:
    a first source/drain layer configured to surround the second vertical portion of the bit line;
    a fin-type channel layer epitaxial-grown vertically from the first source/drain layer, the fin-type channel layer being configured to surround the first vertical portion of the bit line; and
    a second source/drain layer epitaxial-grown horizontally from the fin-type channel layer, the second source/drain layer being configured to surround the first vertical portion of the bit line.

12. The memory device of claim 11, further comprising an ohmic contact layer formed between the first vertical portion of the bit line and the second source/drain layer.

13. The memory device of claim 1, wherein the substrate comprises a peripheral circuit portion.

14. The memory device of claim 13, wherein the peripheral circuit portion comprises one or more control circuits for controlling the word line and the bit line.

15. A memory device comprising:
    a substrate;
    a bit line extended vertically from the substrate, and including a plurality of first vertical portions and a plurality of second vertical portions over the first vertical portions;
    a plate line oriented vertically from the substrate; and
    a plurality of memory cells stacked vertically from the surface of the substrate between the bit line and the plate line,
    wherein each of the memory cells comprises:
    a vertical active layer including a lower portion surrounding the first vertical portions of the bit line and an upper portion extending from the lower portion to surround the second vertical portions of the bit line;

a word line configured to surround the lower portion of the vertical active layer and the first vertical portions of the bit line; and a capacitor spaced apart vertically from the word line, the capacitor being configured to surround the upper portion of the vertical active layer and the second vertical portions of the bit line, wherein the word line, the first vertical portions of the bit line and the lower portion of the vertical active layer are horizontally overlapped at the same level, wherein the lower portion of the vertical active layer extends vertically to be positioned between the word line and the first vertical portion of the bit line, and wherein the upper portion of the vertical active layer extends vertically to be positioned between the capacitor and the second vertical portion of the bit line.

16. The memory device of claim 15, wherein the vertical active layer comprises:
a first source/drain layer configured to surround the second vertical portions of the bit line;
a second source/drain layer coupled to the first vertical portions of the bit line, the second source/drain layer being configured to surround the first vertical portions of the bit line; and
a vertical channel layer located vertically between the first source/drain layer and the second source/drain layer, the vertical channel layer being configured to surround the first vertical portions of the bit line,
wherein the first source/drain layer is formed in the upper portion of the vertical active layer, and
wherein the second source/drain layer and the vertical channel layer are formed in the lower portion of the vertical active layer.

17. The memory device of claim 15, wherein the capacitor comprises:
a storage node having an annular shape surrounding the upper portion of the vertical active layer and second vertical portions of the bit line;
a dielectric layer having an annular shape surrounding the storage node; and
a plate node having an annular shape surrounding the dielectric layer and the storage node,
wherein the storage node, the dielectric layer and the plate node are arranged horizontally between the bit line and the plate line.

18. The memory device of claim 17, wherein the plate node of the capacitor comprises:
a metal plate node having an annular shape surrounding the second vertical portions of the bit line and the dielectric layer; and
a silicon liner having an annular shape surrounding the second vertical portions of the bit line and the metal plate node.

19. The memory device of claim 15, wherein the capacitor has an annular shape, and the word line has a planar plate shape.

20. The memory device of claim 15, wherein the plate line comprises:
a silicon line horizontally contacting the capacitor, and vertically overlapping the word line; and
a metal line coupled to the silicon line, and horizontally overlapping the sidewall of the word line.

21. The memory device of claim 15, wherein the vertical active layer comprises:
a first source/drain layer configured to surround the second vertical portions of the bit line;
a fin-type channel layer epitaxial-grown vertically from the first source/drain layer, the fin-type channel layer being configured to surround the first vertical portions of the bit line; and
a second source/drain layer epitaxial-grown horizontally from the fin-type channel layer, the second source/drain layer being configured to surround the first vertical portions of the bit line.

22. The memory device of claim 15, wherein the substrate comprises one or more control circuits for controlling the word line and the bit line.

23. The memory device of claim 1, further comprising:
a cell isolation ring partially surrounding the capacitor.

24. The memory device of claim 1, further comprising:
a multi-level metal wiring coupled to the first vertical portion of the bit line; and
a sense amplifier coupled to the multi-level metal wiring.

* * * * *